(12) United States Patent
Park

(10) Patent No.: US 11,127,920 B2
(45) Date of Patent: Sep. 21, 2021

(54) ELECTROLUMINESCENT DEVICE HAVING WINDOW

(71) Applicant: Samsung Display Co., Ltd., Yongin-si (KR)

(72) Inventor: Myoung Seo Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/203,549

(22) Filed: Mar. 16, 2021

(65) Prior Publication Data

US 2021/0210716 A1    Jul. 8, 2021

Related U.S. Application Data

(63) Continuation of application No. 17/112,211, filed on Dec. 4, 2020, which is a continuation of application No. 16/131,550, filed on Sep. 14, 2018, now abandoned, which is a continuation of application No.
(Continued)

(30) Foreign Application Priority Data

Jan. 8, 2018  (KR) ........................ 10-2018-0002480

(51) Int. Cl.
*G06F 3/044* (2006.01)
*H01L 51/52* (2006.01)
*H01L 27/32* (2006.01)
*G06F 3/041* (2006.01)
(Continued)

(52) U.S. Cl.
CPC ........ *H01L 51/5237* (2013.01); *G06F 3/0412* (2013.01); *G06F 3/0443* (2019.05); *G06F 3/0446* (2019.05); *H01L 27/323* (2013.01);
*H01L 27/3234* (2013.01); *H01L 27/3276* (2013.01); *H01L 51/0097* (2013.01); *G06F 3/044* (2013.01); *G06F 2203/04111* (2013.01); *G09G 3/3233* (2013.01); *G09G 2320/0233* (2013.01); *H01L 2251/5338* (2013.01)

(58) Field of Classification Search
USPC .................... 345/156, 170–178, 690–696
See application file for complete search history.

(56) References Cited

U.S. PATENT DOCUMENTS

| 10,340,476 B2 | 7/2019 | Park |
| 2008/0117497 A1 | 5/2008 | Shimodaira |
| 2009/0257105 A1 | 10/2009 | Xu et al. |

(Continued)

FOREIGN PATENT DOCUMENTS

| KR | 10-2017-0064598 | 6/2017 |
| KR | 10-2017-0065059 | 6/2017 |

(Continued)

*Primary Examiner* — Tony O Davis
(74) *Attorney, Agent, or Firm* — Kile Park Reed & Houtteman PLLC

(57) ABSTRACT

In non-limiting example embodiments, an electroluminescent device may include a lower structure including an emission area, and an encapsulation structure located on the lower structure. The lower structure may include a window. The window may be a light transmitting region or a notch. The light transmitting region may be spaced apart from the emission area and completely or partially surrounded by the emission area in a plan view. The notch may be formed at one side of the lower structure and recessed inward in a plan view such that one side of the emission area substantially conforms to the notch.

13 Claims, 54 Drawing Sheets

Related U.S. Application Data

15/976,210, filed on May 10, 2018, now Pat. No. 10,978,666.

(51) Int. Cl.
 *H01L 51/00* (2006.01)
 *G09G 3/3233* (2016.01)

(56) References Cited

U.S. PATENT DOCUMENTS

| | | |
|---|---|---|
| 2013/0313672 A1 | 11/2013 | Min |
| 2014/0021574 A1 | 1/2014 | Egawa |
| 2014/0145155 A1 | 5/2014 | Park |
| 2016/0126491 A1 | 5/2016 | Kostelnik et al. |
| 2016/0126494 A1 | 5/2016 | Jung et al. |
| 2016/0170524 A1 | 6/2016 | Kim et al. |
| 2016/0221293 A1 | 8/2016 | Park |
| 2016/0254479 A1 | 9/2016 | Jeong et al. |
| 2016/0337570 A1 | 11/2016 | Tan et al. |
| 2017/0047544 A1 | 2/2017 | Kang et al. |
| 2017/0077456 A1 | 3/2017 | Chung et al. |
| 2017/0148856 A1 | 5/2017 | Choi et al. |
| 2017/0154566 A1 | 6/2017 | Ryoo et al. |
| 2017/0162111 A1 | 6/2017 | Kang et al. |
| 2017/0162637 A1 | 6/2017 | Choi et al. |
| 2017/0187934 A1 | 6/2017 | Kwak et al. |
| 2017/0199400 A1 | 7/2017 | Mok et al. |
| 2017/0237037 A1 | 8/2017 | Choi et al. |
| 2017/0237038 A1 | 8/2017 | Kim et al. |
| 2017/0287992 A1 | 10/2017 | Kwak et al. |
| 2017/0289324 A1 | 10/2017 | Yeo et al. |
| 2017/0294502 A1 | 10/2017 | Ka et al. |
| 2019/0214595 A1 | 7/2019 | Park |

FOREIGN PATENT DOCUMENTS

| | | |
|---|---|---|
| KR | 10-2017-0095444 | 8/2017 |
| KR | 10-2017-0111827 | 10/2017 |
| KR | 10-2017-0117291 | 10/2017 |

ELECTROLUMINESCENT DEVICE HAVING WINDOW

CROSS-REFERENCE TO RELATED APPLICATIONS

This is a continuation application of U.S. patent application Ser. No. 17/112,211, filed on Dec. 4, 2020 (now pending), the disclosure of which is incorporated herein by reference in its entirety. U.S. patent application Ser. No. 17/112,211 is a continuation application of U.S. patent application Ser. No. 16/131,550, filed Sep. 14, 2018 (now abandoned), the disclosure of which is incorporated herein by reference in its entirety. U.S. patent application Ser. No. 16/131,550 is a continuation application of U.S. patent application Ser. No. 15/976,210, filed May 10, 2018 (now pending), the disclosure of which is incorporated herein by reference in its entirety. U.S. patent application Ser. No. 15/976,210 claims priority benefit of Korean Patent Application No. 10-2018-0002480, filed on Jan. 8, 2018, in the Korean Intellectual Property Office, the disclosure of which is incorporated herein by reference in its entirety for all purposes.

BACKGROUND

1. Field

Non-limiting example embodiments relate to an electroluminescent device having a window.

2. Description of the Related Art

In recent years, users of portable electronic devices have been increasingly carrying only one electronic device with a built-in camera function, rather than separately carrying a camera.

The above information disclosed in this Background section is only for enhancement of understanding of the background of the non-limiting example embodiment and, therefore, it may contain information that does not form the prior art that is already known in this country to a person of ordinary skill in the art.

SUMMARY

Non-limiting example embodiments are directed to an electroluminescent device that may include a lower structure including an emission area, and an encapsulation structure that is located on the lower structure. The lower structure may include a window. The window a light transmitting region or a notch. The light transmitting region may be spaced apart from the emission area and completely or partially surrounded by the emission area in a plan view. The notch may be formed at one side of the lower structure and recessed inward in a plan view such that one side of the emission area substantially conforms to the notch.

In some non-limiting example embodiments, the lower structure may include an outer non-emission area that completely surrounds the emission area in a plan view and an inner non-emission area that is completely surrounded by the emission area in a plan view. The window may be a hole that is completely surrounded by the emission area in a plan view and formed in the inner non-emission area. The outer non-emission area may include an opened outer inorganic surface portion, and an outer inorganic surface portion. The outer inorganic surface portion may be connected to the opened outer inorganic surface portion, include at least a part that is located between the opened outer inorganic surface portion and the emission area, and completely surround the emission area in a plan view. The inner non-emission area may include an inner inorganic surface portion that completely surrounds the hole in a plan view between the emission area and the hole. The encapsulation structure may include an inorganic lower surface that makes a contact with an entire of the outer inorganic surface portion and an entire of the inner inorganic surface portion while not making a contact with the opened outer inorganic surface portion. The lower structure may include a first wire that extends in a direction from the emission area toward a first side of the hole and a second wire that extends in a direction away from a second side of the hole that faces the first side of the hole toward the emission area. The hole may be located between the first wire and the second wire. The first and second wires may be located on substantially the same layer, and the first wire and the second wire may have substantially the same signal state. In some non-limiting example embodiments, in the inner non-emission area, a side face of the encapsulation structure may be located on a plane on which a side face of the lower structure is disposed. And, in the outer non-emission area, a side face of the encapsulation structure may be inward spaced apart from a side face of the lower structure.

In some non-limiting example embodiments, the lower structure may include a connection member that bypasses the hole in a plan view to be electrically connected between the first wire and the second wire, and at least a part of the connection member is located in the inner non-emission area. In some non-limiting example embodiments, a surface of at least a portion of the connection member may be included in the inner inorganic surface portion or may be located under the inner inorganic surface portion.

In some non-limiting example embodiments, the window may be the notch. The lower structure may include a first wire that extends in a direction from the emission area toward a first side of the notch and a second wire that extends in a direction away from a second side of the notch that faces the first side of the notch toward the emission area. The notch may be located between the first wire and the second wire. The first and second wires may be located on substantially the same layer. The first and second wires may overlap the emission area, and the first and second wires may have substantially the same driving current state.

In some non-limiting example embodiments, the lower structure may include a connection member bypassing the notch in a plan view to be electrically connected between the first wire and the second wire. The connection member may include a third wire that is located on a layer that is substantially different from a layer on which the first and second wires are disposed, and a fourth wire that is located on a layer on which the first and second wires are disposed, and the third and fourth wires overlap the emission area. In some non-limiting example embodiments, the third wire or the fourth wire may be employed as an electrode of a capacitor included in a pixel circuit of the lower structure.

In some non-limiting example embodiments, the window may be the notch. The lower structure may include an outer non-emission area that completely surrounds the emission area in a plan view. The lower structure may include a first wire that extends in a direction from the emission area toward a first side of the notch and a second wire that extends in a direction away from a second side of the notch that faces the first side of the notch toward the emission area. The notch may be located between the first wire and the second wire. The first and second wires may be located on substantially the same layer. The outer non-emission area may include an opened outer inorganic surface portion, and an outer inorganic surface portion. The outer inorganic surface portion may be connected to the opened outer inorganic surface portion, have at least a part that is located between the opened outer inorganic surface portion and the emission area, and completely surround the emission area in a plan view. The encapsulation structure may include an inorganic lower surface that makes a contact with an entire of the outer inorganic surface portion while not making a contact with the opened outer inorganic surface portion. In some non-limiting example embodiments, a width of the outer non-emission area at the side of the lower structure where the notch is provided may be substantially smaller than a width of the outer non-emission area at the other side of the lower structure opposite the side of the lower structure where the notch is provided.

In some non-limiting example embodiments, the lower structure may include a connection member that bypasses the notch in a plan view to be electrically connected between the first wire and the second wire, and at least a part of the connection member may be located in the outer non-emission area. In some non-limiting example embodiments, a surface of at least a portion of the connection member may be included in the outer inorganic surface portion or may be located under at least one of the opened outer inorganic surface portion and the outer inorganic surface portion.

In some non-limiting example embodiments, the encapsulation structure may be a flexible multilayer.

In some non-limiting example embodiments, the window may be the light transmitting region that is completely surrounded by the emission area in a plan view, the lower structure may include an electroluminescent unit having a first electrode, a second electrode, and an intermediate layer located between the first electrode and the second electrode, the lower structure may include a first wire that extends in a direction from the emission area toward a first side of the light transmitting region and a second wire that extends in a direction away from a second side of the light transmitting region that faces the first side of the light transmitting region toward the emission area, the light transmitting region may be located between the first wire and the second wire, the first and second wires may be located on substantially the same layer, the first and second wires may overlap the emission area, the first wire and the second wire may supply a driving current to the first electrode or the second electrode, and the first and second wires may have substantially the same driving current state.

In some non-limiting example embodiments, the lower structure may include a connection member that bypasses the light transmitting region in a plan view to be electrically connected between the first wire and the second wire. The connection member may include a third wire that is located on a layer that is substantially different from a layer on which the first and second wires are disposed, and a fourth wire that is located on a layer on which the first and second wires are disposed. The third and fourth wires may overlap the emission area. In some non-limiting example embodiments, the third wire or the fourth wire may be employed as an electrode of a capacitor included in a pixel circuit of the lower structure.

In some non-limiting example embodiments, the electroluminescent device may further comprise a touch panel that is located on the encapsulation structure. The touch panel may include a first sensing electrode that is adjacent to the window and a second sensing electrode that is located substantially farther from the window than the first sensing electrode. An area of the first sensing electrode may be substantially smaller than an area of the second sensing electrode. In some non-limiting example embodiments, the lower structure may have an inorganic surface portion. The encapsulation structure may have an inorganic lower surface making a contact with an entire of the inorganic surface portion. The first sensing electrode may not overlap an area where the inorganic surface portion of the lower structure makes a contact with the inorganic lower surface of the encapsulation structure.

In some non-limiting example embodiments, the electroluminescent device may further comprise a touch panel that is located on the encapsulation structure. The touch panel may include a first dummy electrode that is adjacent to the window and a second dummy electrode that is located substantially farther from the window than the second dummy electrode. An area of the first dummy electrode may be substantially smaller than an area of the second dummy electrode. In some non-limiting example embodiments, the lower structure may have an inorganic surface portion. The encapsulation structure may have an inorganic lower surface making a contact with an entire of the inorganic surface portion. The first dummy electrode may not overlap an area where the inorganic surface portion of the lower structure makes a contact with the inorganic lower surface of the encapsulation structure.

In some non-limiting example embodiments, the electroluminescent device may further comprise a touch panel that is located on the encapsulation structure and may include a first touch electrode. The first touch electrode may include a first portion that extends in a direction from the emission area toward a first side of the window, a second portion that extends in a direction away from a second side of the window that faces the first side of the window toward the emission area, and a first connection member that bypasses the window in a plan view to be connected between the first and the second portions of the first touch electrode. The window may be located between the first and the second portions of the first touch electrode.

In some non-limiting example embodiments, the lower structure may have a non-emission area, and the first connection member may overlap the non-emission area. As one example, the window may be the notch, the lower structure may have an outer non-emission area completely surrounding the emission area in a plan view, and the first connection member may overlap the outer non-emission area. As another example, the window may be the light transmitting region, the lower structure may have a non-emission area having at least a portion located between the light transmitting region and the emission area, and the first connection member may overlap the non-emission area.

In some non-limiting example embodiments, the window may be the light transmitting region and the touch panel may further include a second touch electrode, the second touch electrode may include a first portion that extends in a direction from the emission area toward a third side of the window, a second portion that extends in a direction away from a fourth side of the window that faces the third side of the window toward the emission area, and a second connection member that bypasses the window in a plan view to be connected between the first and second portions of the second touch electrode. The window may be located between the first and second portions of the second touch electrode. The first and second touch electrodes may extend in substantially different directions. The first and second connection members may not overlap each other. In some non-limiting example embodiments, the second connection member may overlap the non-emission area of the lower structure, and the non-emission area of the lower structure may overlap the first connection member.

In some non-limiting example embodiments, the lower structure may include an outer bus wire that is adjacent to a first side of the emission area, first and second terminal wires that are connected to the outer bus wire and supply a driving current to the outer bus wire from outside the lower structure, and current wires that extend to cross the emission area and are connected to the outer bus wire to receive the driving current from the outer bus wire. A distance from the first side of the emission area to the window may be no less than a distance from a second side of the emission area that is substantially opposite to the first side of the emission area to the window. A distance between the first terminal wire and the window may be substantially the same as a distance between the second terminal wire and the window. The lower structure may include an outer non-emission area that completely surrounds the emission area in a plan view. The outer non-emission area may include an outer inorganic surface portion that completely surrounds the emission area in a plan view. The encapsulation structure may include an inorganic lower surface that makes a contact with an entire of the outer inorganic surface portion.

In some non-limiting example embodiments, the outer non-emission area may include an opened outer inorganic surface portion. The outer inorganic surface portion may be connected to the opened outer inorganic surface portion, and include at least a part that is located between the opened outer inorganic surface portion and the emission area. The inorganic lower surface may not make a contact with the opened outer inorganic surface portion.

In some non-limiting example embodiments, the encapsulation structure may be a flexible multilayer.

In some non-limiting example embodiments, the outer non-emission area may include an opened outer inorganic surface portion, the outer inorganic surface portion may be connected to the opened outer inorganic surface portion, and may include at least a part located between the opened outer inorganic surface portion and the emission area, and the inorganic lower surface of the encapsulation structure may not make a contact with the opened outer inorganic surface portion.

In some non-limiting example embodiments, the window may be the notch, the notch may be recessed inward in a first direction in a plan view to have a sloped side face, the lower structure may include a current wire and an outer bus wire that includes a sloped portion that corresponds to the sloped side face of the notch, the current wire may be connected to the sloped portion of the outer bus wire, may extend in the first direction from the sloped portion of the outer bus wire toward the emission area, and may be integrally formed as one-piece with the outer bus wire, and the current wire may overlap the emission area.

In some non-limiting example embodiments, the sloped portion may include first parts extending in a second direction that is substantially different from the first direction and second parts extending in the first direction, the first parts and the second parts may be alternately connected to each other such that the sloped portion has a substantially stepped shape, the current wire may be connected to the first part of the sloped portion of the outer bus wire, the lower structure may include an outer non-emission area that completely surrounds the emission area in a plan view, the outer non-emission area may include an outer inorganic surface portion that completely surrounds the emission area in a plan view, and the encapsulation structure may include an inorganic lower surface that makes a contact with an entire of the outer inorganic surface portion.

In some non-limiting example embodiments, the sloped portion may include at least two of the first parts having substantially different lengths to be connected to substantially different numbers of the current wires, and/or at least two of the second parts having substantially different lengths.

In some non-limiting example embodiments, the outer non-emission area may include an opened outer inorganic surface portion, the outer inorganic surface portion may be connected to the opened outer inorganic surface portion, and may include at least a part that is located between the opened outer inorganic surface portion and the emission area, and the encapsulation structure may not make a contact with the opened outer inorganic surface portion.

In some non-limiting example embodiments, the encapsulation structure may be a flexible multilayer.

In some non-limiting example embodiments, the sloped portion may include at least two of the first parts having substantially different lengths to be connected to substantially different numbers of the current wires, and/or at least two of the second parts having substantially different lengths.

In some non-limiting example embodiments, the outer non-emission area may include an opened outer inorganic surface portion, the outer inorganic surface portion may be connected to the opened outer inorganic surface portion and may include at least a part that is located between the opened outer inorganic surface portion and the emission area, and the encapsulation structure may not make a contact with the opened outer inorganic surface portion.

In some non-limiting example embodiments, the sloped portion may include at least two of the first parts having substantially different lengths to be connected to substantially different numbers of the current wires, and/or at least two of the second parts having substantially different lengths.

BRIEF DESCRIPTION OF THE DRAWINGS

Features will become apparent to those of skill in the art by describing in detail non-limiting example embodiments with reference to the attached drawings in which.

DETAILED DESCRIPTION

Figure 1:
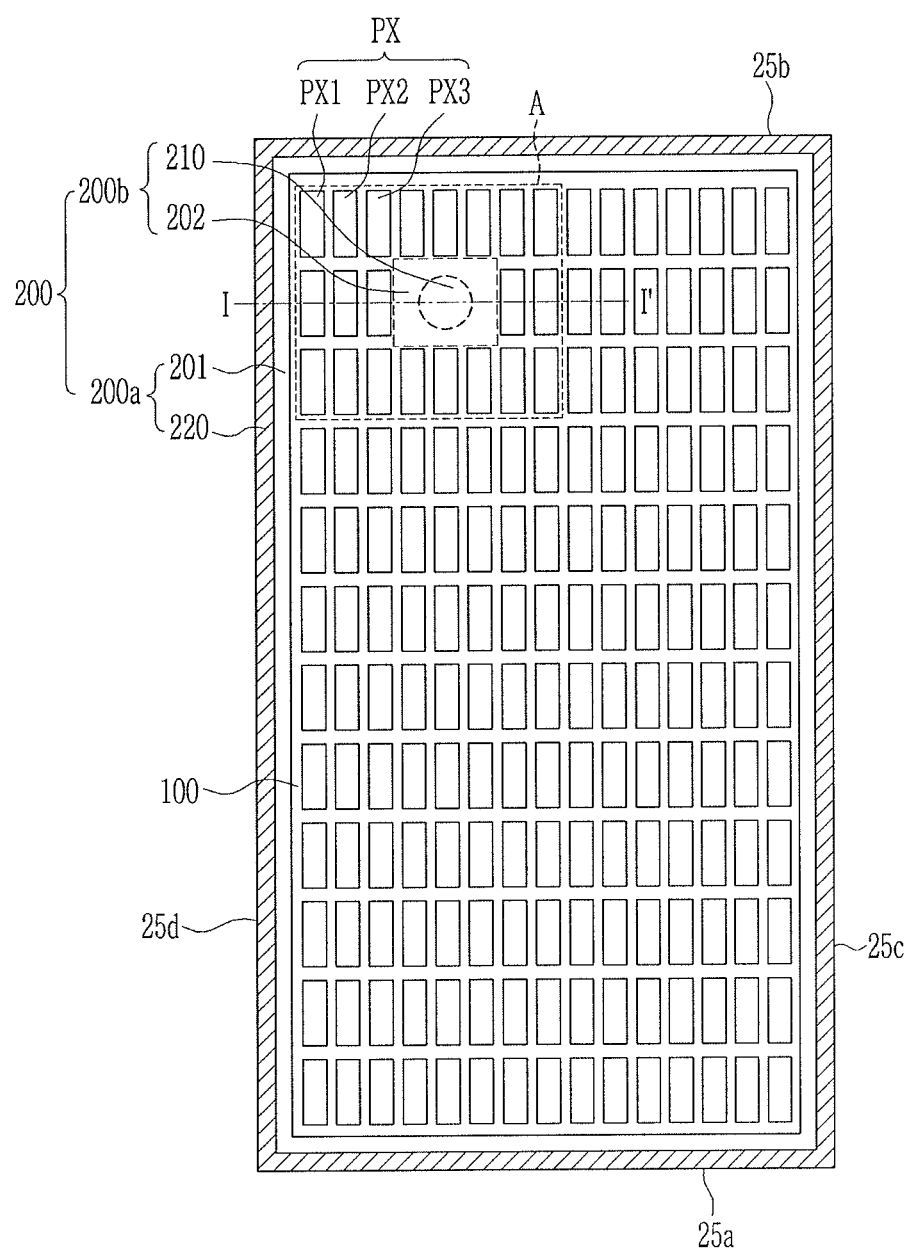
FIG. 1 illustrates a top plan view of an electroluminescent device according to a non-limiting example embodiment.

Non-limiting example embodiments will now be described more fully hereinafter with reference to the accompanying drawings; they may be embodied in substantially different forms and should not be construed as limited to the non-limiting example embodiments set forth herein. Rather, these non-limiting example embodiments are provided so that this disclosure will be thorough and complete, and will fully convey example implementations to those skilled in the art. These non-limiting example embodiments are not exclusive but cooperative such that a technical content disclosed in one non-limiting example embodiment can be applied to another non-limiting example embodiment unless the application is entirely impossible in a technical view or unless there is a clear explanation of impossibility of application. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "in a plan view" means viewing a target portion from the top, and the phrase "on a cross-section" means viewing a cross-section formed by vertically cutting a target portion from the side.

Figure 2:
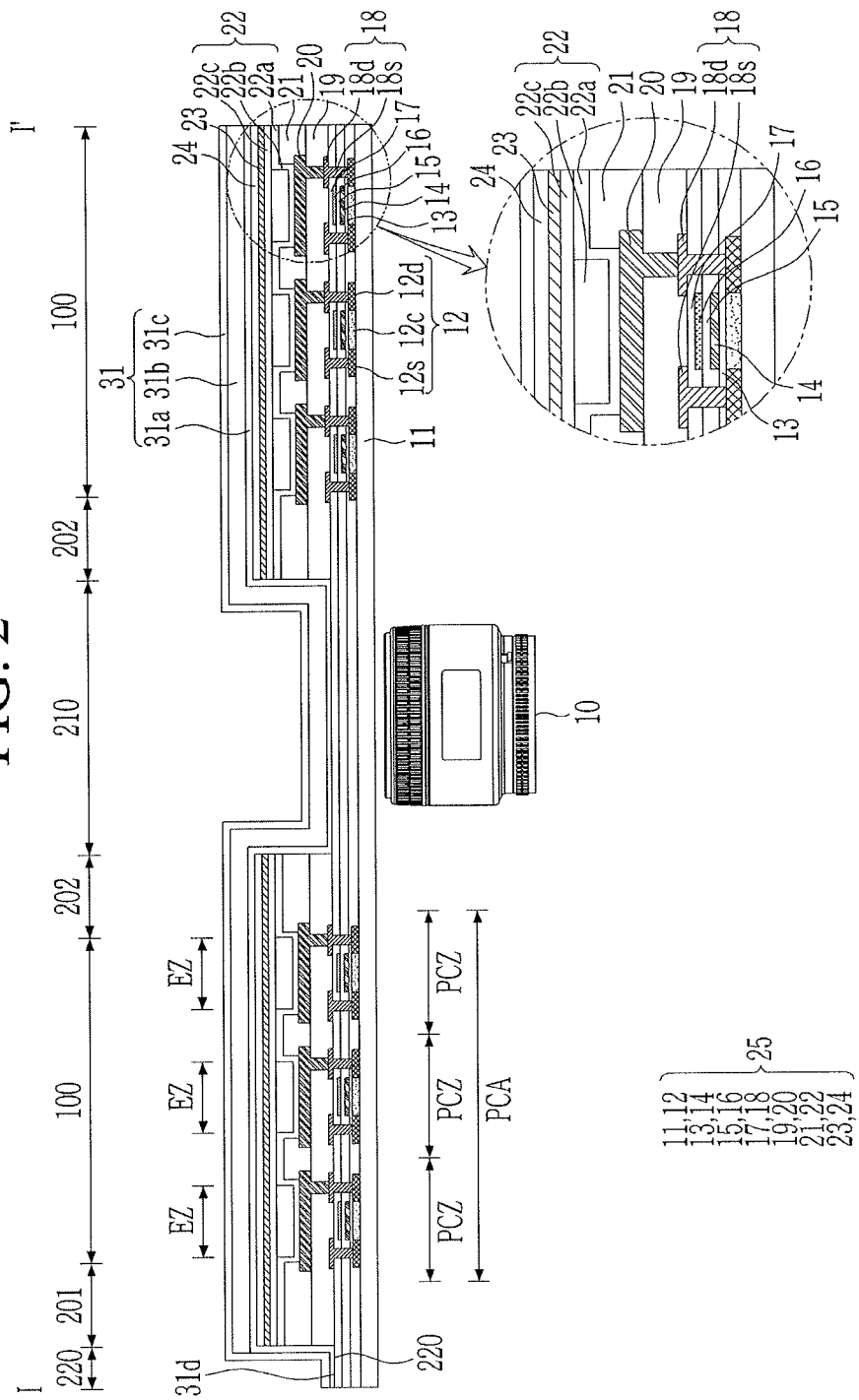
FIG. 2 illustrates a cross-sectional view taken along the line I-I' in FIG. 1.

FIG. 1 is a top plan view of an electroluminescent device according to a non-limiting example embodiment. FIG. 2 is a cross-sectional view taken along the line I-I' in FIG. 1, according to a non-limiting example embodiment.

Referring to FIG. 1 and FIG. 2, an electroluminescent device according to the present non-limiting example embodiment may include a lower structure 25 and an encapsulation structure 31. The lower structure 25 may include a buffer layer 11, an active layer 12, a first gate insulation layer 13, a first gate electrode 14, a second gate insulation layer 15, a second gate electrode 16, an interlayer insulation layer 17, a source/drain electrode 18, a planarization layer 19, a lower electrode 20, a pixel defining layer 21, an intermediate layer 22, an upper electrode 23, and a passivation layer 24. The active layer 12 may include a source region 12s, a drain region 12d, and a channel region 12c. The source/drain electrode 18 may include a source electrode 18s and a drain electrode 18d. The intermediate layer may include a hole transporting layer 22a, an emission layer 22b, and an electron transporting layer 22c. The active layer 12, the first gate insulation layer 13, the first gate electrode 14, the second gate insulation layer 15, the second gate electrode 16, and the source/drain electrode 18 may constitute a transistor. The lower electrode 20, the intermediate layer 22, and the upper electrode 23 may constitute an electroluminescence unit.

The encapsulation structure 31 may be provided as a multilayer including, for example, a first inorganic layer 31a, an organic layer 31b, and a second inorganic layer 31c and having flexibility. In another implementation, the encapsulation structure 31 may be provided as a rigid encapsulation structure having an inorganic sealant and an inorganic glass substrate.

The buffer layer 11, the first gate insulation layer 13, the second gate insulation layer 15, and the interlayer insulation layer 17 may include an inorganic material. The planarization layer 19 and the pixel defining layer 21 may include an insulating organic material. The hole transporting layer 22a, the emission layer 22b, and the electron transporting layer 22c may include a conductive or semi-conductive organic material. According to a non-limiting example embodiment, the emission layer 22b may include an inorganic material such as quantum dots.

The lower structure 25 may include a plurality of pixels PX. Each pixel PX may include an emission zone EZ and a pixel circuit zone PCZ. In the emission zone EZ, the lower electrode 20, the emission layer 22b, and the upper electrode 23 may all be overlapped. A pixel circuit may be located in the pixel circuit zone PCZ for light emission of the emission zone EZ. The pixel circuit may be variously formed depending on a driving method. According to a non-limiting example embodiment, the pixel circuit may include at least two transistors, a capacitor, a scan wire, an emission wire, and a data wire.

According to a non-limiting example embodiment, an outer edge of the emission zone EZ may be located inside an outer edge of the pixel circuit zone PCZ. In another implementation, the emission zone EZ may partially overlap the pixel circuit zone PCZ. According to a non-limiting example embodiment, a shape of the pixel circuit zone PCZ may be a substantial quadrangle. The pixel circuit zones PCZs may form a pixel circuit area PCA. When a shape of the pixel circuit zone PCZ is a substantial quadrangle, a shape of the pixel circuit area PCA may be a substantial matrix.

According to a non-limiting example embodiment, the pixel structure 25 includes a first pixel PX1, a second pixel PX2, and a third pixel PX3. For example, the first, second, and third pixels PX1, PX2, and PX3 may realize red, green, and blue, respectively.

The lower structure 25 may include an emission area 100 and a non-emission area 200. A plurality of emission zones EZ may be arranged in the emission area 100. The non-emission area 200 may include an outer non-emission area 200a and an inner non-emission area 200b. The outer non-emission area 200a may include an outer inorganic surface portion 220 that surrounds the emission area 100 and an outer buffer area 201 that is located between the emission area 100 and the outer inorganic surface portion 220. The inner non-emission area 200b may include a light transmitting region 210 that is surrounded by the emission area 100 and is used as a window, and an inner buffer layer 202 that is located between the emission area 100 and the light transmitting region 210. Here, the inorganic surface portion implies a part of or the entirety of the inorganic surface.

The light transmitting region 210 may have substantially higher light transmittance than the emission area 100 or the inner buffer area 202, and may be an area through which light incident on at least one optical member 10 located under the light transmitting region 210 downwardly passes or an area through which light emitted from the optical member 10 located under the light transmitting region 210 upwardly passes. The optical member 10 may be, or include a camera, a flash, a biometric unit and the like. In the present non-limiting example embodiment, the light transmitting region 210 may have a non-hole structure. The light transmitting region 210 has a size that is substantially greater than that of the pixel circuit zone PCZ, and, therefore, it is substantially different from a light transmitting zone in a pixel for implementation of a transparent display.

The lower electrode 20 and the emission layer 22b may be individually patterned layers, and may not be formed in the light transmitting region 210. Here, the individually patterned layer implies a layer having a set of patterns that are individually formed per pixel. The hole transporting layer 22a, the electron transporting layer 22c, and the upper electrode 23 may be common pattern layers, and have a shape from which a portion corresponding to the light transmitting region 210 is removed. Here, the meaning of having the partially removed shape not only includes a case that the shape is partially removed through a removing process but also includes a case that the shape is partially not formed during a forming process. The passivation layer 24 may include a conductive or semi-conductive organic layer having a relatively high refractive index, and may be a common pattern layer having a shape from which a portion corresponding to the light transmitting region 210 is removed. Here, the common pattern layer implies a layer having patterns that are connected to each other rather than being individually formed for each pixel.

According to a non-limiting example embodiment, the hole transporting layer 22a, the electron transporting layer 22c, and the upper electrode 23 may be formed by, for example, an evaporation deposition process which adopts an open mask that hides a portion corresponding to the light transmitting region 210. According to a non-limiting example embodiment, a selective removal process may be performed such that an open mask that does not hide the portion corresponding to the light transmitting region 210 is adopted and the evaporation deposition process is performed to form the hole transporting layer 22a, the electron transporting layer 22c, and the upper electrode 23, and then laser beams may be irradiated to or an etching solution may be supplied to the portion corresponding to the light transmitting region 210. According to a non-limiting example embodiment, the hole transporting layer 22a and the electron transporting layer 22c may be formed by a printing process during which a solution is not applied to the portion corresponding to the light transmitting region 210.

The encapsulation structure 31 may include an inorganic lower surface 31d. The entire of the outer inorganic surface portion 220 may make a direct contact with the inorganic lower surface 31d of the encapsulation structure 31 to form an inorganic-inorganic contact line that surrounds the emission area 100. By forming the inorganic-inorganic contact line, moisture and oxygen that may be permeated from a side surface of the emission area 100 may be efficiently blocked compared to, for example, inorganic-organic contact line or organic-organic contact line. Moisture and oxygen that may permeate from the bottom side of the emission area 100 may be blocked by an inorganic layer structure. The inorganic layer structure may be an inorganic layer that expands to correspond to the emission area 100 and the non-emission area 200, while no hole is formed. In this case, examples of the inorganic layer may include the buffer layer 11. In another implementation, the inorganic layer structure may be an inorganic layer that expands to correspond to the emission area 100 and the non-emission area 200 while having a hole filled with a substantially different inorganic material. In this case, examples of the inorganic layer structure may include the first gate insulation layer 13, the second gate insulation layer 15, and/or the interlayer insulation layer 17. In an implementation, only an inorganic material is filled between the outer inorganic surface portion 220 and the inorganic layer structure, which may efficiently block moisture or oxygen.

The lower structure 25 may include a first side 25a, a second side 25b located substantially opposite to the first side 25a, a third side 25c located between the first side 25a and the second side 25b, and a fourth side 25d located substantially opposite to the third side 25c. A driving current may be supplied to the first side 25a of the lower structure 25 to drive the electroluminescent unit. The light transmitting region 210 may be located substantially closer to the second side 25b than to the first side 25a of the lower structure. In FIG. 1, the light transmitting region 210 is located substantially closer to the fourth side 25d of the lower structure 25 than to the third side 25c, but, for example, the light transmitting region 210 may be located at substantially the same distance from the third side 25c of the lower structure 25 and from the fourth side 25d.

According to a non-limiting example embodiment, the width of the outer non-emission area 200a may be substantially different at the first side 25a and the second side 25b of the lower structure 25, while the width may be substantially the same at the third side 25c and the fourth side 25d of the lower structure 25. According to a non-limiting example embodiment, the width of the outer non-emission area 200a at the first side 25a of the lower structure 25 may be substantially greater than the width of the outer non-emission area 200a at the second side 25b of the lower structure 25. When the driving current for driving of the electroluminescent unit is provided to the first side 25a of the lower structure 25, a spatial margin of wiring design for incoming and outgoing of the driving current to the first side 25a may be secured. Here, the width implies an average width acquired by dividing an occupied area by a length.

According to a non-limiting example embodiment, the width of the outer buffer area 201 may be substantially different at the first side 25a and the second side 25b of the lower structure 25, while the width may be substantially the same at the third side 25c and the fourth side 25d of the lower structure 25. According to a non-limiting example embodiment, the width of the outer buffer area 201 at the second side 25b of the lower structure 25 may be substantially smaller than the width of the outer buffer area 201 at the third side 25c or at the fourth side 25d of the lower structure 25. When peripheral circuits such as a scan driver, an emission driver, and the like are integrated in the outer buffer 201 at the third side 25c and the fourth side 25d of the lower structure 25, the width of the outer buffer area 201 may be more increased at the third side 25c or at the fourth side 25d of the lower structure 25 than at the second side 25b. According to a non-limiting example embodiment, the width of the outer buffer area 201 at the first side 25a of the lower structure 25 may be substantially greater than the width of the outer buffer area 201 at the second side 25b of the lower structure 25. When the driving current for driving of the electroluminescent unit is provided to the first side 25a of the lower structure 25, a spatial margin of wiring design for incoming and outgoing of the driving current to the first side 25a may be secured.

According to a non-limiting example embodiment, the first side 25 and the second side 25b of the lower structure 25 have substantially different widths, while they may be substantially the same at the third side 25c and the fourth side 25d of the lower structure. According to a non-limiting example embodiment, the width of the outer inorganic surface portion 220 at the first side 25a of the lower structure 25 may be substantially greater than the width of the outer inorganic surface portion 220 at the second side 25b of the lower structure 25. When the driving current for driving of the electroluminescent unit is provided to the first side 25a of the lower structure 25, a spatial margin of wiring design for incoming and outgoing of the driving current to the first side 25a may be secured.

The electroluminescent device according to a non-limiting example embodiment may bendable, foldable, rollable, stretchable, or flexible by an external force applied thereto by a hand of a final user, and the like. Here, the final user implies not a manufacturer but a consumer who purchases a complete electroluminescent device or a complete product including the electroluminescent device and uses it according to its purpose. In another implementation, the electroluminescent device may be a curved electroluminescent device where a curved rigid glass substrate is attached or a flat type of electroluminescent device attached to a flat rigid glass substrate.

Figure 3:
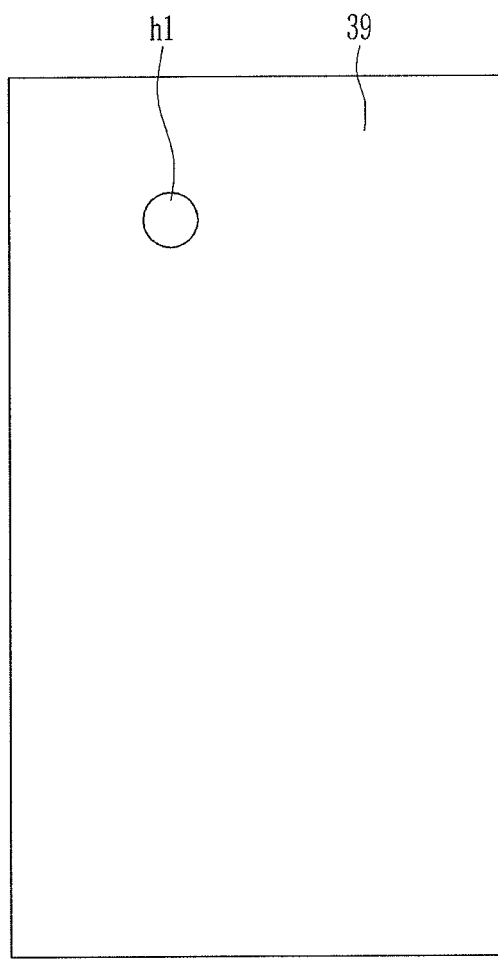
FIG. 3 illustrates a polarization film that may be included in the electroluminescent device shown in FIG. 1 and FIG. 2.

FIG. 3 illustrates a polarization film that may be included in the electroluminescent device shown in FIG. 1 and FIG. 2.

Referring to FIG. 3, the polarization film 39 may be a common pattern layer having a shape from which a portion corresponding to the light transmitting region 210 is removed. The polarization film 39 may be located on the encapsulation structure 31. As shown in FIG. 3, the polarization film 39 may have a hole h1 corresponding to the light transmitting region 210.

Figure 4:
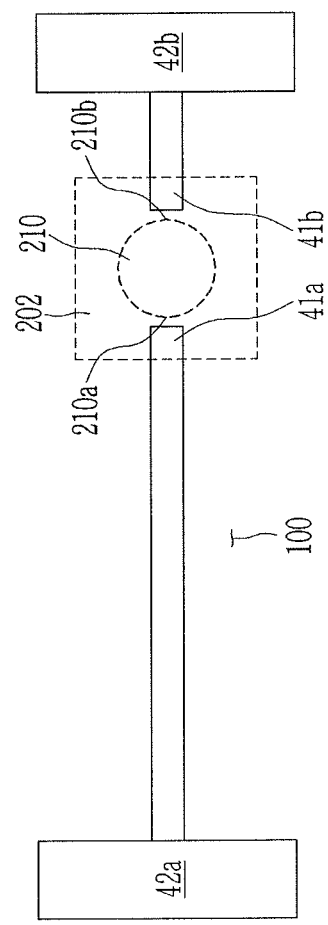
FIG. 4 illustrates signal wiring included in a lower structure shown in FIG. 1 and FIG. 2.

FIG. 4 shows signal wires included in the lower structure 25 of FIG. 1 and FIG. 2, according to a non-limiting example embodiment.

Referring to FIG. 4, the lower structure 25 may include a first wire 41a extending in a direction toward a first side 210a of the light transmitting region 210 from the emission area 100, and a second wire 41b extending away from a second side 210b that faces the first side 210a of the light transmitting region 210 toward the emission area 100. The first and second wires 41a and 41b may include an inorganic material such as a metal. The light transmitting region 210 may be located between the first wire 41a and the second wire 41b. The first and second wires 41a and 41b may be located on substantially the same layer. The first and second wires 41a and 41b may be formed by substantially the same process.

The first wire 41a and the second wire 41b may be electrically separated from each other, and a first driver 42a and a second driver 42b may supply substantially the same signal to the first wire 41a and the second wire 41b with substantially the same timing so that the first and second wires 41a and 41b have substantially the same signal state. The signal may be various signals such as a scan signal, an emission signal, or a data signal. Here, the expression that the first and second wires 41a and 41b have substantially the same signal state does not mean that the first wire 41a and the second wire 41b always have substantially the same signal state. Thus, the first and second wires 41a and 41b may have substantially different signal states through the first and second drivers 42a and 42b because the first and second drivers 42a and 42b are connected to the first and second wires 41a and 41b, respectively.

According to a non-limiting example embodiment, the first and second drivers 42a and 42b may be first and second data drivers, and the first and second wires 41a and 41b may be first and second data wires that apply a data signal to a source area of a transistor included in each pixel circuit. In this case, the first data driver may be located on a first side of the lower structure 25 and the second data driver may be located on a second side that is substantially different from the first side of the lower structure 25. Here, the first side and the second side may be located substantially opposite to each other. The data signal may be an analog signal. In addition, the present non-limiting example embodiment may be applied to a driving current supply structure.

Figure 5:
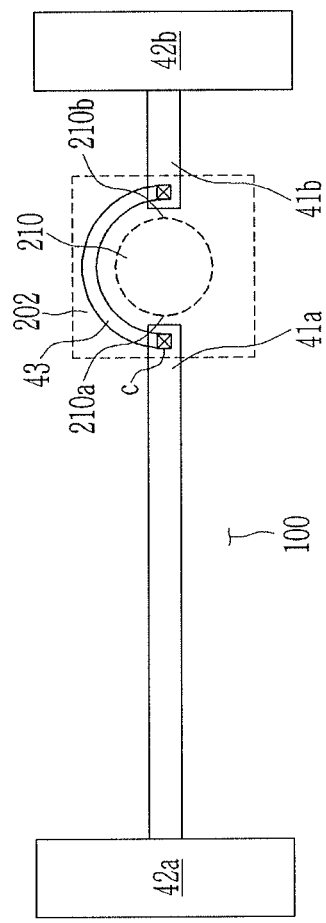
FIG. 5 illustrates signal wiring included in a lower structure shown in FIG. 1 and FIG. 2.

FIG. 5 shows signal wires included in the lower structure of FIG. 1 and FIG. 2, according to a non-limiting example embodiment.

Referring to FIG. 5, the lower structure 25 includes a connection member 43 that bypasses the light transmitting region 210 to be electrically connected between the first wire 41a and the second wire 41b. The connection member 43 may include an inorganic material such as a metal. The connection member 43 may be located on a layer that is substantially different from a layer on which the first and second wires 41a and 41b are located, and may be connected to the first wire 41a and the second wire 41b through a contact c. In another implementation, the first wire 41a, the second wire 41b, and the connection member 43 may be integrally formed as one-piece. For example, the first wire 41a, the second wire 41b, and the connection member 43 may be formed by substantially the same process. The connection member 43 may overlap only the inner buffer area 202. When the connection member 43 overlaps only the inner buffer area 202, the degrees of freedom of signal wiring design and/or the degrees of freedom of driving current supply structure design in the emission area 100 may be enhanced.

In an implementation, the first wire 41a and the second wire 41b may be connected to each other by the connection member 43, one of the first and second drivers 42a and 42b may be omitted, and the first and second wires 41a and 41b may have substantially the same signal state. According to a non-limiting example embodiment, the first and second drivers 42a and 42b may be first and second scan drivers, and first and second wires 41a and 41b may be first and second wires applying a scan signal to a gate electrode of the transistor of each pixel circuit. According to a non-limiting example embodiment, the first driver 42a and the second driver 42b may be a first emission driver and a second emission driver, and the first wire 41a and the second wire 41b may be a first emission wire and a second emission wire that apply an emission signal to the gate electrode of the transistor of each pixel circuit. The scan signal and the emission signal may be digital signals. In addition, the present non-limiting example embodiment may be applied to a driving current supply structure.

Figure 6:
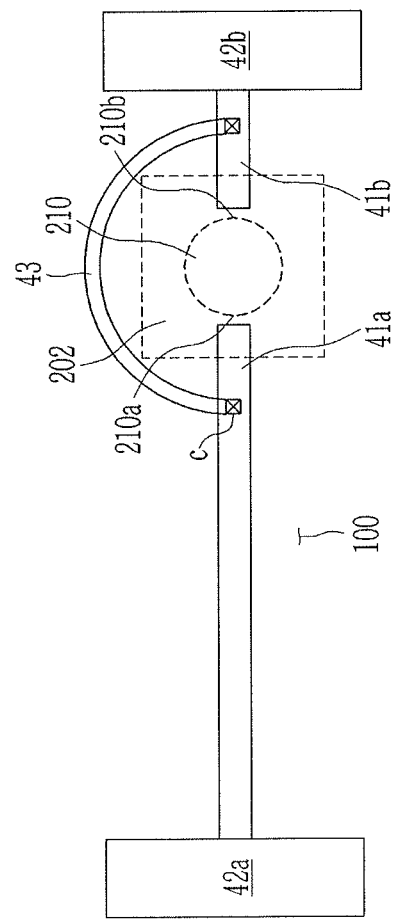
FIG. 6 illustrates signal wiring included in a lower structure shown in FIG. 1 and FIG. 2.

FIG. 6 shows signal wiring included in the lower structure of FIG. 1 and FIG. 2, according to a non-limiting example embodiment.

Referring to FIG. 6, the connection member 43 may be located on a layer that is substantially different from a layer on which the first and second wires 41a and 41b are located, and may be connected to the first wire 41a and the second wire 41b through the contact c. The connection member 43 may overlap only the emission area 100. The connection member 43 may overlap the emission area 100, and the connection member 43 may be located on a layer that is substantially different from a layer on which the first and second wires 41a and 41b are located and, therefore, degrees of freedom in wire design in the emission area 100 may be secured.

According to a non-limiting example embodiment, the connection member 43 may be integrally formed as one-piece with the first and second wires 41a and 41b unless the degrees of freedom in the wire design in the emission area 100 is exceedingly limited.

Figure 7:
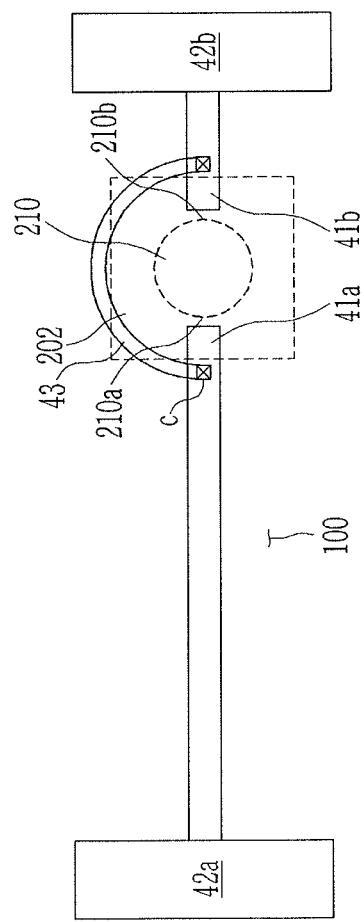
FIG. 7 illustrates signal wiring included in a lower structure shown in FIG. 1 and FIG. 2.

FIG. 7 shows signal wiring included in the lower structure of FIG. 1 and FIG. 2, according to a non-limiting example embodiment.

Referring to FIG. 7, the connection member 43 may be located on a layer that is substantially different from a layer on which the first and second wires 41a and 41b are located, and may be connected to the first and second wires 41a and 41b through the contact c. The connection member 43 may overlap both the emission area 100 and an inner buffer area 202. The connection member 43 may overlap the emission area 100, and the connection member 43 may be located on a layer that is substantially different from a layer on which the first and second wires 41a and 41b are located and, thus, the degrees of freedom in wiring design in the emission area 100 may be secured.

According to a non-limiting example embodiment, the connection member 43 may be integrally formed as one-piece with the first and second wires 41a and 41b without excessively limiting the degrees of freedom in the wire design in the emission area 100.

Figure 8:
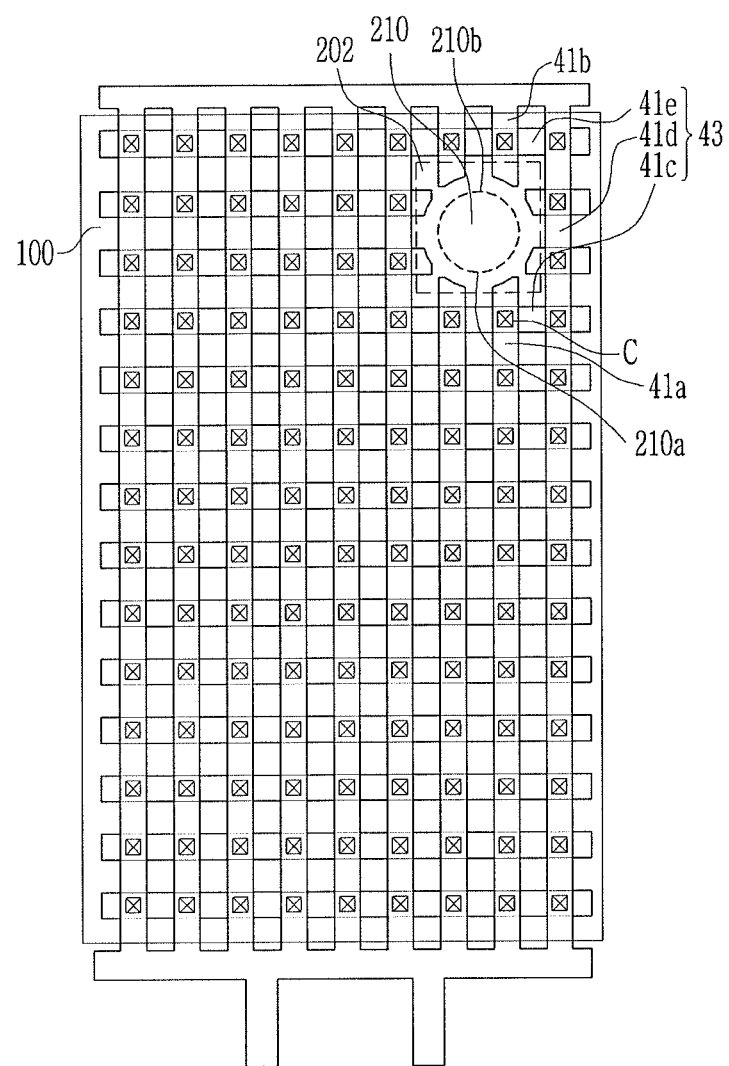
FIG. 8 illustrates a driving current supply structure included in the lower structure shown in FIG. 1 and FIG. 2.

FIG. 8 shows a driving current supply structure included in the lower structure shown in FIG. 1 and FIG. 2 according to a non-limiting example embodiment. For example, the driving current supply structure may supply a driving current to a lower electrode 20.

Referring to FIG. 8, the lower structure 25 may include a first wire 41a extending in a direction toward a first side 210a of a light transmitting region 210 from an emission area 100, and a second wire 41b extending away from a second side 210b that faces the first side 210a of the light transmitting region 210 toward the emission area 100. The light transmitting region 210 may be located between the first wire 41a and the second wire 41b. The first wire 41a and the second wire 41b may be located on substantially the same layer. The lower structure 25 may include a connection member 43 that bypasses or circumvents the light transmitting region 210 to be electrically connected between the first wire 41a and the second wire 41b. The first wire 41a and the second wire 41b may be connected by the connection member 43, and, thus, the first wire 41a and the second wire 41b may have substantially the same driving current state, and a delay of transmission of a driving current due to the light transmitting region 210 at the periphery of the light transmitting region 210 may be reduced.

The connection member 43 may include a third wire 41c that is located on a layer that is substantially different from a layer on which the first and second wires 41a and 41b are located, and is connected to the first wire 41a through a contact c. The connection member 43 may include a fourth wire 41d that is located on a layer that is substantially the same as a layer on which the first and second wires 41a and 41b are located, and is connected to the third wire 41c through the contact c. The connection member 43 may include a fifth wire 41e that is located on substantially the same layer as a layer on which the third wire 41c is located, and is connected to the second and fourth wires 41b and 41d through the contact c.

The first and second wires 41a and 41b may be substantially parallel with the fourth wire 41d. And, the first and second wires 41a and 41b may be substantially perpendicular to the third and fifth wires 41c and 41e. The third and fifth wires 41c and 41e may be used as electrodes included in capacitors of pixel circuits. For example, the third wire 41c may be commonly used as an electrode of a capacitor included in a first pixel circuit and an electrode of a capacitor included in a second pixel circuit that is adjacent to the first pixel circuit. As another example, the fifth wire 41e may be commonly used as an electrode of a capacitor included in a third pixel and an electrode of a capacitor included in a fourth pixel circuit that is adjacent to the third pixel circuit. When the third and fifth wires 41c and 41e are used as electrodes included in the capacitors of the pixel circuits, integration of the pixel circuit may be increased by avoiding forming additional electrodes included in the capacitors of the pixel circuits.

According to a non-limiting example embodiment, an inner bus wire having a ring shape that surrounds the periphery of the light transmitting region 210 may connect the first and second wires 41a and 41b. The inner bus wire may be integrally formed as one-piece with the first and second wires 41a and 41b, and may be connected to another wire that extends in substantially parallel with the fifth wire 41e through a contact.

Figure 9:
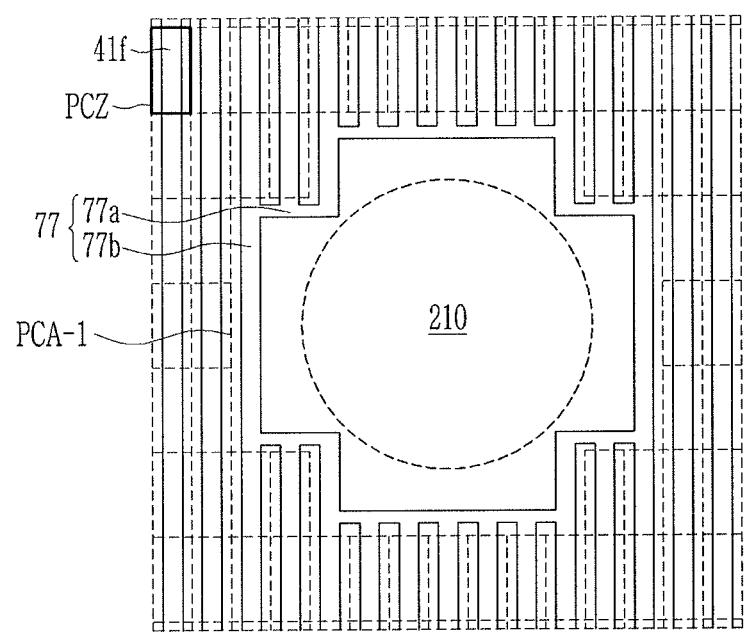
FIG. 9 illustrates an enlarged view of the periphery of a light transmitting region of the driving current supply structure included in the lower structure shown in FIG. 1 and FIG. 2.

FIG. 9 is an enlarged view of the periphery of the light transmitting region 210 of the driving current supply structure included in the lower structure shown in FIG. 1 and FIG. 2, according to a non-limiting example embodiment.

Referring to FIG. 9, the driving current supply structure may supply a driving current to the lower electrode 20. The driving current supply structure may include a plurality of first wires 41f that extend in a first direction toward the second side 25b from the first side 25a of the lower structure 25. The first wires 41f may cross the pixel circuit zone PCZ.

The driving current supply structure may include an inner bus wire 77. The inner bus wire 77 may include first regions 77a extending in a second direction that is substantially perpendicular to the first direction, and second regions 77b that extend in the first direction.

The first regions 77a and the second regions 77b may be alternately connected to each other such that at least one side of the inner bus wire 77 has a substantially stepped shape. The first region 77a may be connected to the first wire 41f. According to a non-limiting example embodiment, the first region 77a and the first wire 41f may be integrally formed as one-piece. The inner bus wire 77 may include at least two first regions 77a having substantially different lengths to be connected to substantially different numbers of first wires 41f. The inner bus wire 77 may include at least two second regions 77b having substantially different lengths.

At least one side of the inner bus wire 77 may have the substantially stepped shape. Thus, the inner bus wire 77 may efficiently become substantially closer to an outer edge PCA-1 of the pixel circuit area having a matrix format formed by a plurality of quadrangular-shaped pixel circuit zones PCZ.

According to a non-limiting example embodiment, when the outer edge of an emission zone is not located inside the outer edge of the pixel circuit zone PCZ, the inner bus wire 77 may partially overlap at least one of the emission zone and the lower electrode 20 while the inner bus wire 77 is located outside the outer edge PCA-1 of the pixel circuit area. Thus, the area of the emission area 100 may be expanded while disposing the inner bus wire 77 as close as possible to the pixel circuit area.

Figure 10:
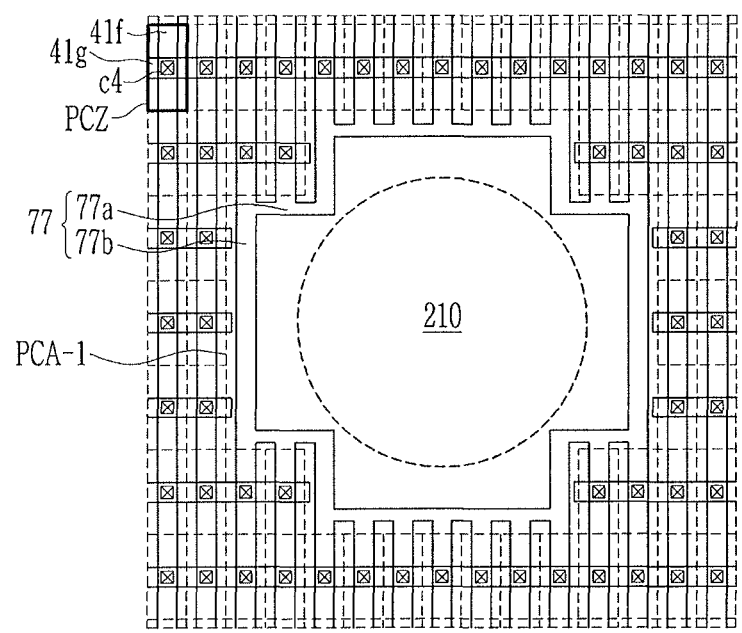
FIG. 10 illustrates the driving current supply structure having an inner bus wire according to a non-limiting example embodiment.

FIG. 10 illustrates the driving current supply structure having an inner bus wire according to a non-limiting example embodiment.

The driving current supply structure according to the present non-limiting example embodiment may be substantially similar to the driving current supply structure of FIG. 9, except that the driving current supply structure of the present non-limiting example embodiment may further include second wires 41g.

Referring to FIG. 10, a second wire 41g may extend in the second direction. The second wire 41g may cross the pixel circuit zone PCZ. The second wire 41g may be located on a layer that is substantially different from a layer on which the first wire 41f is located, and may be connected to the first wire 41f through a contact c4.

The second wire 41g may be used as an electrode included in a capacitor of each pixel circuit. For example, the second wire 41g may be commonly used as an electrode of a capacitor included in a first pixel circuit and an electrode of a capacitor included in a second pixel circuit that is adjacent to the first pixel circuit. When the second wire 41g is used as the electrode included in the capacitor of the pixel circuit, integration of the pixel circuit may be increased by avoiding formation of an additional electrode included in the capacitor of the pixel circuit.

Figure 11:
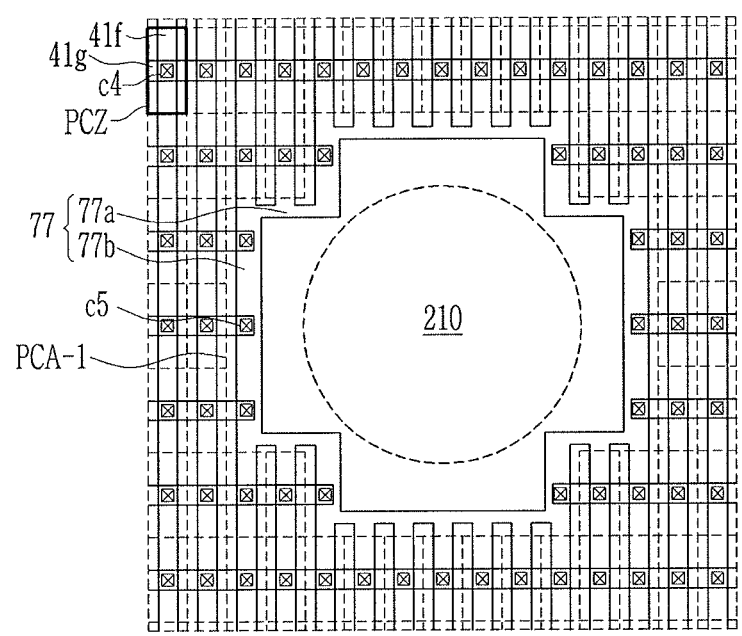
FIG. 11 illustrates the driving current supply structure having the inner bus wire according to a non-limiting example embodiment.

FIG. 11 illustrates the driving current supply structure having the inner bus wire according to a non-limiting example embodiment.

The driving current supply structure according to the present non-limiting example embodiment may be substantially similar to the driving current supply structure of FIG. 10, except that a second wire 41g of the driving current supply structure of the present non-limiting example embodiment may be connected to an inner bus wire 77.

Referring to FIG. 11, the second wire 41g may be connected to the second region 77b of the inner bus wire 77 through a contact c5. When the inner bus wire 77 includes at least two second regions 77b having substantially different lengths, numbers of second wires 41g connected to the second regions 77b may be substantially different. The inner bus wire 77 may be connected not only with the first wires 41f but also with the second wires 41g. Thus, current may be more evenly transmitted throughout the entire driving current supply structure.

Figure 12:
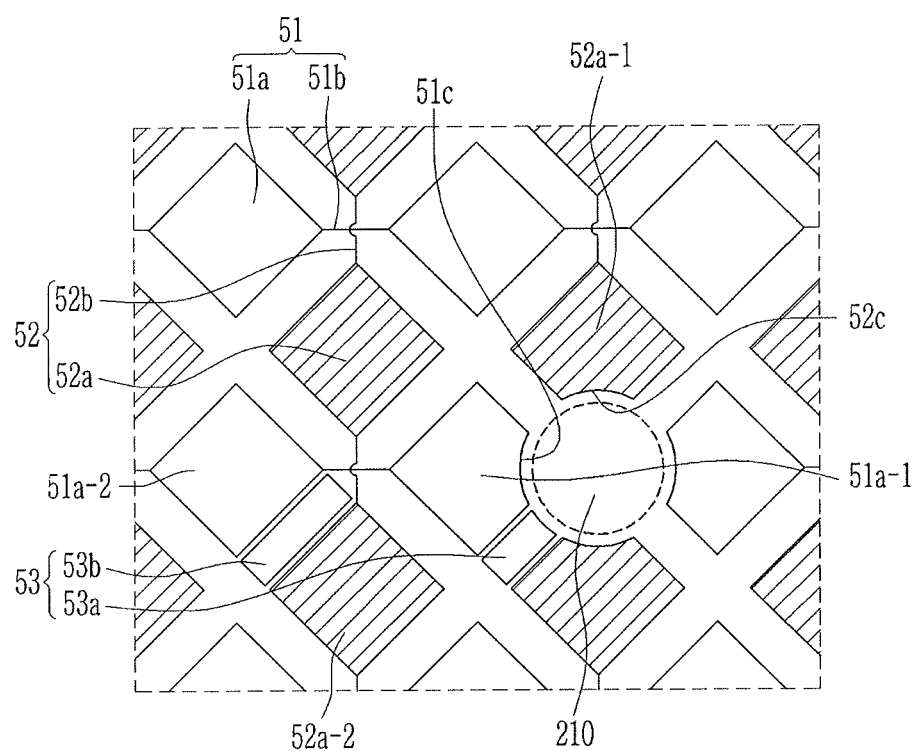
FIG. 12 illustrates first and second touch electrodes included in a touch panel that is formed on the encapsulation structure in the area A of FIG. 1, according to a non-limiting example embodiment.

FIG. 12 shows first and second touch electrodes included in a touch panel that is formed on the encapsulation structure 31 in the area A of FIG. 1, according to a non-limiting example embodiment.

Referring to FIG. 12, a first touch electrode 51 may extend in a first direction, and includes a first sensing electrode 51a and a first bridge electrode 51b. The area of the first sensing electrode 51a may be substantially wider than that of the first bridge electrode 51b. A second touch electrode 52 may extend in a second direction that crosses the first direction, and may include a second sensing electrode 52a and a second bridge electrode 52b. The area of the second sensing electrode 52a may be substantially wider than that of the second bridge electrode 52b. The first bridge electrode 51b and the second bridge electrode 52b may be provided on substantially different layers and cross each other.

The first touch electrode 51 may be a common pattern layer and have a shape from which a portion corresponding to a light transmitting region 210 is removed. The first touch electrode 51 may be divided into two by the light transmitting region 210, and one side of a first sensing electrode 51a-1 may have a notch 51c corresponding to the light transmitting region 210. The area of the first sensing electrode 51a-1, adjacent to the light transmitting region 210, may be substantially smaller than that of a first sensing electrode 51a-2 that is located farther away from the light transmitting region 210 than first sensing electrode 51a-1. Sensing at the periphery of the light transmitting region 210 may be precisely performed by disposing the first sensing electrode 51a-1 having a substantially smaller area substantially closer to the light transmitting region 210. The second touch electrode 52 may be a common pattern layer and may also be divided into two by the light transmitting region 210, and one side of a second sensing electrode 52a-1 may have a notch 52c corresponding to the light transmitting region 210. The area of the second sensing electrode 52a-1, adjacent to the light transmitting region 210, may be substantially smaller than that of a second sensing electrode 52a-2 that is located farther away from the light transmitting region 210 than second sensing electrode 52a-1. Sensing at the periphery of the light transmitting region 210 may be precisely performed by disposing the second sensing electrode 52a-1 having a substantially smaller area substantially closer to the light transmitting region 210.

A dummy electrode 53 may be further provided between the first sensing electrode 51a and the second sensing electrode 52a. The dummy electrode 53 may prevent an image from being relatively brightened between the first sensing electrode 51a and the second sensing electrode 52a so that the image may have substantially even brightness throughout the entire electroluminescent device. The first sensing electrode 51a, the second sensing electrode 52a, and the dummy electrode 53 may have substantially the same or similar light transmittance. The first sensing electrode 51a, the second sensing electrode 52a, and the dummy electrode 53 may be located on substantially the same layer. A dummy electrode 53a may have a shape from which a portion corresponding to the light transmitting region 210 is removed. An area of the dummy electrode 53a, adjacent to the light transmitting region 210, may be substantially smaller than an area of a dummy electrode 53b which is not adjacent to the light transmitting region 210. The dummy electrode 53a having a substantially smaller area may be located substantially closer to the light transmitting region 210 so that brightness uniformity is enhanced at the periphery of the light transmitting region 210.

According to a non-limiting example embodiment, the first sensing electrode 51a-2 and the second sensing electrode 52a-2 may have substantially the same area. In another implementation, the area of the first sensing electrode 51a-2 and the area of the second sensing electrode 52a-2 may be substantially different from each other. For example, when the first direction in which the first touch electrode 51 extends is a short side direction of the electroluminescent device and the second direction in which the second touch electrode 52 extends is a long side direction of the electroluminescent device, the area of the first sensing electrode 51a-2 may be substantially greater than that of the second sensing electrode 52a-2. This may increase of sensing sensitivity with respect to surrounding noise by making the entire area of the first touch electrode 51 and the entire area of the second touch electrode 52 substantially equal to each other.

According to a non-limiting example embodiment, the first sensing electrode 51a, the second sensing electrode 52a, and the dummy electrode 53 may include a transparent conductive material such as an indium tin oxide. The first sensing electrode 51a and the second sensing electrode 52a may have a structure in which a plurality of metal lines is connected to each other in a mesh format.

Figure 13:
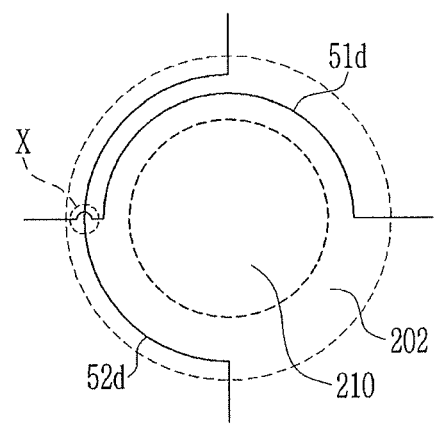
FIG. 13 illustrates a bypass structure of a touch electrode according to a non-limiting example embodiment.

FIG. 13 shows a bypass structure of a touch electrode according to a non-limiting example embodiment.

Referring to FIG. 13, first and second touch electrode 51 and 52 may cross each other at a cross region x, and the cross region x may overlap an inner buffer area 202. The first touch electrode 51 may include a first connection member 51d that bypasses or circumvents the light transmitting region 210, and the second touch electrode 52 may include a second connection member 52d that bypasses the light transmitting region 210. The first connection member 51d and the second connection member 52d may be located on substantially the same layer, while not being overlapped with each other. In another implementation, the first connection member 51d and the second connection member 52d may be located on substantially different layers, while not being overlapped with each other. At least one of at least a part of the first connection member 51d and at least a part of the second connection member 52d may overlap the inner buffer area 202 that surrounds the light transmitting region 210.

Figure 14:
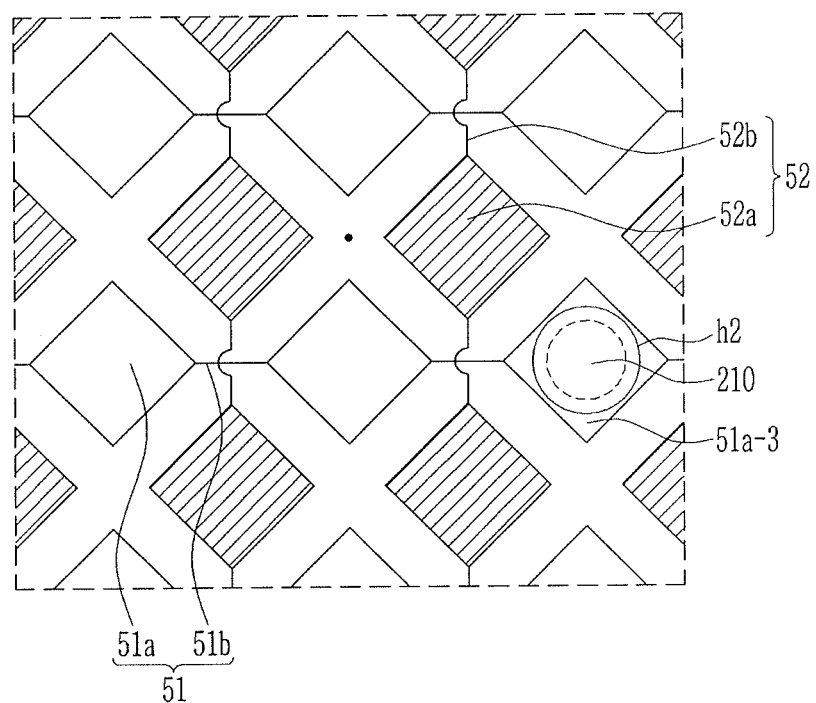
FIG. 14 illustrates first and second touch electrodes included in a touch panel formed on the encapsulation structure in the area A of FIG. 1, according to a non-limiting example embodiment.

FIG. 14 shows first and second touch electrodes included in a touch panel formed on the encapsulation structure in the area A of FIG. 1, according to a non-limiting example embodiment.

Referring to FIG. 14, a first touch electrode 51 is not divided by the light transmitting region 210, but a first sensing electrode 51a-3 includes a hole h2 that corresponds to the light transmitting region 210. An area of the first sensing electrode 51a-3 where the hole h2 is formed may be substantially smaller than an area of the first sensing electrode 51a where the hole h2 is not formed.

Figure 15:
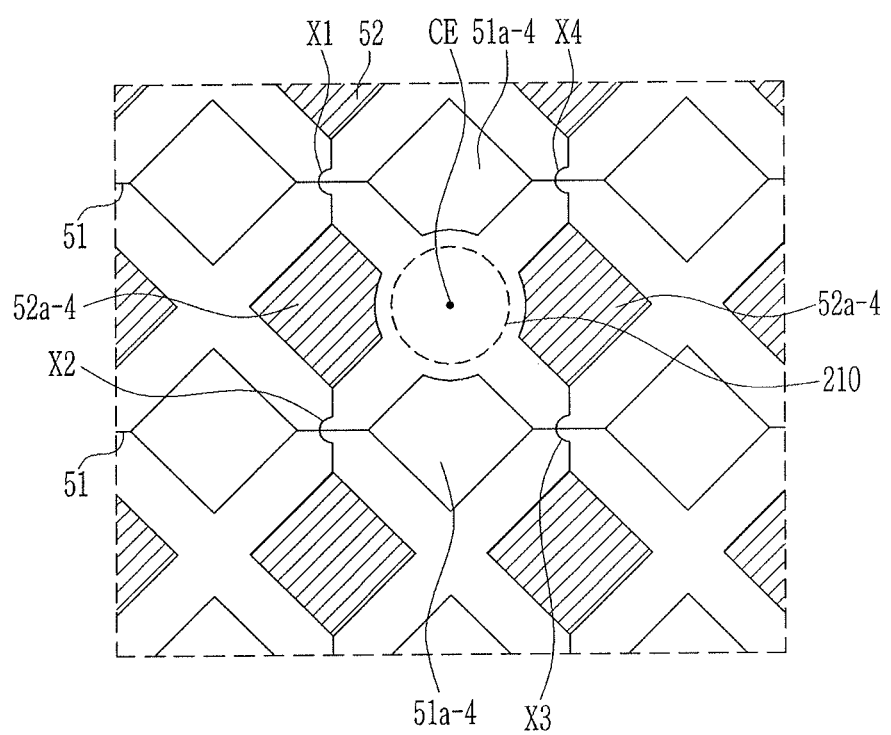
FIG. 15 illustrates first and second touch electrodes included in a touch panel formed on the encapsulation structure in the area A of FIG. 1, according to a non-limiting example embodiment.

FIG. 15 shows first and second touch electrodes included in a touch panel formed on the encapsulation structure in the area A of FIG. 1, according to a non-limiting example embodiment.

Referring to FIG. 15, a center CE of a light transmitting region 210 may be located in the light transmitting region 210 between first to fourth crossing portions X1, X2, X3, and X4 that are adjacent to each other between two adjacent first touch electrodes 51 and two adjacent second touch electrodes 52. First sensing electrodes 51a-4 that are adjacent to a light transmitting region 210 and second sensing electrodes 52a-4 that are adjacent to the light transmitting region 210 may respectively include notches. The first touch electrode 51 and the second touch electrodes 52 may not be divided by the light transmitting region 210.

Figure 16:
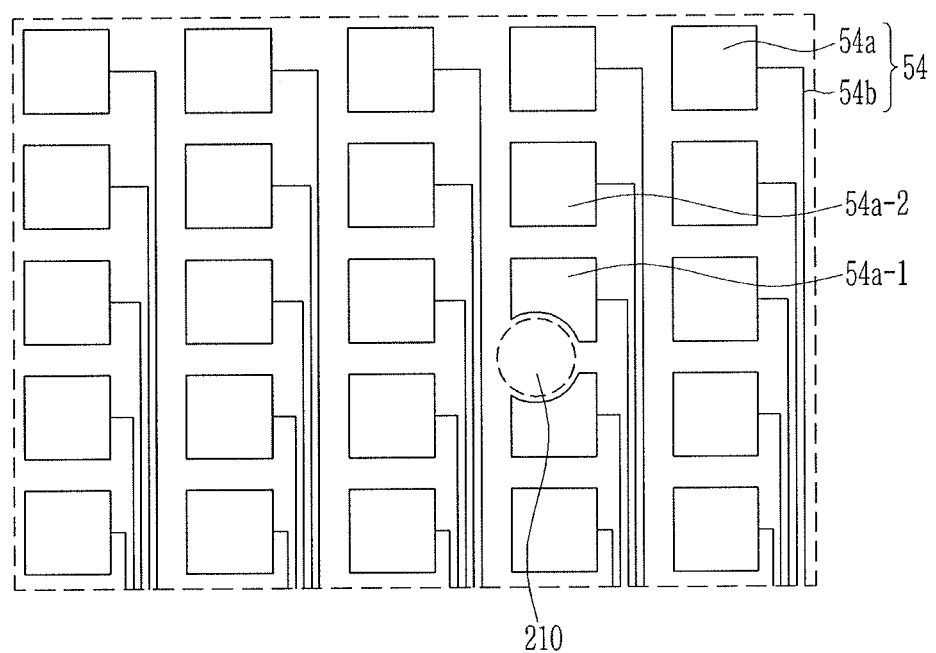
FIG. 16 illustrates a touch electrode included in a touch panel formed on the encapsulation structure in the area A of FIG. 1, according to a non-limiting example embodiment.

FIG. 16 shows a touch electrode included in a touch panel formed on the encapsulation structure in the area A of FIG. 1, according to a non-limiting example embodiment.

Referring to FIG. 16, the touch electrode 54 may include sensing electrodes 54a and touch wires 54b. An area of a sensing electrode 54a-1 that is adjacent to the light transmitting region 210 among the sensing electrodes 54a may be substantially smaller than an area of a sensing electrode 54a-2 that is not located adjacent to the light transmitting region 210.

Figure 17:
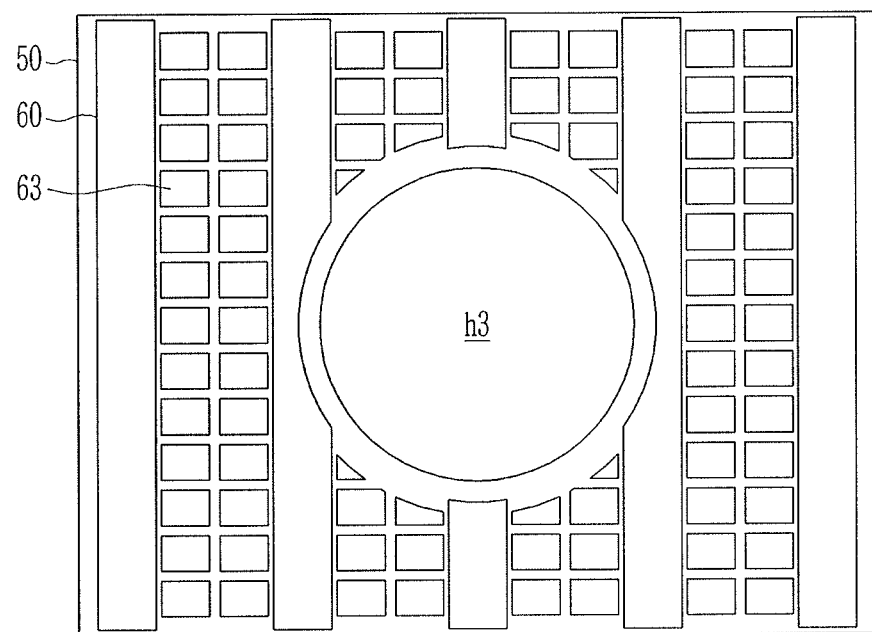
FIG. 17 illustrates an upper touch electrode included in a touch panel formed on the encapsulation structure of FIG. 1, according to a non-limiting example embodiment.

FIG. 17 shows an upper touch electrode included in a touch panel formed on the encapsulation structure of FIG. 1, according to a non-limiting example embodiment.

Referring to FIG. 17, upper touch electrodes 60 and upper dummy electrodes 63 may be located on an upper surface of an insulation layer 50. As the insulation layer 50, the polarization film 39 shown in FIG. 3 may be used. The upper touch electrodes 60 may extend in a first direction and may have a first width. A plurality of upper dummy electrodes 63 may be located between the upper touch electrodes 60. A hole h3 that corresponds to the light transmitting region 210 may be formed in the insulation layer 50. In addition, the upper touch electrodes 60 and the upper dummy electrodes 63 may not be formed at the periphery of the hole h3. The hole h3 may be omitted.

Figure 18:
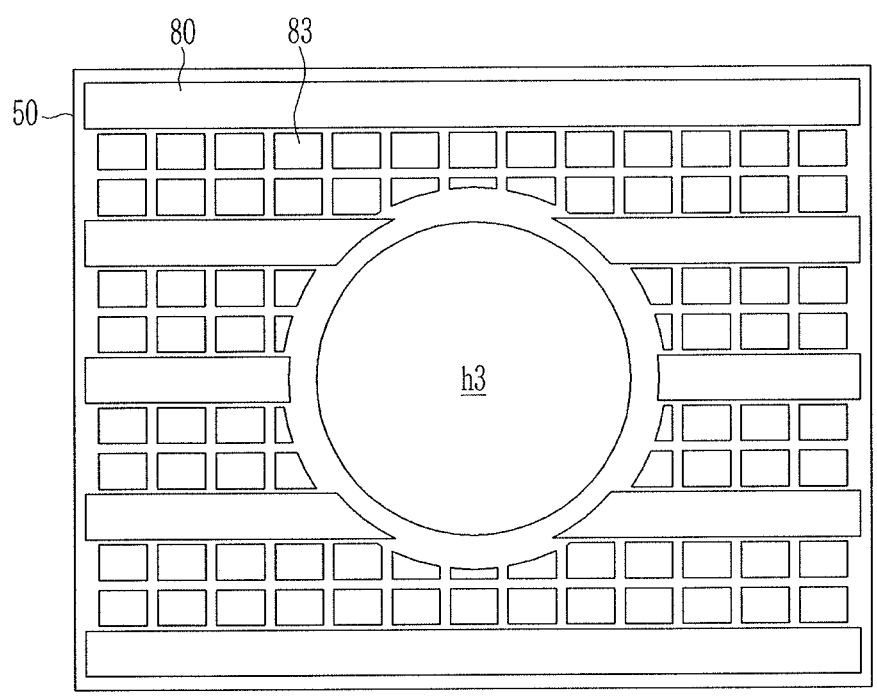
FIG. 18 illustrates lower touch electrodes included in the touch panel of FIG. 17.

FIG. 18 shows lower touch electrodes included in the touch panel of FIG. 17.

Referring to FIG. 18, lower touch electrodes 80 and lower dummy electrodes 83 may be located on a bottom surface of the insulation layer 50. The lower touch electrode 80 may extend in a second direction that is substantially perpendicular to the first direction in which the upper touch electrode 60 extends, and may have a second width. Here, the second width of the lower touch electrode 80 may be substantially the same as the first width of the upper touch electrode 60. In another implementation, the second width of the lower touch electrode 80 may be substantially different from the first width of the upper touch electrode 60. For example, when the first direction in which the upper touch electrode 60 extends is a short side direction and the second direction in which the lower touch electrode 80 extends is a long side direction, the first width of the upper touch electrode 60 may be substantially greater than the second width of the lower touch electrode 80. This may increase sensing sensitivity with respect to surrounding noise by making the entire area of the upper touch electrode 60 and the entire area of the lower touch electrode 80 substantially equal to each other.

A plurality of lower dummy electrodes 83 may be located between the lower touch electrodes 80. The lower touch electrodes 80 and the lower dummy electrodes 83 may not be formed at the periphery of the hole h3.

Figure 19:
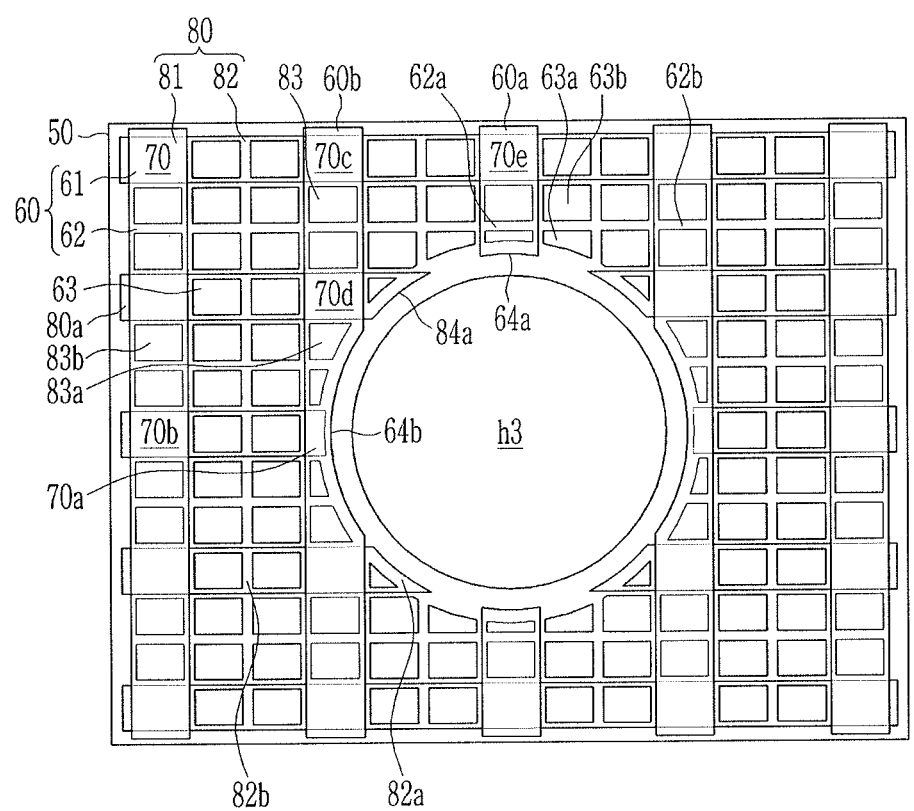
FIG. 19 illustrates a touch panel to which the upper touch electrode shown in FIG. 17 and the lower touch electrode of FIG. 18 are combined.

FIG. 19 shows a touch panel to which the upper touch electrode shown in FIG. 17 and the lower touch electrode of FIG. 18 are combined.

Referring to FIG. 19, the upper touch electrodes 60 may include an upper vertical sensing electrode 61 and an upper horizontal sensing electrode 62. The lower touch electrodes 80 may include a lower vertical sensing electrode 81 and a lower horizontal sensing electrode 82.

The upper vertical sensing electrode 61 and the lower vertical sensing electrode 81 may form a vertical sensing area 70 while being overlapped with each other. A first capacitor may be formed in a vertical direction in the vertical sensing area 70. A second capacitor may be formed in a horizontal direction between the upper horizontal sensing electrode 62 and the lower horizontal sensing electrode 82. A touch may be sensed by measuring a capacitance variation amount of the first capacitor and/or the second capacitor.

The upper touch electrode 60a may have an end portion that is adjacent to the hole h3, and the end portion may include a notch 64a. The upper touch electrode 60b may have a side portion that is adjacent to the hole h3, and the side portion may include a notch 64b. The lower touch electrode 80a may include an end portion that is adjacent to the hole h3, and the end portion may include a notch 84a.

An area of an upper dummy electrode 63a, adjacent to the hole h3, may be substantially smaller than an area of an upper dummy electrode 63b, not being adjacent to the hole h3. An area of a lower dummy electrode 83a, adjacent to the hole h3, may be substantially smaller than an area of a lower dummy electrode 83b, not being adjacent to the hole h3. An area of a vertical sensing area 70a, adjacent to the hole h3 may be substantially smaller than an area of a vertical sensing area 70b, not being adjacent to the hole h3. An area of a lower horizontal sensing area 82a, adjacent to the hole h3 may be substantially smaller than an area of a lower horizontal sensing electrode 82b, not being adjacent to the hole h3. An area of an upper horizontal sensing electrode 62a, adjacent to the hole h3 may be substantially smaller than an area of an upper horizontal sensing electrode 62b, not being adjacent to the hole h3.

The upper touch electrode 60a may have a single vertical sensing area 70e up to the hole h3, but the upper touch electrode 60b may have two vertical sense areas 70c and 70d up to the hole h3. However, FIG. 19 is a partial diagram, and, thus, does not imply that the upper touch electrode 60a has only a single vertical sensing area 70e up to the hole h3 and the upper touch electrode 60b has only two vertical sense areas 70c and 70d up to the hole g3.

Figure 20:
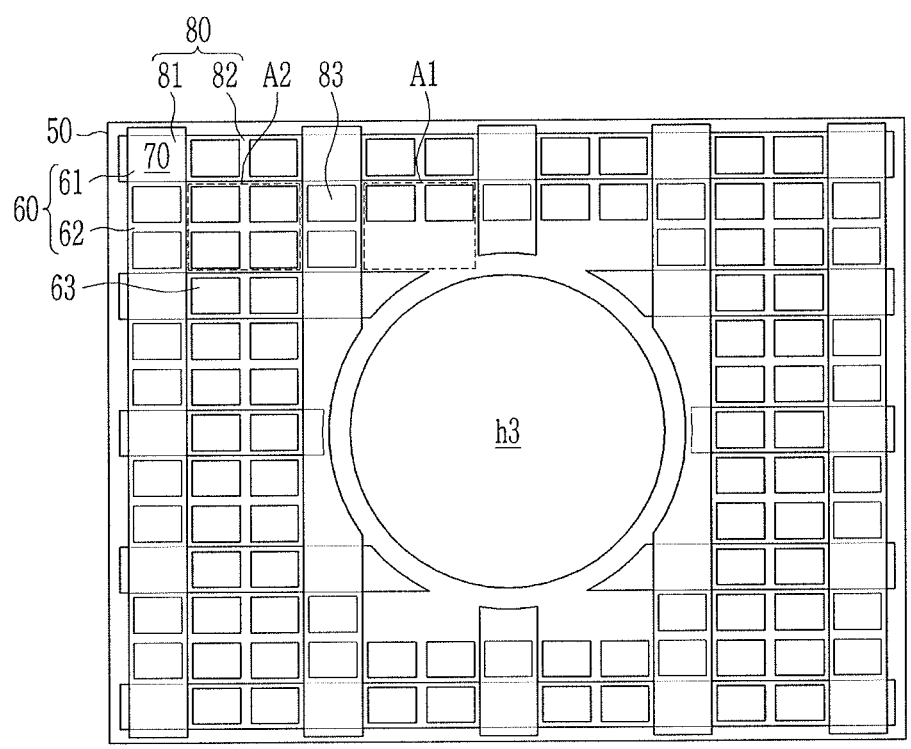
FIG. 20 illustrates a touch panel formed on the encapsulation structure of FIG. 1, according to a non-limiting example embodiment.

FIG. 20 shows a touch panel formed on the encapsulation structure of FIG. 1, according to a non-limiting example embodiment.

Referring to FIG. 20, two upper dummy electrodes 63 and two lower dummy electrodes 83 may be located to overlap each other in a first area A1 that is located adjacent to a hole h3 and surrounded by an upper touch electrode 60 and a lower touch electrode 80. Thus, total four dummy electrodes may be located in the first area A1.

In an implementation, four upper dummy electrodes 63 and four lower dummy electrodes 83 may be located to overlap each other in a second area A2 that is not adjacent to the hole h3 and surrounded by the upper touch electrode 60 and the lower touch electrode 80. Accordingly, a total of 8 dummy electrodes may be located in the second area A2.

The bypass structure shown in FIG. 13 may be employed in the touch panels of FIG. 19 and FIG. 20.

The touch panels described in FIG. 12 to FIG. 20 may be employed in an electroluminescent device having a light transmitting region, which will be described in FIG. 22, FIG. 28, FIG. 30, FIG. 31, FIG. 36, and FIG. 38, and an electroluminescent device having a notch, which will be described in FIG. 41, FIG. 45, and FIG. 52.

Figure 21:
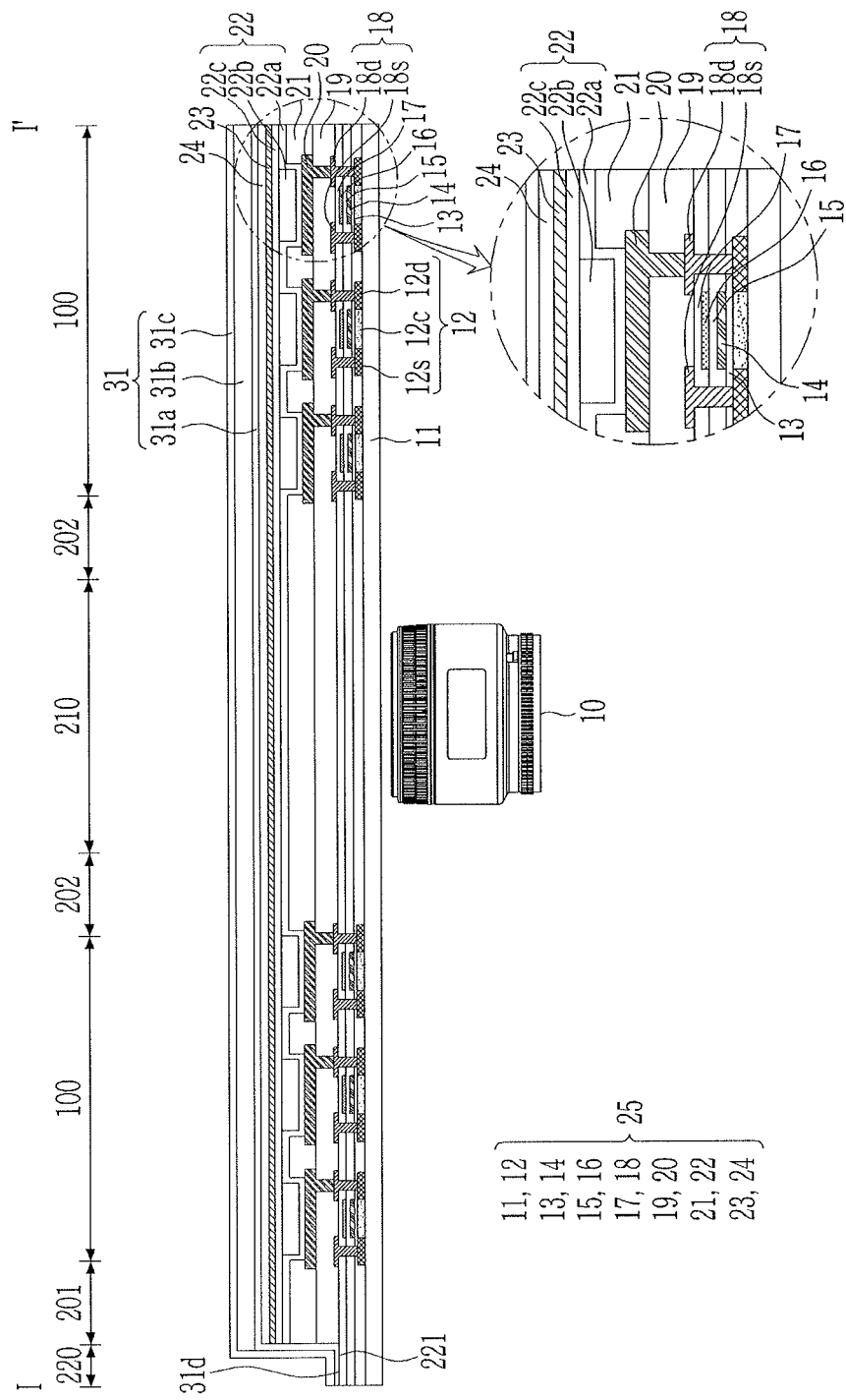
FIG. 21 illustrates a cross-sectional view taken along the line I-I' in FIG. 1, according to a non-limiting example embodiment.

FIG. 21 is a cross-sectional view taken along the line I-I' in FIG. 1, according to a non-limiting example embodiment.

Differing from FIG. 2, referring to FIG. 21, a hole transporting layer 22a, an electron transporting layer 22c, an upper electrode 23, and a passivation layer 24 may be common pattern layers, but each may have a shape in which a portion corresponding to a light transmitting region 210 is not removed. This is because, material properties of the hole transporting layer 22a, the electron transporting layer 22c, the upper electrode 23, and the passivation layer 24 may be changed during a removal process for removing a portion of the common pattern layer corresponding the light transmitting region, or designing a mask for evaporation deposition process for forming a common pattern layer having a hole may be difficult. In another implementation, at least one of the hole transporting layer 22a, the electron transporting layer 22c, the upper electrode 23, and the passivation layer 24 may have a shape from which a portion corresponding to the light transmitting region 210 is removed. When the upper electrode 23 includes a reflective metal, transmittance may be relatively decreased. Thus, a portion of the upper electrode 23, corresponding to the light transmitting region 210 may be removed when the upper electrode 23 includes the reflective material. The hole transporting layer 22a, the electron transporting layer 22c, and the passivation layer 24 having an organic material may less reduce transmittance. Thus, portions of the hole transporting layer 22a, the electron transporting layer 22c, and the passivation layer 24 corresponding to the light transmitting region 210 may not be removed. In the present non-limiting example embodiment, the light transmitting region 210 may have a non-hole structure.

Figure 22:
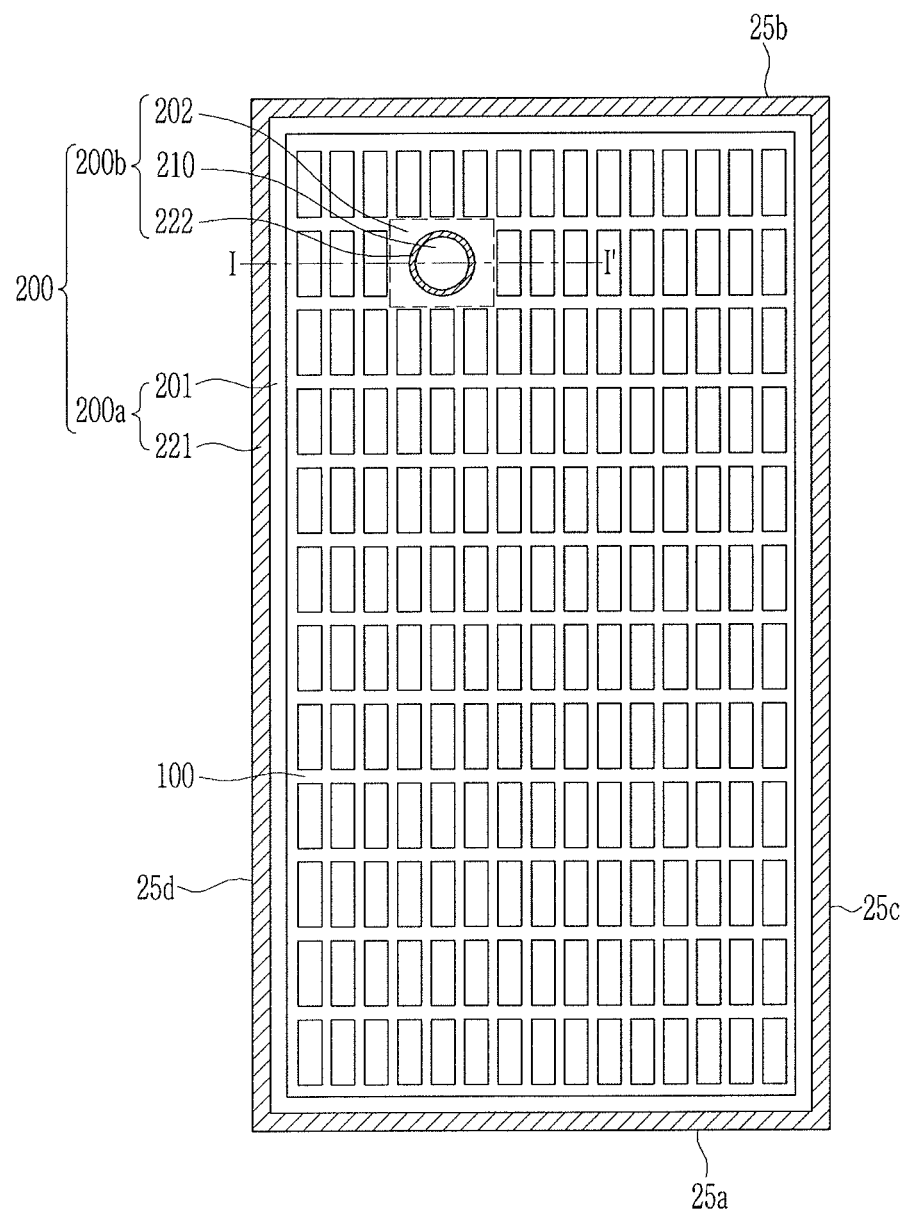
FIG. 22 illustrates a top plan view of an electroluminescent device according to a non-limiting example embodiment.
Figure 23:
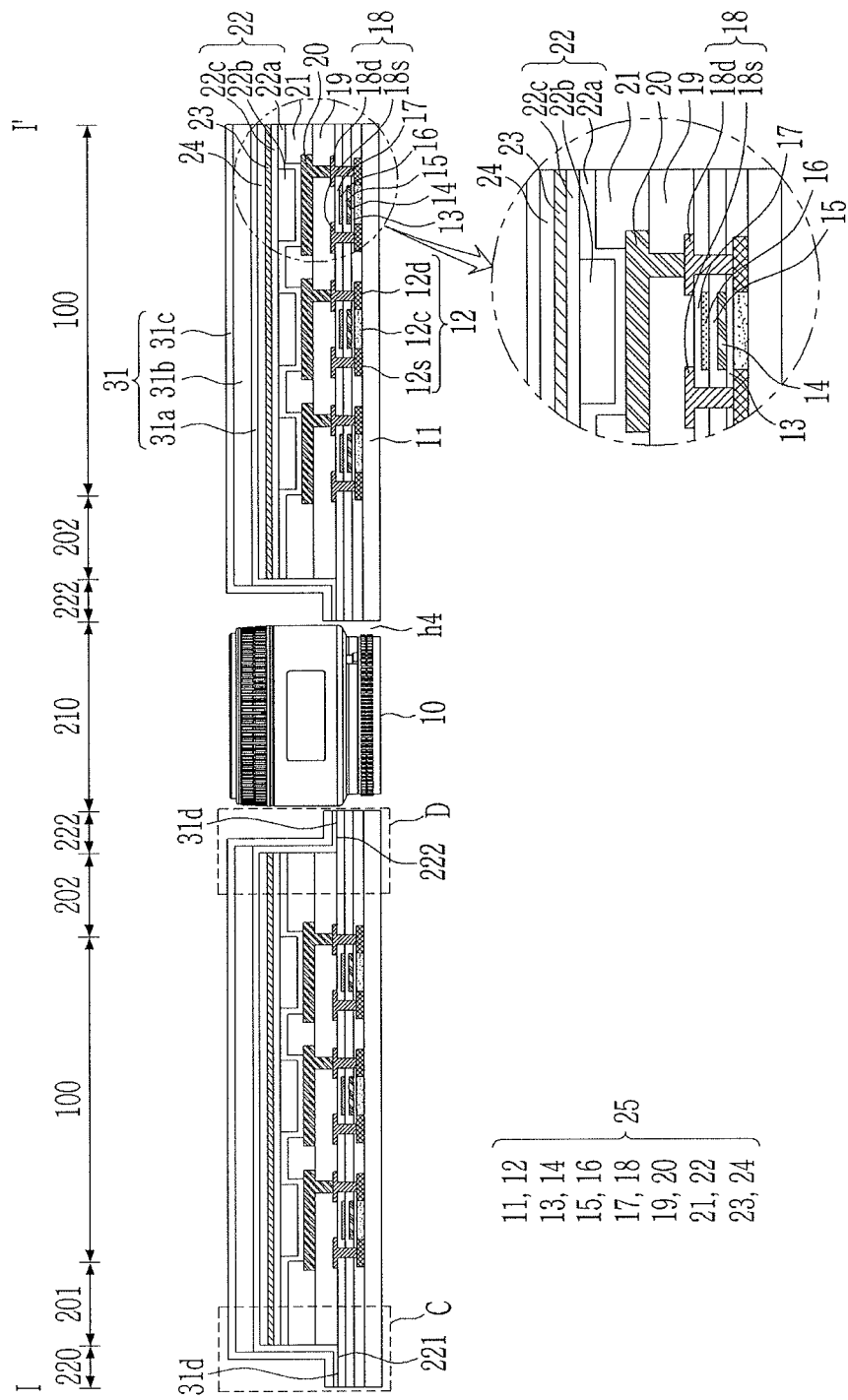
FIG. 23 illustrates a cross-sectional view taken along the line I-I' in FIG. 22, according to a non-limiting example embodiment.

FIG. 22 is a top plan view of an electroluminescent device according to a non-limiting example embodiment. FIG. 23 is a cross-sectional view taken along the line I-I' in FIG. 22, according to a non-limiting example embodiment.

Referring to FIG. 22 and FIG. 23, an electroluminescent device may include an emission area 100 and a non-emission area 200. The non-emission area 200 may include an outer non-emission area 200a and an inner non-emission area 200b. The outer non-emission area 200a may include an outer inorganic surface portion 221 that surrounds the emission area 100, and an outer buffer area 201 that is located between the emission area 100 and the outer inorganic surface portion 221. The inner non-emission area 200b may include a light transmitting region 210 that is surrounded by the emission area 100 and is used as a window, and an inner buffer layer 202 that is located between the emission area 100 and an inner inorganic surface portion 222.

The lower structure 25 may include the emission area 100 and the non-emission area 200. The non-emission area 200 may include an outer non-emission area 200a and an inner non-emission area 200b. The outer non-emission area 200a may include an outer inorganic surface portion 220 that surrounds the emission area 100, and an outer buffer area 201 that is located between the emission area 100 and the outer inorganic surface portion 220. The inner non-emission area 200b may include the light transmitting region 210 that is surrounded by the emission area 100 and is used as a window, and an inner buffer area 202 that is located between the emission area 100 and the light transmitting region 210. Here, the inorganic surface portion implies a part of the entire inorganic surface or the entity of the inorganic surface.

The light transmitting region 210 may include a hole h4 into which an optical member 10 is inserted. A plurality of optical members 10 may be inserted into the hole h4. Other spaces of the hole h4, remaining after the insertion of the optical members 10, may be filled with a filler that may include, for example, a hygroscopic or anti-moisture permeable material. Such a filler may be provided to block moisture or oxygen that may be permeated into the electroluminescent device and fix the optical members 10. Rather than the optical member 10, a non-optical member such as a speaker may be inserted into the hole h4. The entire area of the light transmitting region 210 may be the hole h4. In another implementation, a part of the light transmitting region 210 may be the hole h4. Moisture and oxygen that may be permeated through a side portion of the emission area 100 from the hole h4 may be blocked by an inorganic-inorganic contact line formed by direct contact between the inner inorganic surface portion 222 and the inorganic lower surface 31d of the encapsulation structure 31. The inorganic-inorganic contact line may have a closed loop shape. In an implementation, only an inorganic material may be formed between the inorganic layer structure such as a first gate insulation layer 13, a second gate insulation layer 15, and an interlayer insulation layer 17 and the inner inorganic surface portion 222.

When the light transmitting region 210 completely surrounded by the emission area 100 has the hole h4 into which the optical member 10 is inserted, it may be advantageous for the encapsulation structure 31 to be a multilayer having more flexibility than a rigid encapsulation structure including an inorganic sealant and an inorganic glass substrate. This is because, when the encapsulation structure 31 is the rigid encapsulation structure, the emission area 100 may be easily damaged during processes for forming the inorganic sealant at the periphery of the light transmitting region 210 and, then, irradiating laser beams to the inorganic sealant, or processes for removing an area of the inorganic glass substrate, corresponding to the light transmitting region 210, using laser beams and the like because the light transmitting region 210 is completely surrounded by the emission area 100. According to a non-limiting example embodiment, the electroluminescent device in FIG. 22 may include a rigid encapsulation structure having an inorganic sealant and an inorganic glass substrate to the extent that a damage to the emission area 100 is not excessive.

A surface of at least one of at least a part of the first wire 41a and at least a part of the second wire 41b, and at least a part of the connection member 43 shown in FIG. 4 to FIG. 7, may be included in the inner inorganic surface portion 222 shown in FIG. 22. In another implementation, a surface of at least one of at least a part of the first wire 41a and at least a part of the second wire 41b, and at least a part of the connection member 43 shown in FIG. 4 to FIG. 7, may be located under the inner inorganic surface portion 222 shown in FIG. 22.

The driving current supply structures shown in FIG. 8 to FIG. 11 may be employed to the electroluminescent device shown in FIG. 22 and FIG. 23. According to a non-limiting example embodiment, the inner bus wires shown in FIG. 9 to FIG. 11 may overlap the inner inorganic surface portion 222. According to a non-limiting example embodiment, the inner bus wires 77 shown in FIG. 9 to FIG. 11 may be included in the inner inorganic surface portion 222 or may be located under the inner inorganic surface portion 222.

The touch panels shown in FIG. 12 to FIG. 20 may be employed to the electroluminescent device shown in FIG. 22 and FIG. 23. According to a non-limiting example embodiment, the first sensing electrode 51a-1 and the dummy electrode 53a of FIG. 12, the first sensing electrode 51a-1 of FIG. 14, the first and second sensing electrodes 51a-4 and 52a-4 of FIG. 15, the sensing electrode 54a-1 of FIG. 16, and the upper dummy electrode 63a, the lower dummy electrode 83a, the vertical sensing area 70a, the lower horizontal sensing electrode 82a, and the upper horizontal sensing electrode 62a of FIG. 19 may not be overlapped with the inner inorganic surface portion 222.

Figure 24:
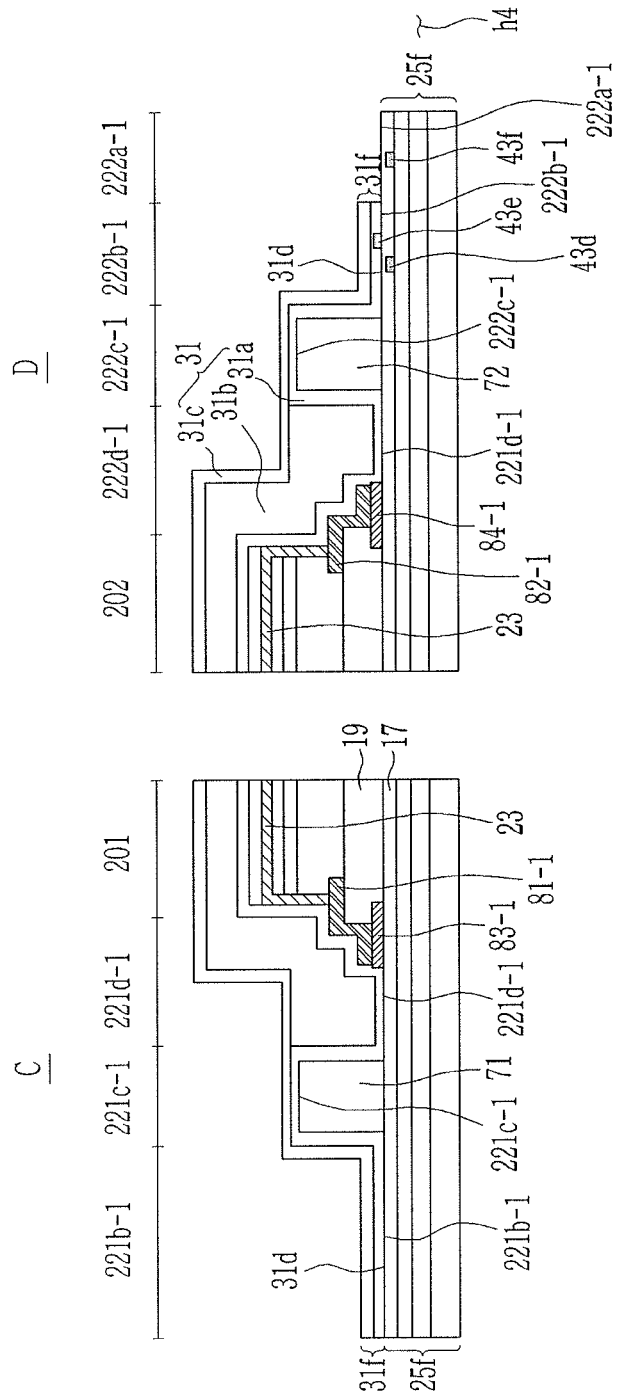
FIG. 24 illustrates a cross-sectional view of an area C and an area D in FIG. 23 according to a non-limiting example embodiment.

FIG. 24 is a cross-sectional view of an area C and the area D in FIG. 23 according to a non-limiting example embodiment.

Referring to the area C in FIG. 24, at least a portion of a side face 25f of the lower structure 25 and at least a portion of a side face 31f of the encapsulation structure 31 may be located on substantially the same plane. The lower structure may include a first outer inorganic surface portion 221b-1 that is located in the outermost region and surrounds the emission area 100, an outer organic surface portion 221c-1 that is connected to the first outer inorganic surface portion 221b-1 and corresponds to a surface of an outer organic dam 71, and a second outer inorganic surface portion 221d-1 that is connected to the outer organic surface portion 221c-1 and surrounds the emission area 100. The first outer inorganic surface portion 221b-1 and the second outer inorganic surface portion 221d-1 may be completely separated from each other or partially separated from each other by the outer organic surface portion 221c-1. The entire area of the first outer inorganic surface portion 221b-1 and the entire area of the second outer inorganic surface portion 221d-1 may make a direct contact with an inorganic lower surface 31d of the encapsulation structure.

Referring back to the area C in FIG. 24, an outer lower connection wire 83-1 that substantially surrounds the emission area 100 may be located on the interlayer insulation layer 17. The outer lower connection wire 83-1 may be formed by substantially the same process as that of a source/drain electrode 18. An outer upper connection wire 81-1 may be located on a planarization layer 19, and may make a contact with an upper electrode 23 and the outer lower connection wire 83-1. The outer upper connection wire 81-1 may be formed by substantially the same process as that of a lower electrode 20. The outer lower connection wire 83-1 may have a shape that substantially surrounds the emission area 100. When the upper electrode 23 is a cathode, electrons may be sequentially transmitted to the upper electrode 23 through the outer lower connection wire 83-1 and the outer upper connection wire 81-1. The outer lower connection wire 83-1 may be electrically connected to a power source that is provided outside the electroluminescent device. According to a non-limiting example embodiment, the outer lower connection wire 83-1 may be omitted. According to a non-limiting example embodiment, the outer upper connection wire 81-1 may not be formed and the upper electrode 23 may make a contact with the outer lower connection wire 83-1.

Referring to the area D in FIG. 24, the side face 31f of the encapsulation structure 31 may be located further inside than the side face 25f of the lower structure 25. When a process for forming the side face 25f of the lower structure 25 and a process for forming the side face 31f of the encapsulation structure 31 are substantially different from each other, the side face 31f of the encapsulation structure 31 may be located further inside than the side face 25f of the lower structure 25. For example, when a first inorganic layer 31a and a second inorganic layer 31c of the encapsulation structure 31 are deposited using substantially the same deposition open mask, a side face of the first inorganic layer 31a and a side face of the second inorganic layer 31c may be located on the substantially the same plane and, at the same time, the side face 31f of the encapsulation structure 31 may be located further inside than the side face 25f of the lower structure 25. In this case, the side face 31f of the encapsulation structure 31 may be formed without performing an additional etching process, and damage to the electroluminescent unit, which may occur during a general etching process that is performed after forming the electroluminescent unit, may be reduced.

Referring back to the area D in FIG. 24, the lower structure 25 may include an open inner inorganic surface portion 222a-1 that is located in the outermost region and does not make a contact with the inorganic lower surface 31d of the encapsulation structure 31, a first inner inorganic surface portion 222b-1 that is connected to the open inner inorganic surface portion 222a-1 and surrounds the hole h4, an inner organic surface portion 222c-1 that is connected to the first inner inorganic surface portion 222b-1 and corresponds to a surface of the inner organic dam 72, and a second inner inorganic surface portion 222d-1 that is connected to the inner organic surface portion 222c-1 and surrounds the hole h4. The first inner inorganic surface portion 222b-1 and the second inner inorganic surface portion 222d-1 may be completely separated or partially separated from each other by the inner organic surface portion 222c-1. The entire area of the first inorganic surface portion 222b-1 and the entire area of the second inner inorganic surface portion 222d-1 may make a direct contact with the inorganic lower surface 31d of the encapsulation structure 31. The open inner inorganic surface portion 222a-1 may be opened with respect to the encapsulation structure 31. For example, the open inner inorganic surface portion 222a-1 may not make a contact with the inorganic lower surface 31d of the encapsulation structure 31, but may be covered by another member after the encapsulation structure 31 is formed. A connection member 43*d* may be located under the first inner inorganic surface portion 222*b*-1. A connection member 43*e* may be included in the first inner inorganic surface portion 222*b*-1. A connection member 43*f* may be located under the open inner inorganic surface portion 222*a*-1.

Referring back to the area D in FIG. 24, an inner lower connection wire 84-1 that substantially surrounds the light transmitting region 210 may be located on the interlayer insulation layer 17. The inner lower connection wire 84-1 may be formed by substantially the same process as that of the source/drain electrode 18. An inner upper connection wire 82-1 may be located on a planarization layer 19, and may make a contact with the upper electrode 23 and the inner lower connection wire 84-1. The inner upper connection wire 82-1 may be formed by substantially the same process as that of the lower electrode 20. The inner lower connection wire 84-1 may have a shape that substantially surrounds the emission area 100. According to a non-limiting example embodiment, the inner lower connection wire 84-1 may not be electrically connected to a power source that is located outside the electroluminescent device. According to a non-limiting example embodiment, the inner lower connection wire 84-1 may be omitted. According to a non-limiting example embodiment, the inner upper connection wire 82-1 may be omitted and the upper electrode 23 may make a contact with the inner lower connection wire 84-1. According to a non-limiting example embodiment, the inner upper connection wire 82-1 and the inner lower connection wire 84-1 may be omitted.

Figure 25:
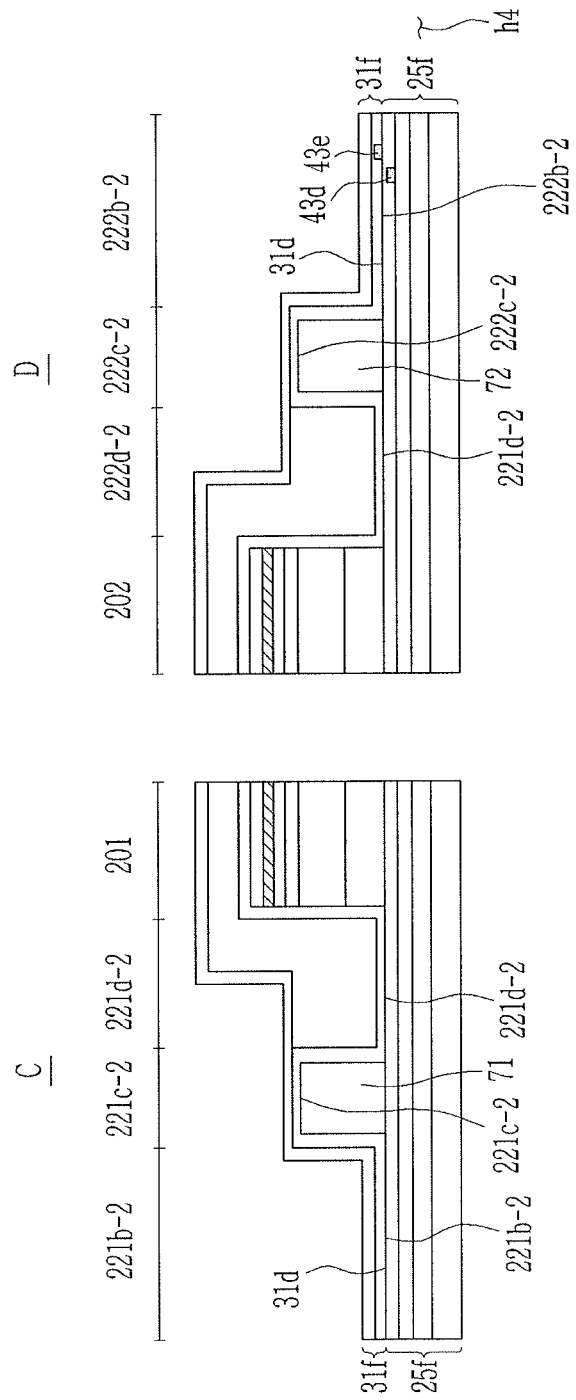
FIG. 25 illustrates a cross-sectional view of the area C and the area D in FIG. 23 according to a non-limiting example embodiment.

FIG. 25 is a cross-sectional view of the area C and the area D in FIG. 23 according to a non-limiting example embodiment.

Referring to the area C in FIG. 25, at least a portion of the side face 25*f* of the lower structure 25 and at least a portion of the side face 31*f* of the encapsulation structure may be located on substantially the same plane. The lower structure 25 may include a first outer inorganic surface portion 221*b*-2 that is located in the outermost region and surrounds the emission area 100, an outer organic surface portion 221*c*-2 that is connected to the first outer inorganic surface portion 221*b*-2 and corresponds to a surface of the outer organic dam 71, and a second outer inorganic surface portion 221*d*-2 that is connected to the outer organic surface portion 221*c*-2 and surrounds the emission area 100.

Referring to the area D in FIG. 25, at least a portion of the side face 25*f* of the lower structure 25 and at least a portion of the side face 31*f* of the encapsulation structure 31 may be located on substantially the same plane. The lower structure may include a first inner inorganic surface 222*b*-2 that is located in the outermost region and surrounds the hole h4, an inner organic surface portion 222*c*-2 that is connected to the first inner inorganic surface portion 222*b*-2 and corresponds to a surface of the inner organic dam 72, and a second inner inorganic surface portion 222*d*-2 that is connected to the inner organic surface portion 222*c*-2 and surrounds the hole h4. The connection member 43*d* may be located under the first inner inorganic surface portion 222*b*-2. The connection member 43*e* may be included in the first inner inorganic surface portion 222*b*-2.

Figure 26:
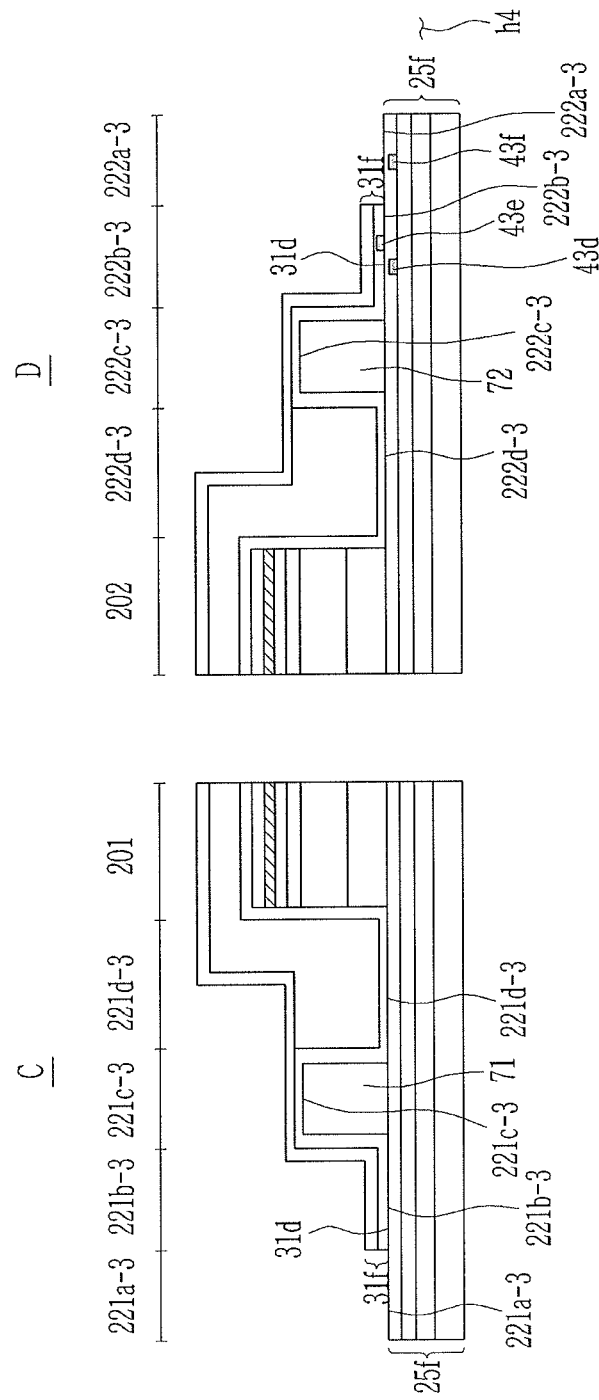
FIG. 26 illustrates a cross-sectional view of the area C and the area D in FIG. 23 according to a non-limiting example embodiment.

FIG. 26 is a cross-sectional view of the area C and the area D in FIG. 23 according to a non-limiting example embodiment.

Referring to the area C in FIG. 26, the side face 31*f* of an encapsulation structure 31 may be located further inside than the side face 25*f* of the lower structure 25. The lower structure 25 may include an opened outer inorganic surface portion 221*a*-3 that is located in the outermost region and does not make a contact with the inorganic lower surface 31*d* of the encapsulation structure 31, a first outer inorganic surface portion 221*b*-3 that is connected to the opened outer inorganic surface portion 221*a*-3 and surrounds the emission area 100, a first organic surface portion 221*c*-3 that is connected to the first outer inorganic surface portion 221*b*-3 and corresponds to a surface of the outer organic dam 71, and a second outer inorganic surface portion 221*d*-3 that is connected to the outer organic surface portion 221*c*-1 and surrounds the emission area 100.

Referring to the area D in FIG. 26, the side face 31*f* of the encapsulation structure 31 may be located further inside than the side face 25*f* of the lower structure 25. The lower structure 25 may include an open inner inorganic surface portion 222*a*-3 that is located in the outermost region and does not make a contact with the inorganic lower surface 31*d*, a first inner inorganic surface portion 222*b*-3 that is connected to the open inner inorganic surface portion 222*a*-3 and surrounds the hole h4, a second organic surface portion 222*c*-3 that is connected to the first inner inorganic surface portion 222*b*-3 and corresponds to a surface of the inner organic dam 72, and a second inner inorganic surface portion 222*d*-3 that is connected to the second organic surface portion 222*c*-3 and surrounds the hole h4. The connection member 43*d* may be located under the first inner inorganic surface portion 222*b*-3. The connection member 43*e* may be included in the first inner inorganic surface portion 222*b*-3. The connection member 43*f* may be located under the open inner inorganic surface portion 222*a*-3.

Figure 27:
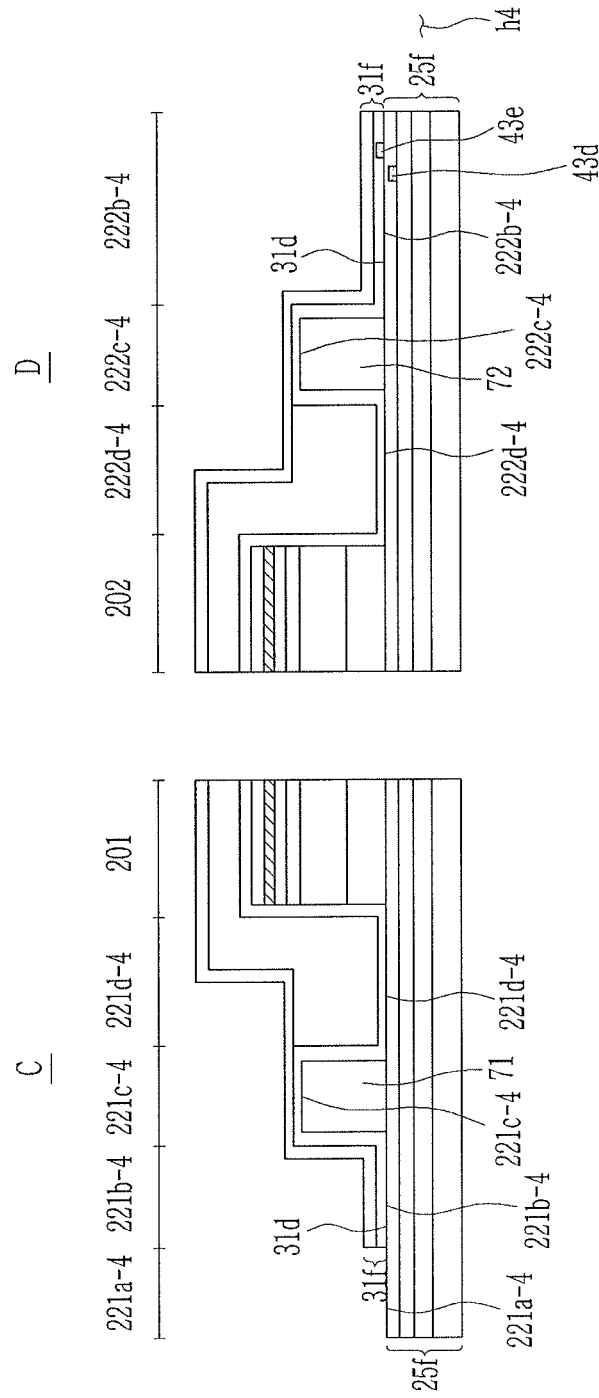
FIG. 27 illustrates a cross-sectional view of the area C and the area D in FIG. 23 according to a non-limiting example embodiment.

FIG. 27 is a cross-sectional view of the area C and the area D in FIG. 23 according to a non-limiting example embodiment.

Referring to the area C in FIG. 27, the side face 31*f* of the encapsulation structure 31 may be located further inside than the side face 25*f* of the lower structure 25. The lower structure 25 may include an opened outer inorganic surface portion 221*a*-4 that is located in the outermost region and does not make a contact with the inorganic lower surface 31*d* of the encapsulation structure 31, a first outer inorganic surface portion 221*b*-4 that is connected to the opened outer inorganic surface portion 221*a*-4 and surrounds the emission area 100, an outer organic surface portion 221*c*-4 that is connected to the first outer inorganic surface portion 221*b*-4 and corresponds to a surface of the outer organic dam 71, and a second outer inorganic surface portion 221*d*-4 that is connected to the outer organic surface portion 221*c*-4 and surrounds the emission area 100.

Referring to the area D in FIG. 27, at least a portion of the side face 25*f* of the lower structure 25 and at least a portion of the side face 31*f* of the encapsulation structure 31 may be located on substantially the same plane. The lower structure 25 may include a first inner inorganic surface portion 222*b*-4 that is located in the outermost region and surrounds the hole h4, an inner organic surface portion 222*c*-4 that is connected to the first inner inorganic surface portion 222*b*-4 and corresponds to a surface of the inner organic dam 72, and a second inner inorganic surface portion 222*d*-4 that is connected to the inner organic surface portion 222*c*-4 and surrounds the hole h4. The connection member 43*d* may be located under the first inner inorganic surface portion 222*b*-4. The connection member 43*e* may be included in the first inner inorganic surface portion 222*b*-4.

Figure 28:
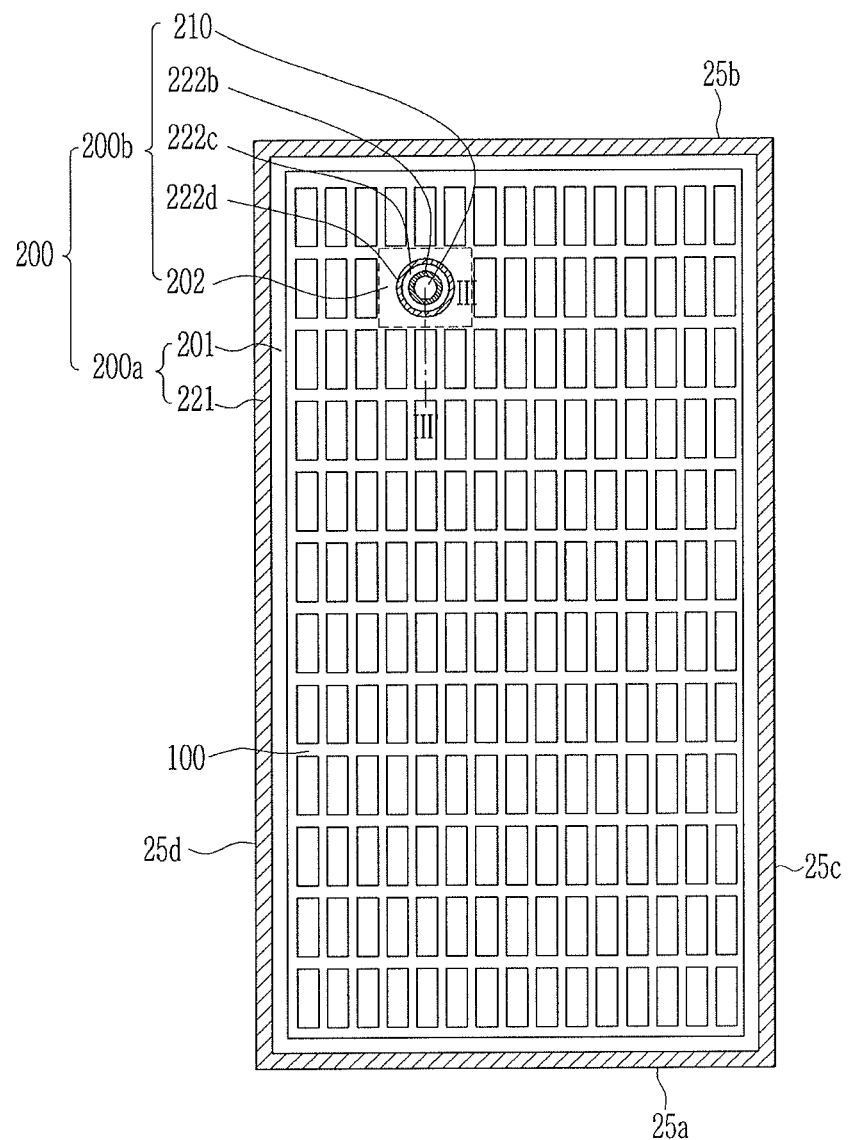
FIG. 28 illustrates a top plan view of an electroluminescent device according to a non-limiting example embodiment.
Figure 29:
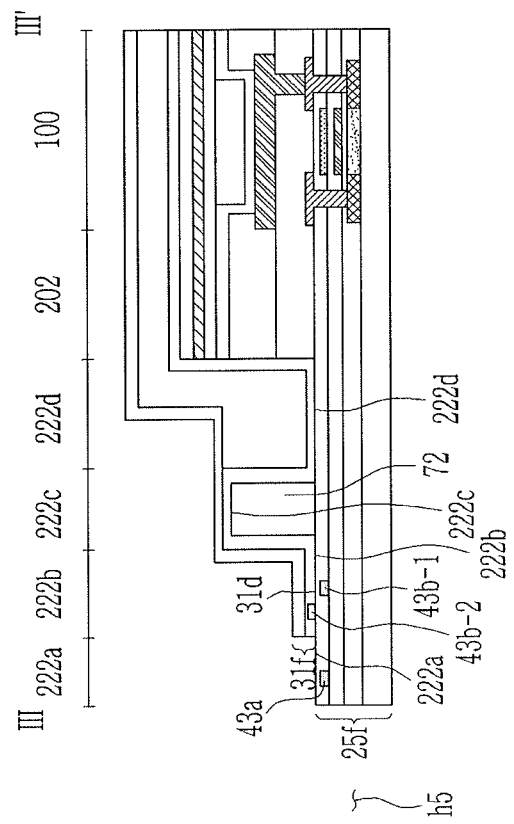
FIG. 29 illustrates a cross-sectional view taken along the III-III' line in FIG. 28, according to a non-limiting example embodiment.

FIG. 28 is a top plan view of an electroluminescent device according to a non-limiting example embodiment. FIG. 29 is a cross-sectional view taken along the line in FIG. 23, according to a non-limiting example embodiment.

Referring to FIG. 28 and FIG. 29, an electroluminescent device may include an emission area 100 and a non-emission area 200. The non-emission area 200 may include an outer non-emission area 200a and an inner non-emission area 200b.

The outer non-emission area 200a may include an outer inorganic surface portion 221 that surrounds the emission area 100 and an outer buffer area 201 that is located between the emission area 100 and the outer inorganic surface portion 221. The inner non-emission area 200b may include a light transmitting region 210 that is surrounded by the emission area 100 and is used as a window, a first inner inorganic surface portion 222b that surrounds the light transmitting region 210, an inner organic surface portion 222c that surrounds the first inner inorganic surface portion 222b, a second inner inorganic surface portion 222d that surrounds the inner organic surface portion 222c, and an inner buffer area 202 that is located between the second inner inorganic surface portion 222d and the emission area 100.

The light transmitting region 210 may have a hole h5. An open inner inorganic surface portion 222a that surrounds the hole h5 may be located in the outermost region of the inner buffer area 202. The open inner inorganic surface portion 222a may not be covered by an encapsulation structure 31. The first inner inorganic surface portion 222b may make a direct contact with the encapsulation structure 31 and may have a closed loop shape. The second inner inorganic surface portion 222d may also have a closed loop shape while making a direct contact with the encapsulation structure 31.

The lower structure 25 may include an inner organic dam 72, and a surface of the inner organic dam 72 may correspond to the inner organic surface portion 222c of the lower structure 25. Here, the first inner inorganic surface portion 222b and the second inner inorganic surface portion 222d may not be connected to each other, as shown in the drawing, but this is not restrictive. The first inner inorganic surface portion 222b and the second inner inorganic surface portion 222d may be connected to each other in at least one region.

A side face 25f of the lower structure 25 may be located on a plane that is different from a plane on which a side face 31f of the encapsulation structure 31 is located, and the side face 31f of the encapsulation structure 31 may be located further inside than the side face 25f of the lower structure 25. In such a structure, the emission area 100 may be relatively narrowed due to a distance between the side face 25f of the lower structure 25 and the side face 31f of the encapsulation structure 31, and, therefore, at least a part of a connection member 43a may be located under the open inner inorganic surface portion 222a, at least a part of a connection member 43b-2 may be included in the first inner inorganic surface portion 222b, or at least a part of a connection member 43b-1 may be located under the first inner inorganic surface portion 222b.

A surface of at least one of at least a part of the first wire 41a, at least a part of the second wire 41b, and at least a part of the connection member 43 shown in FIG. 4 to FIG. 7 may be included in at least one of the first and second inner inorganic surface portions 222b and 222d shown in FIG. 28 and FIG. 29. In another implementation, a surface of at least one of at least a part of the first wire 41a, at least a part of the second wire 41b, and at least a part of the connection member 43 shown in FIG. 4 to FIG. 7 may be located under at least one of the first and second inner inorganic surface portions 222b and 222d shown in FIG. 28 and FIG. 29.

The driving current supply structures shown in FIG. 8 to FIG. 11 may be employed to the electroluminescent device shown in FIG. 28 and FIG. 29. According to a non-limiting example embodiment, the inner bus wire 77 shown in FIG. 9 to FIG. 11 may overlap at least one of the first and second inner inorganic surface portions 222b and 222d. According to a non-limiting example embodiment, the inner bus wire 77 shown in FIG. 9 to FIG. 11 may be included in at least one of the first and second inner inorganic surface portions 222b and 222d or may be located under at least one of the first and second inner inorganic surface portions 222b and 222d.

The touch panels shown in FIG. 12 to FIG. 20 may be employed to the electroluminescent device shown in FIG. 28 and FIG. 29. According to a non-limiting example embodiment, the first sensing electrode 51a-1 and the dummy electrode 53a of FIG. 12, the first sensing electrode 51a-1 of FIG. 14, the first and second sensing electrodes 51a-4 and 52a-4 of FIG. 15, the sensing electrode 54a-1 of FIG. 16, the upper dummy electrode 63a, the lower dummy electrode 83a, the vertical sensing area 70a, the lower horizontal sensing electrode 82a, and the upper horizontal sensing electrode 62a of FIG. 19 may not overlap at least one of the first and second inner inorganic surface portions 222b and 222d.

Figure 30:
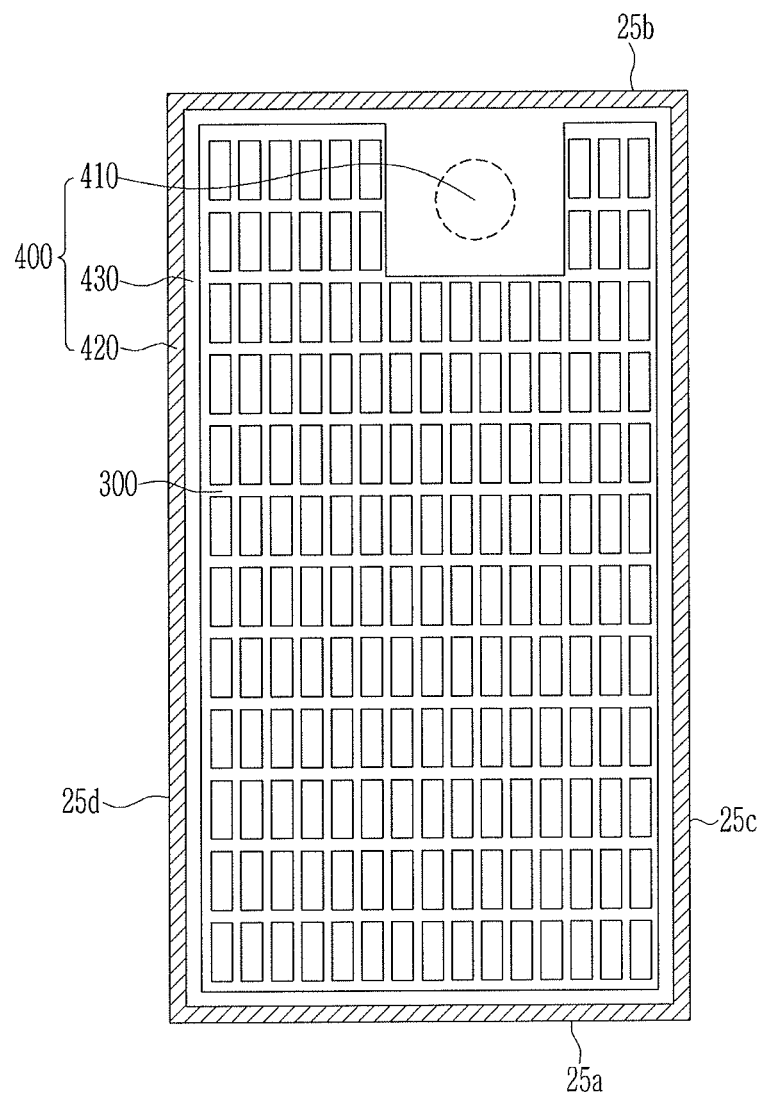
FIG. 30 illustrates a top plan view of an electroluminescent device according to a non-limiting example embodiment.

FIG. 30 is a top plan view of an electroluminescent device according to a non-limiting example embodiment.

Referring to FIG. 30, a lower structure 25 may include an emission area 300 and an outer non-emission area 400. The outer non-emission area 400 may include an outer inorganic surface portion 420 that surrounds the emission area 300, an outer buffer layer 430 that is located between the emission area 300 and the outer inorganic surface portion 420, and a light transmitting region 410 that is surrounded by the outer buffer area 430 and partially surrounded by the emission area 300. In the present non-limiting example embodiment, the light transmitting region 410 may have a non-hole structure.

Figure 31:
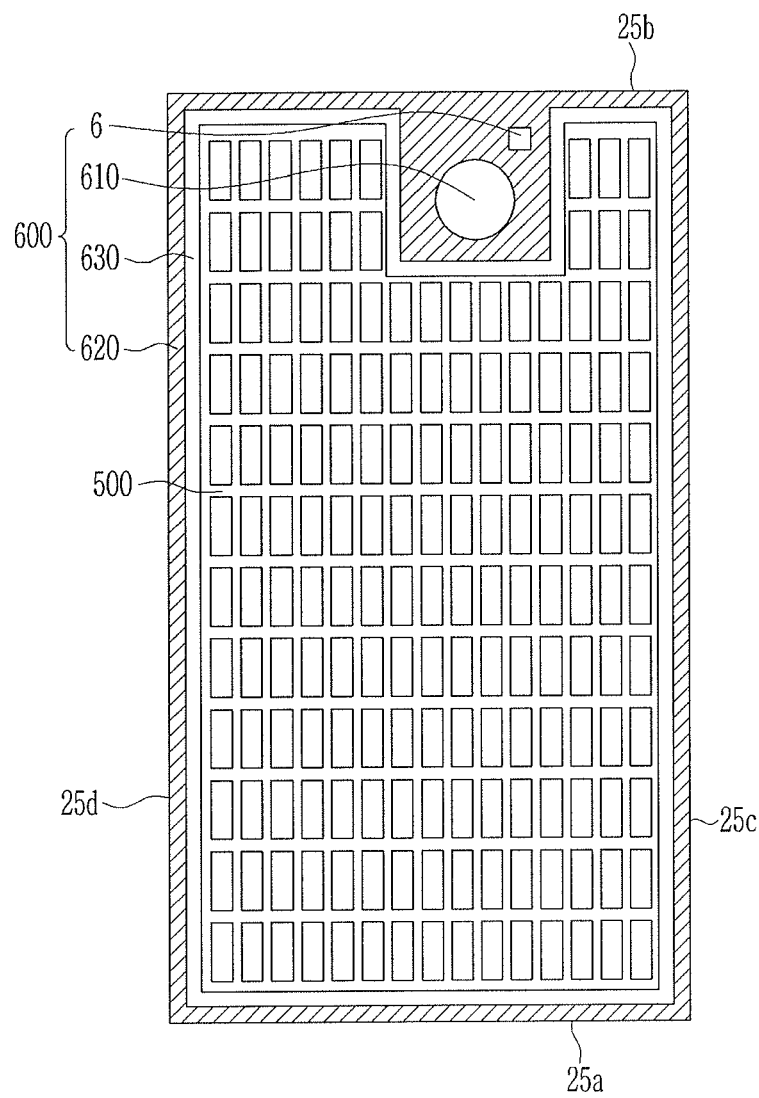
FIG. 31 illustrates a top plan view of an electroluminescent device according to a non-limiting example embodiment.

FIG. 31 is a top plan view of an electroluminescent device according to a non-limiting example embodiment.

Referring to FIG. 31, a lower structure 25 may include an emission area 500 and an outer non-emission area 600. The outer non-emission area 600 may include an outer inorganic surface portion 620 that surrounds the emission area 500, an outer buffer area 630 that is located between the emission area 500 and the outer inorganic surface portion 620, a light transmitting region 610 that is surrounded by the outer inorganic surface portion 620 and partially surrounded by the emission area 500, and an organic surface island 6 that is surrounded by the outer inorganic surface portion 620. The light transmitting region 610 may include a hole.

The organic surface island 6 may be located inside the outer inorganic surface portion 620. The organic surface island 6 may be a surface of a spacer that neighbors a mask during an evaporation process for forming an intermediate layer, but the usage of the organic surface island 6 is not limited thereto. In another implementation, the organic surface island 6 may be omitted.

A surface of at least one of at least a part of the first wire 41a, at least a part of the second wire 41b, and at least a part of the connection member 43 shown in FIG. 4 to FIG. 7 may be included in the outer inorganic surface portion 620 shown in FIG. 31. In another implementation, a surface of at least one of at least a part of the first wire 41a, at least a part of the second wire 41b, and at least a part of the connection member 43 shown in FIG. 4 to FIG. 7 may be located under the outer inorganic surface portion 620 shown in FIG. 31.

Figure 32:
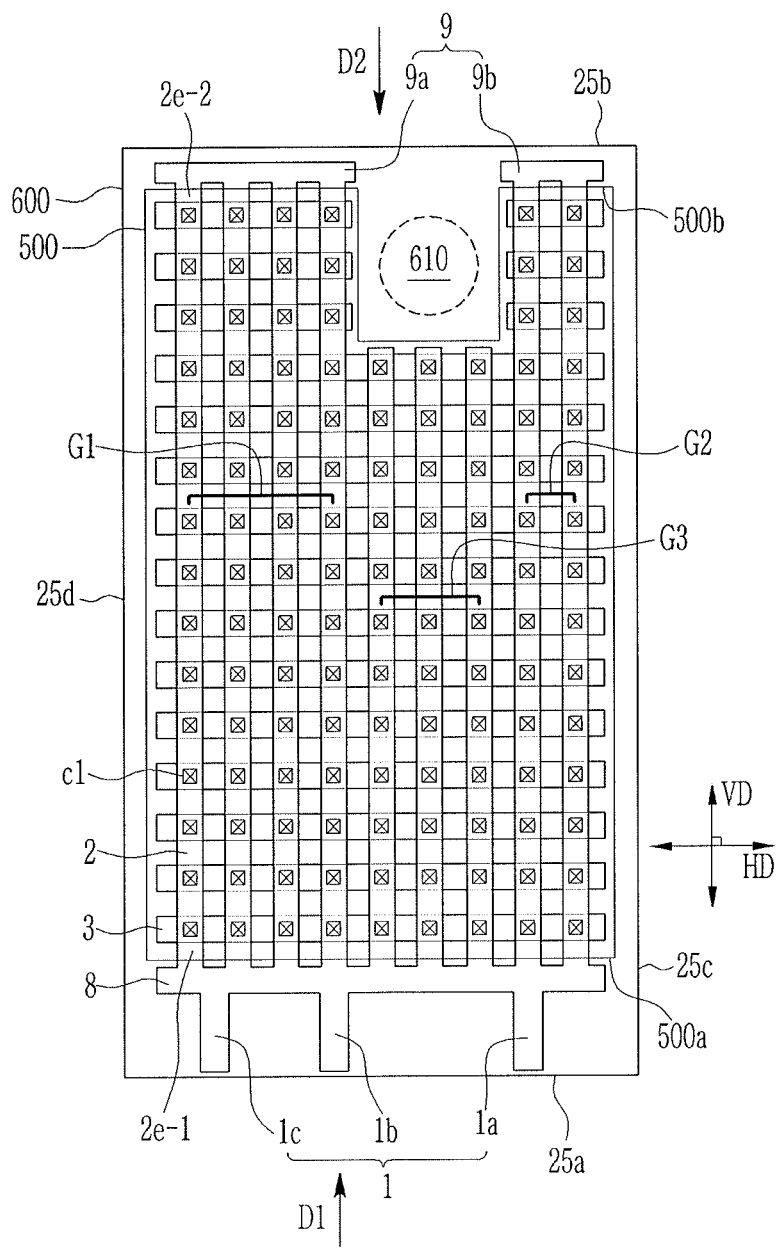
FIG. 32 illustrates a driving current supply structure included in the electroluminescent device shown in FIG. 30 or FIG. 31, according to a non-limiting example embodiment.

FIG. 32 shows a driving current supply structure included in the electroluminescent device shown in FIG. 30 or FIG. 31, according to a non-limiting example embodiment. For example, the driving current supply structure may supply a driving current to a lower electrode 20.

The driving current supply structure may include a terminal wire 1, a first outer bus wire 8, a first wire 2, a second wire 3, and a second outer bus wire 9.

The terminal wire 1 may be located on a first side 25a of the lower structure 25. A terminal pad (not shown) may be formed at an end of the terminal wire 1. A driving current supplied to the terminal pad may be transmitted to the first outer bus wire 8 along a first direction D1 through the first terminal wire 1. A plurality of the terminal wires 1 may be provided. The terminal wires 1 may overlap the outer non-emission area 600.

The first outer bus wire 8 may be connected to the terminal wires 1. The first outer bus wire 8 may be located on the first side 25a of the lower structure 25 while being adjacent to a first side 500a of the emission area 500, and may extend in a horizontal direction HD in which the first side 25a extends. The first outer bus wire 8 may overlap the outer non-emission area 600.

According to a non-limiting example embodiment, when a boundary of an emission zone is not located inside a boundary of a pixel circuit zone, the first outer bus wire 8 may at least partially overlap at least one of the emission zone and the lower electrode 20 while being located outside a boundary of the pixel circuit area so that the area of the emission area 300 shown in FIG. 30 or the area of the emission area 500 shown in FIG. 31 may be efficiently widened while disposing the first outer bus wire 8 as close to the pixel circuit area as possible.

A first end 2e-1 of the first wire 2 may be connected to the first outer bus wire 8, and may extend in a vertical direction VD that is substantially perpendicular to the horizontal direction HD. A plurality of the first wire 2 may be provided. The first wires 2 may overlap the emission area 500.

The second wire 3 may be connected to the first wires 2 through contacts c1, and may extend in the horizontal direction HD. A plurality of the second wires 3 may be provided. The second wires 3 may overlap the emission area 500.

The second outer bus wire 9 may be connected to a second end 2e-2 that is located substantially opposite to the first end 2e-1. The second outer bus wire 9 may be located on a second side 25b of the lower structure 25 that is substantially opposite to the first side 25a of the lower structure 25 such that the second outer bus wire 9 is adjacent to a second side 500b of the emission area 500. The second outer bus wire 9 may extend in the horizontal direction HD.

According to a non-limiting example embodiment, when a boundary of an emission zone is not located inside a boundary of a pixel circuit zone, the second outer bus wire 9 may at least partially overlap at least one of the emission zone and the lower electrode 20 while being located outside a boundary of the pixel circuit area so that the area of the emission area 300 shown in FIG. 30 or the area of the emission area 500 shown in FIG. 31 may be efficiently widened while disposing the second outer bus wire 9 as close to the pixel circuit area as possible.

The second outer bus wire 9 may include a first portion 9a to which a first group G1 having a plurality of first wires 2 is connected, and a second portion 9b to which a second group G2 having a plurality of first wires 2 is connected. A third group G3 having a plurality of first wires 2 may be located between the first group G1 and the second group G2.

The second end 2e-2 of the first wires 2 included in the third group G3 may face the light transmitting region 610. The third group G3 may be not connected to the second outer bus wire 9. Thus, a spatial margin may be secured at the periphery of the light transmitting region 610 such that the degrees of freedom in design may be enhanced while reducing signal interference due to a plurality of wires.

The light transmitting region 610 may be formed substantially closer to the second outer bus wire 9 than to the first outer bus wire 8 to which the terminal wires 1 are connected. In addition, the light transmitting region 610 may be located at substantially the same distance from the first outer bus wire 8 to which the terminal wires 1 are connected and the second outer bus wire 9. Thus, an initial driving current may be evenly supplied to the entire area of the first side 500a of the emission area 500.

A distance from the transmitting region 610 to a terminal wire 1a is substantially the same as a distance from the transmitting region 610 to a terminal wire 1b. Thus, the driving current may be prevented from being unevenly supplied within the driving current supply structure due to the light transmitting region 610. According to a non-limiting example embodiment, another terminal wire 1c may be included in addition to the terminal wire 1a and the terminal wire 1b. The terminal wire 1c may be omitted, and the light transmitting region 610 may be formed on a central axis of the electroluminescent device, extending in the vertical direction VD.

According to a non-limiting example embodiment, the terminal wires 1 may be connected to the second outer bus wire 9 that is substantially closer to the light transmitting region 610 than the first outer bus wire 8. In this case, the initial driving current may be supplied in a relatively short time along a second direction D2 to electroluminescent units adjacent to the light transmitting region 610. Accordingly, an image quality failure due to a current supply delay that may occur due to the light transmitting region 610 may be reduced at the periphery of the light transmitting region 610.

According to a non-limiting example embodiment, the electroluminescent device may be formed on a polymer layer formed on a carrier glass substrate. Adherence between the carrier glass substrate and the polymer layer may be weakened by laser beam irradiation and the like such that they may be detached from each other. In this case, the detachment may occur along the first direction from the first side 25a of the lower structure 25, and, thus, the second side 25b of the lower structure 25 may be detached at the end. According to a non-limiting example embodiment, damage or erroneous detachment at the periphery of the light transmitting region 610, which may occur when the detachment occurs from the second side 25b of the lower structure 25, which is the closest to the light transmitting region 610, may be reduced. Such a detachment method may be employed in the above-described electroluminescent device of FIG. 1, FIG. 22, and FIG. 28, or an electroluminescent device to be described in FIG. 41, FIG. 45, and FIG. 52.

Figure 33:
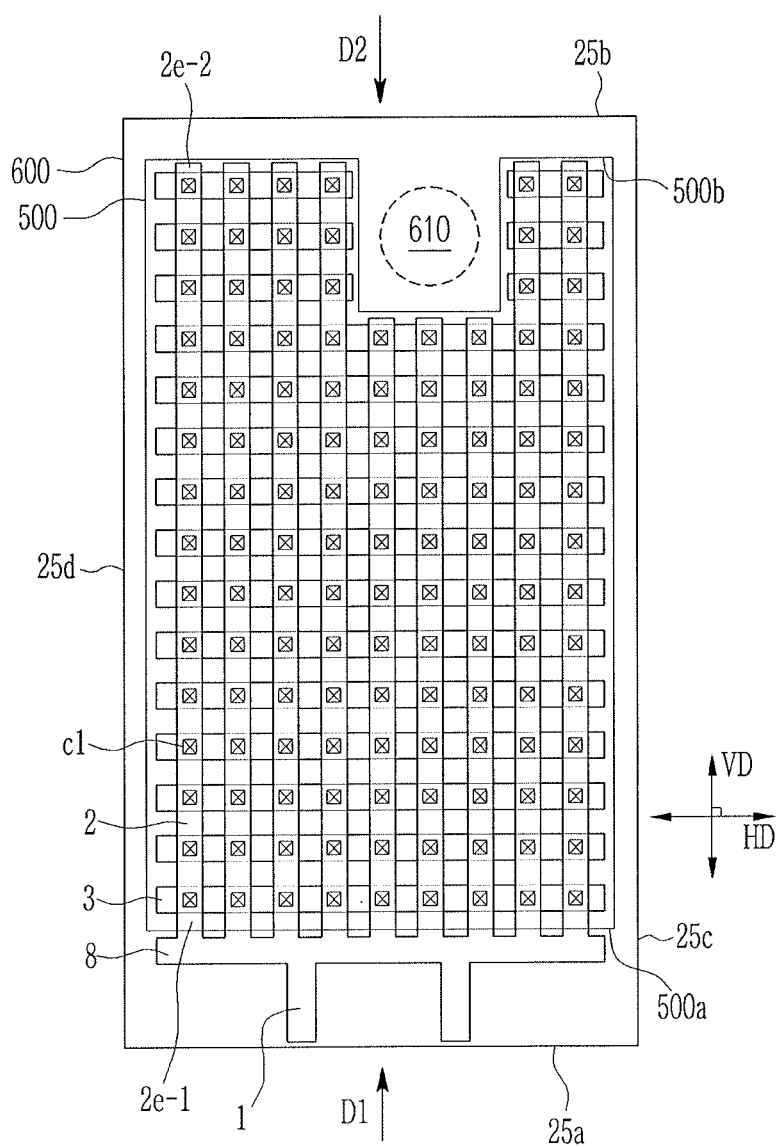
FIG. 33 illustrates a driving current supply structure included in the electroluminescent device shown in FIG. 30 or FIG. 31, according to a non-limiting example embodiment.

FIG. 33 shows a driving current supply structure included in the electroluminescent device shown in FIG. 30 or FIG. 31, according to a non-limiting example embodiment.

Referring to FIG. 33, the second outer bus wire 9 including the first portion 9a and the second portion 9b shown in FIG. 32 is omitted. However, other circuit configurations may be designed in the portion where the second outer bus wire 9 is omitted, thereby increasing the degrees of freedom in circuit design.

Figure 34:
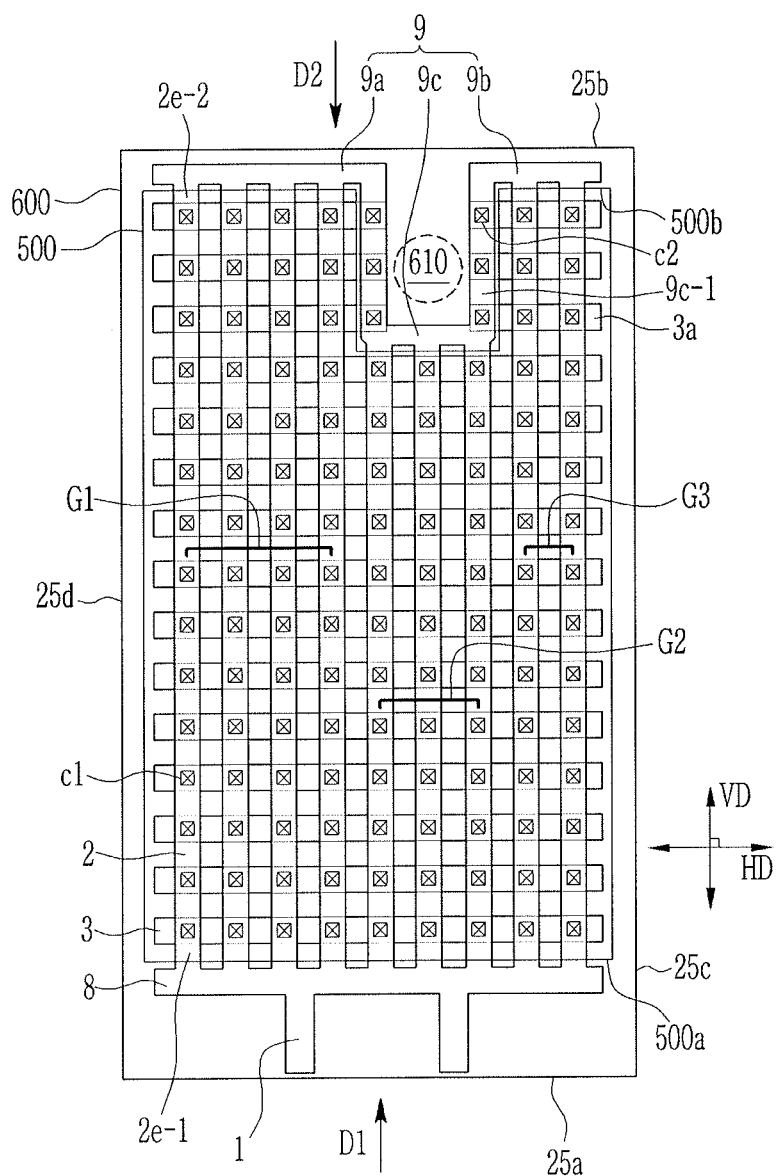
FIG. 34 illustrates a driving current supply structure included in the electroluminescent device shown in FIG. 30 or FIG. 31, according to a non-limiting example embodiment.

FIG. 34 shows a driving current supply structure included in the electroluminescent device shown in FIG. 30 or FIG. 31, according to a non-limiting example embodiment.

Referring to FIG. 34, the outer bus wire 9 shown in FIG. 32 may further include a third portion 9c connected to a plurality of first wires 2 included in a third group G3. The third portion 9c may overlap the outer non-emission area 600, and may be located between the light transmitting region 610 and the emission area 500. The third portion 9c may include an extension portion 9c-1 that extends in a vertical direction VD. The extension portion 9c-1 and a second wire 3a may be connected to each other through contacts c2 such that a current from the extension portion 9c-1 may be quickly and directly supplied to the second wire 3a. In another implementation, the second wire 3a may not be connected to the extension portion 9c-1 such that the width of the extension portion 9c-1 may be reduced.

Here, the first portion 9a, the second portion 9b, and the third portion 9c may be integrally formed as one-piece. In another implementation, the first portion 9a and the second portion 9b may be formed by substantially the same process, and the third portion 9c may be another layer connected to the first and second portions 9a and 9b through contacts.

When the terminal wires 1 are connected to the second outer bus wires 9 located on the second side 25b of the lower structure 25, at least one of the terminal wires 1 may be connected to the third portion 9c.

Figure 35:
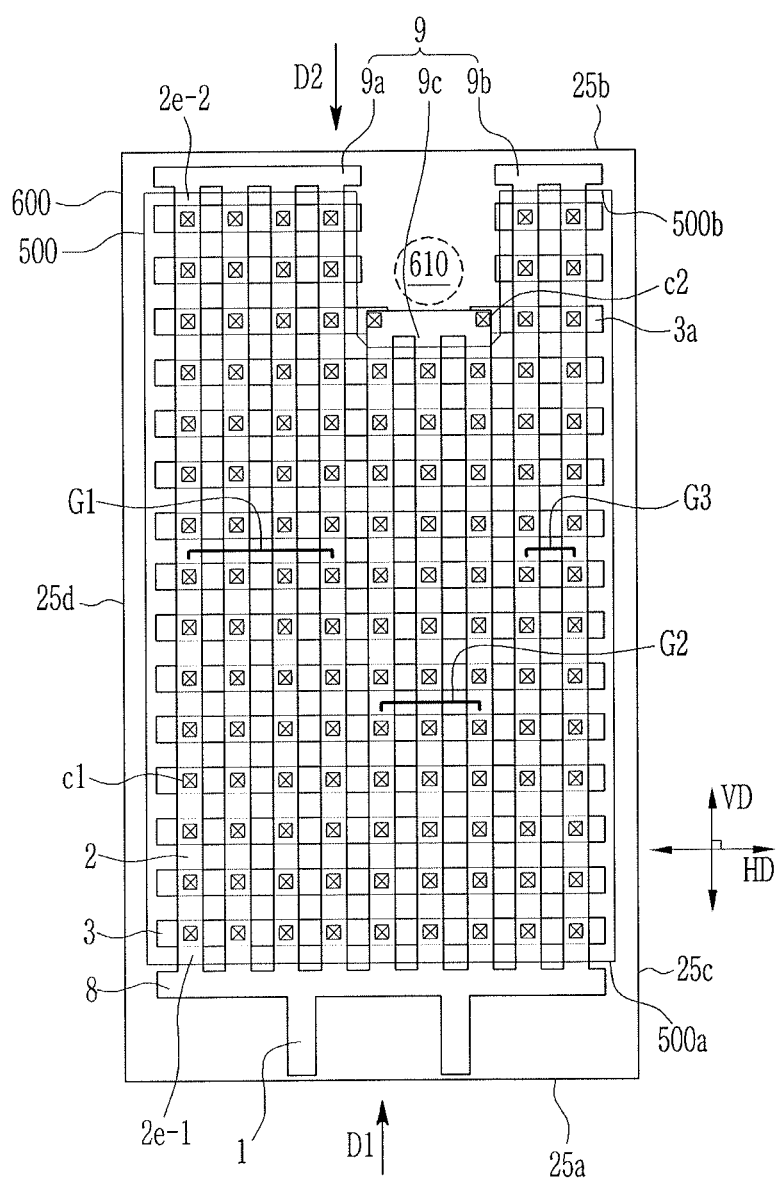
FIG. 35 illustrates a driving current supply structure included in the electroluminescent device shown in FIG. 30 or FIG. 31, according to a non-limiting example embodiment.

FIG. 35 shows a driving current supply structure included in the electroluminescent device shown in FIG. 30 or FIG. 31, according to a non-limiting example embodiment.

Referring to FIG. 35, the third portion 9c of the second outer bus wire 9 may be spaced apart from the first portion 9a and the second portion 9b. The third portion 9c may be connected to the second wire 3a, but this is not restrictive.

Figure 36:
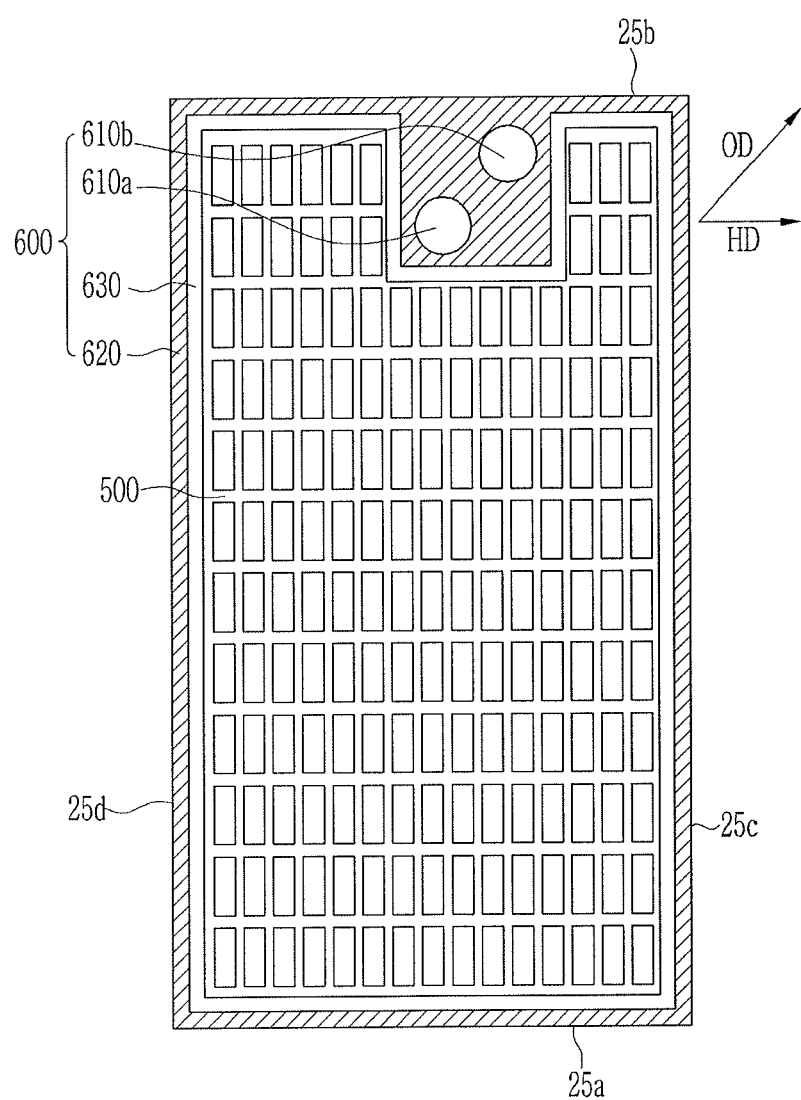
FIG. 36 illustrates a top plan view of an electroluminescent device according to a non-limiting example embodiment.
Figure 37:
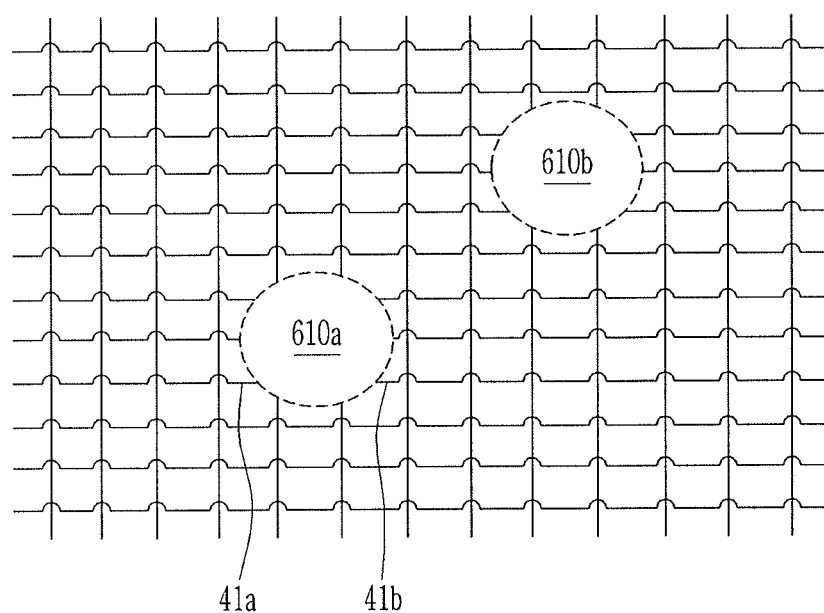
FIG. 37 illustrates a schematic diagram of wires in a first light transmitting region and a second light transmitting region of FIG. 36, according to a non-limiting example embodiment.

FIG. 36 is a top plan view of an electroluminescent device according to a non-limiting example embodiment. FIG. 37 is a schematic diagram of wires in a first light transmitting region 610a and a second light transmitting region 610b of FIG. 36, according to a non-limiting example embodiment.

Referring to FIG. 36 and FIG. 33, an electroluminescent device may include an emission area 500 and an outer non-emission area 600. The outer non-emission area 600 may include an outer inorganic surface portion 620 that surrounds the emission area 500, an outer buffer area 630 that is located between the emission area 500 and the outer inorganic surface portion 620, a first light transmitting region 610a, and a second light transmitting region 610b. The first light transmitting region 610a and the second light transmitting region 610b may be surrounded by the outer inorganic surface portion 620 and may be partially surrounded by the emission area 500.

Aspects of the present non-limiting example embodiment having a plurality of light transmitting regions may be employed in non-limiting example embodiments shown in FIG. 1, FIG. 22, FIG. 28, FIG. 30, and FIG. 31.

The first light transmitting region 610a may have a hole, and the second light transmitting region 610b may also have a hole. When a direction in which the first wire 41a or the second wire 41b extends is called a horizontal direction HD, the second light transmitting region 610b may be spaced apart from the first light transmitting region 610a in an oblique direction OD. Therefore, pixels at the periphery of the first and second light transmitting regions 610a and 610b may efficiently receive a signal from at least one of the left and right directions in a plan view and at least one of the top and bottom directions in a plan view.

Figure 38:
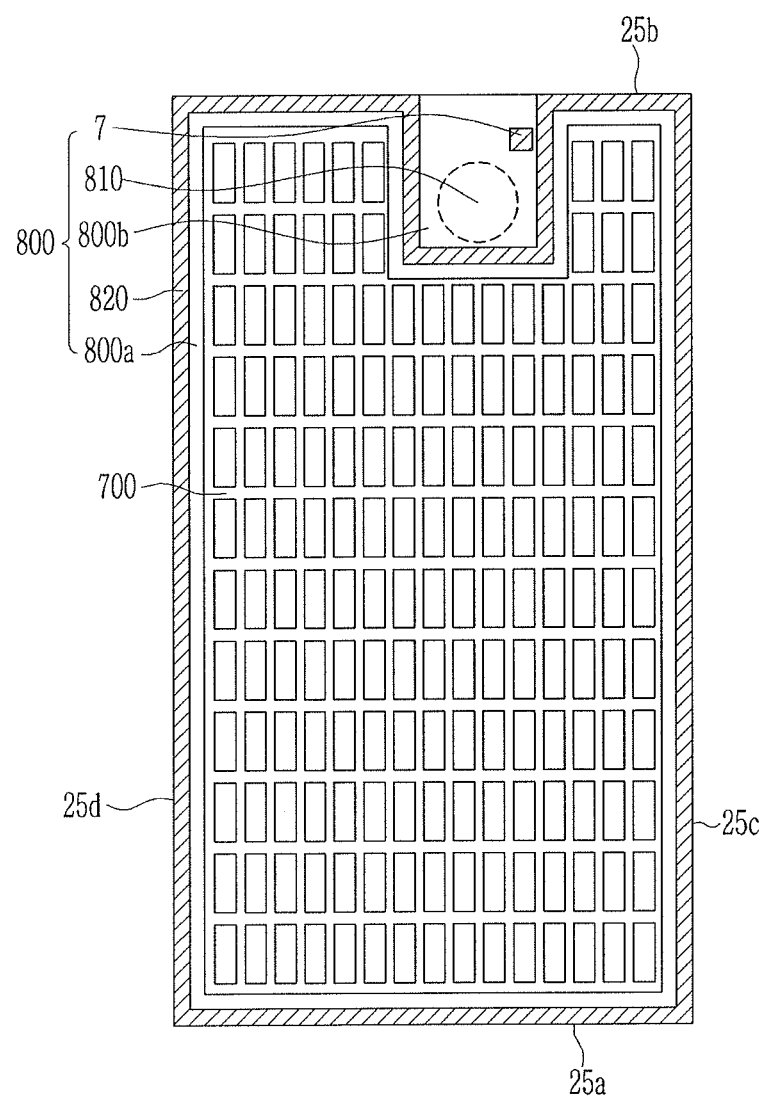
FIG. 38 illustrates a top plan view of an electroluminescent device according to a non-limiting example embodiment.

FIG. 38 is a top plan view of an electroluminescent device according to a non-limiting example embodiment.

Referring to FIG. 38, a lower structure 25 may include an emission area 700 and an outer non-emission area 800. The outer non-emission area 800 may include an outer inorganic surface portion 820 that surrounds the emission area 700, a first outer buffer area 800a that is located between the emission area 700 and the outer inorganic surface portion 820, a second outer buffer area 800b that is located outside the outer inorganic surface portion 820 and is partially surrounded by the emission area 700, a light transmitting region 810 that is surrounded by the outer inorganic surface portion 820 and is partially surrounded by the emission area 700, and an inorganic surface island 7 that is surrounded by the second outer buffer area 800b.

The light transmitting region 810 may have higher light transmittance than the emission area 700 or the second outer buffer area 800b. The light transmitting region 810 may include a hole. In another implementation, the light transmitting region 810 may have a non-hole structure.

When a surface of the second outer buffer area 800b is only surrounded by an organic material, the inorganic surface island 7 may be surrounded by the second outer buffer area 800b. The inorganic surface island 7 may be at least a portion of a surface of an antistatic structure, at least a portion of a surface of a lighting circuit structure, contact pads of a test circuit, and the like. In another implementation, the inorganic surface island 7 may be omitted.

A surface of at least one of at least a part of the first wire 41a, at least a part of the second wire 41b, and at least a part of the connection member 43 shown in FIG. 4 to FIG. 7 may be included in the outer inorganic surface portion 820 shown in FIG. 38. In another implementation, a surface of at least one of at least a part of the first wire 41a, at least a part of the second wire 41b, and at least a part of the connection member 43 shown in FIG. 4 to FIG. 7 may be located under the outer inorganic surface portion 820 shown in FIG. 38.

Figure 39:
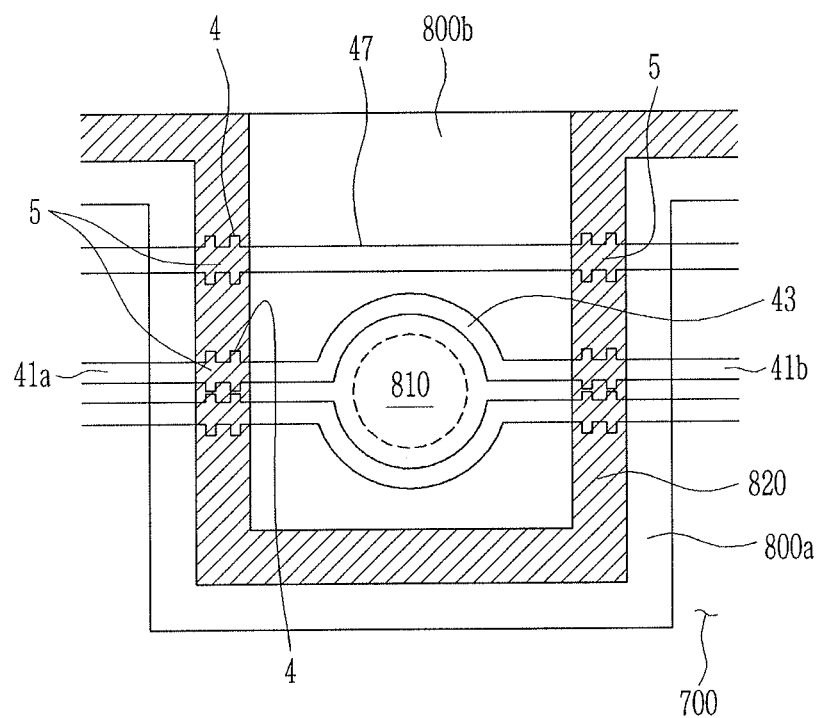
FIG. 39 illustrates a schematic diagram of a wiring structure in the electroluminescent device shown in FIG. 38, according to a non-limiting example embodiment.

FIG. 39 is a schematic diagram of a wiring structure in the electroluminescent device shown in FIG. 38, according to a non-limiting example embodiment.

Referring to FIG. 39, one connection member 43 bypasses the light transmitting region 810 along a top side of the light transmitting region 810. The other connection member 43 bypasses the light transmitting region 810 along a bottom side of the light transmitting region 810. A direction along which a sixth wire 47 extends does not pass through the light transmitting region 810 and, thus, the sixth wire 47 may not have a structure like the connection member 43. A first wire 41a, a second wire 41b, and the sixth wire 47 may have protrusions and recesses 4 that are located at side walls of passing portions 5 that pass through the outer inorganic surface portion 820. The length of a moisture and oxygen permeation path may extend due to the protrusions and recesses 4. Here, the passing portions 5 may be included in the outer inorganic surface portion 820 or may be located under the outer inorganic surface portion 820.

The protrusions and recesses 4 according to the present non-limiting example embodiment may be employed to the electroluminescent device shown in FIG. 31 and FIG. 32. In addition, the protrusions and recesses 4 according to a non-limiting example embodiment may be applied to the connection members 43d, 43e, and 43f of FIG. 24, the connection members 43d and 43e of FIG. 25, the connection members 43d, 43e, and 43f of FIG. 26, the connection members 43d and 43e of FIG. 27, and the connection members 43a, 43b-1, and 43b-2 of FIG. 29.

Referring back to FIG. 39, the sixth wire 47 may sequentially pass through the first outer buffer area 800a, the outer inorganic surface portion 820, the second outer buffer area 800b, the outer inorganic surface portion 820, and the first outer buffer area 800a such that the sixth wire 47 may have two passing portions 5. Alternatively, the sixth wire 47 may have a single passing portion 5 when the sixth wire 47 sequentially passes through the first outer buffer area 800a, and the outer inorganic surface portion 820, and, then, is connected to a driver and the like in the second outer buffer area 800b.

Figure 40:
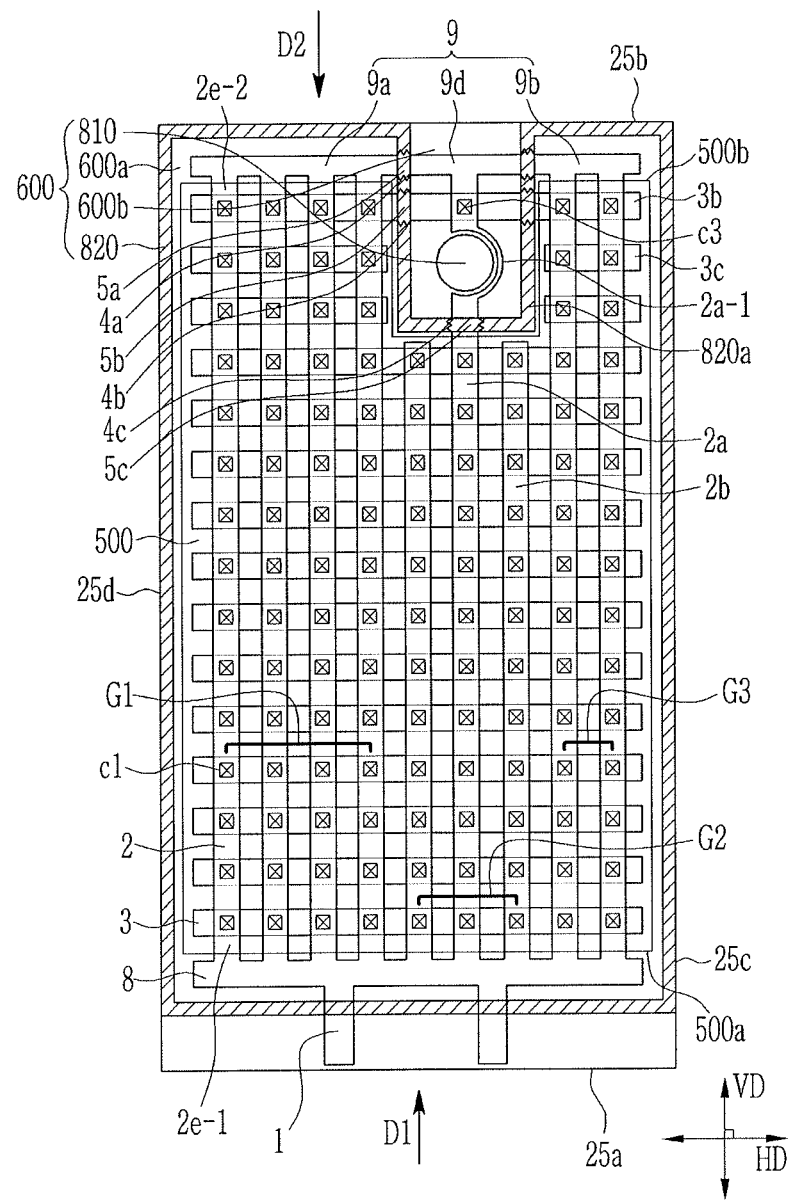
FIG. 40 illustrates a driving current supply structure included in the electroluminescent device shown in FIG. 38, according to a non-limiting example embodiment.

FIG. 40 shows a driving current supply structure included in the electroluminescent device shown in FIG. 38, according to a non-limiting example embodiment.

Referring to FIG. 40, the lower structure 25 may include an emission area 500 and an outer non-emission area 600. The outer non-emission area 600 may include an outer inorganic surface portion 820 that surrounds the emission area 500, a first outer buffer area 600a that is located between the outer inorganic surface portion 820 and the emission area 500, a second outer buffer area 600b that is located outside the outer inorganic surface portion 820 and partially surrounded by the emission area 500, and a light transmitting region 810 that is surrounded by the second outer buffer area 600b and partially surrounded by the emission area 500. The light transmitting region 810 may have a hole.

The outer inorganic surface portion 820 may include an extension portion 820a that extends between the emission area 500 and the light transmitting region 810. The light transmitting region 810 is partially surrounded by the outer inorganic surface portion 820.

First and second portions 9a and 9b of the second outer bus wire 9 may be connected to each other by a third portion 9d. The second outer bus wire 9 may extend in a first direction D1 such that a second outer bus wire 9 sequentially passes an outer inorganic surface portion 820, a second outer buffer area 600b, and the outer inorganic surface portion 820.

A side face of a passing portion 5a of the second outer bus wire 9, passing through the outer inorganic surface portion 820, may have protrusions and recesses 4a. In addition, the passing portion 5a of the second outer bus wire 9 may be included in the outer inorganic surface portion 820 or may be located under the outer inorganic surface portion 820.

A first wire 2a included in a second group G2 may extend in a second direction D2 such that the first wire 2a sequentially passes through the emission area 500, the first outer buffer area 600a, the outer inorganic surface portion 820, and the second outer buffer area 600b. The first wire 2a may be connected to the third portion 9d of the second outer bus wire 9 in the second outer buffer area 600b. A side face of a passing portion 5c that passes through the outer inorganic surface portion 820 of the first wire 2a may have protrusions and recesses 4c. In addition, the passing portion 5c of the first wire 2a may be included in the outer inorganic surface portion 820 or may be located under the outer inorganic surface portion 820. The first wire 2a may have a bypass portion 2a-1 that bypasses the light transmitting region 810. In another implementation, when a direction in which the first wire 2a extends does not pass through the light transmitting region 810, a bypass portion is not required. In this case, a structure like the bypass portion 2a-1 may be omitted.

Unlike the first wire 2a, a first wire 2b included in the second group G2 may not pass through the outer inorganic surface portion 820, and may not be connected to the third portion 9d of the second outer bus wire. The second group G2 may include only the first wires 2a. In another implementation, the second group G2 may include only the first wires 2b. In another implementation, the second group G2 may include both the first wire 2a and the first wire 2b.

A second wire 3b may extend in the first direction D1 such that the second wire 3b sequentially passes through the first outer buffer area 600a, the outer inorganic surface portion 820, the second outer buffer area 600b, the outer inorganic surface portion 820, and the first outer buffer area 600a. Here, a side wall of a passing portion 5b that passes through the outer inorganic surface portion 820 of the second wire 3b may have protrusions and recesses 4b. In addition, the passing portions 5b of the second wire 3b may be included in the outer inorganic surface portion 820 or may be located under the inorganic surface portion 820.

The first wire 2a and the second wire 3b may be connected to each other in the second outer buffer layer 600b by a contact c3.

Unlike the second wire 3b, a second wire 3c may not pass through the outer inorganic surface portion 820. The lower structure 25 may include only the second wire 3b. In another implementation, the lower structure 25 may include only the second wire 3c. In another implementation, the lower structure 25 may include both the second wire 3b and the second wire 3c.

Figure 41:
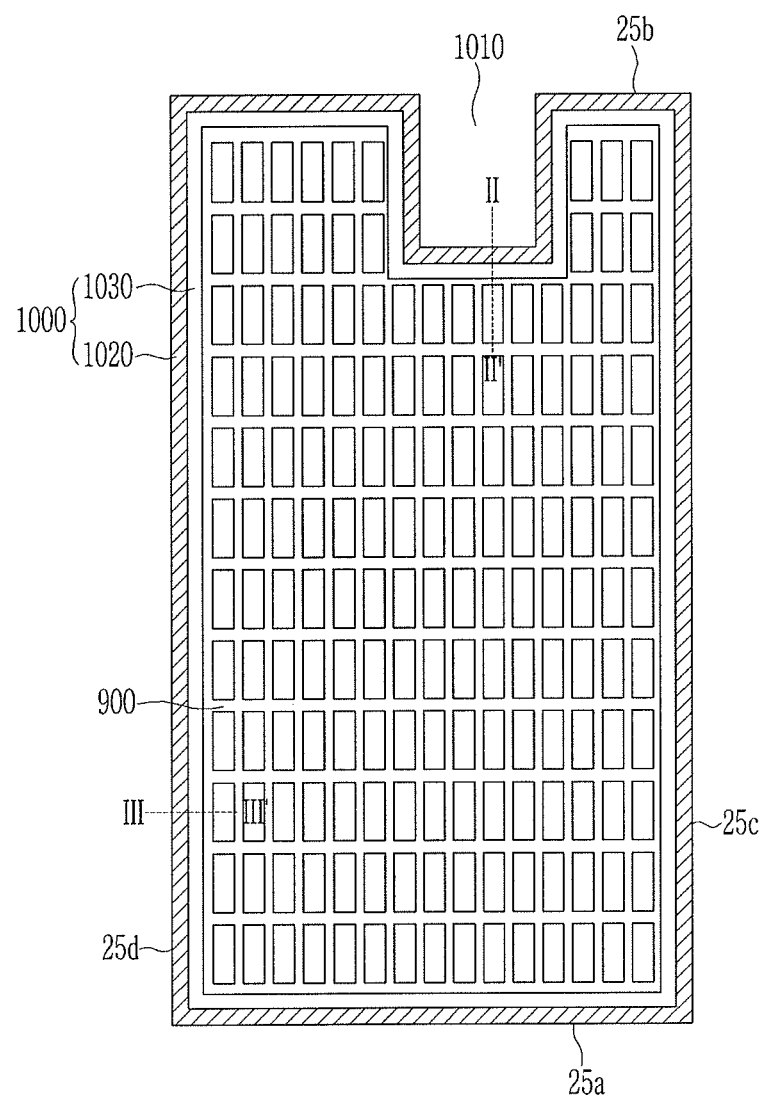
FIG. 41 illustrates a top plan view of an electroluminescent device according to a non-limiting example embodiment.

FIG. 41 is a top plan view of an electroluminescent device according to a non-limiting example embodiment.

Referring to FIG. 41, a lower structure 25 may include an emission area 900 and an outer non-emission area 1000. The outer non-emission area 1000 may include an outer inorganic surface portion 1020 that surrounds the emission area 900, and an outer buffer area 1030 that is located between the emission area 900 and the outer inorganic surface portion 1020. A notch 1010 may be used as a window and may be recessed inward at one side of the lower structure 25. One side of the emission area 900 may be formed along the notch 1010. That is, one side of the emission area 900 may substantially conform to the notch 1010.

An encapsulation structure (refer to 31 of FIG. 2) included in a non-limiting example embodiment of FIG. 41 may be provided as a multilayer having flexibility. In another implementation, the encapsulation structure may be a rigid encapsulation structure having an inorganic sealant and an inorganic glass substrate. In the electroluminescent device shown in FIG. 22, the encapsulation structure 31 may be a flexible multilayer, which may be more advantageous than a rigid encapsulation structure. In an implementation, in the electroluminescent device of FIG. 41, the notch 1010 is provided at one side of the lower structure 25 so that the emission area 900 may not be damaged during a process for forming the inorganic sealant at the periphery of the notch 1010 and, then, irradiating a laser to the inorganic sealant or a process for removing an area corresponding to the notch 1010 in the inorganic glass substrate by using a laser and the like. Accordingly, the rigid encapsulation structure may be efficiently adopted in the electroluminescent device of FIG. 41.

Figure 42:
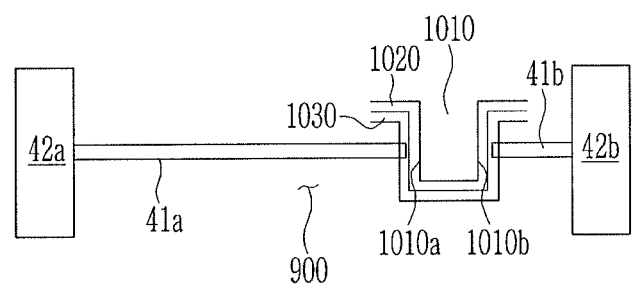
FIG. 42 illustrates signal wiring in the electroluminescent device shown in FIG. 41, according to a non-limiting example embodiment.

FIG. 42 shows signal wiring in the electroluminescent device shown in FIG. 41 according to a non-limiting example embodiment.

Referring to FIG. 42, the notch 1010 may serve as the light transmitting region in the previous non-limiting example embodiments. For example, the lower structure 25 may include a first wire 41a that extends in a direction toward a first side 1010a of the notch 1010 from the emission area 900 and a second wire 41b that extends in a direction away from a second side 1010*b* that faces the first side 1010*a* of the notch 1010 toward the emission area 900. The notch 1010 may be located between the first and second wires 41*a* and 41*b*. The first wire 41*a* and the second wire 41*b* may be located on substantially the same layer. A surface of at least one of at least a part of the first wire 41*a* and at least a part of the second wire 41*b* may be used as the outer inorganic surface portion 1020.

According to a non-limiting example embodiment, a first driver 42*a* and a second driver 42*b* may be a first data driver and a second data driver, respectively, and, the first and second wires 41*a* and 41*b* may be first and second data wires, respectively, that supply a data signal to a source area of a transistor included in each pixel circuit. In this case, the first data driver may be located on a first side of the lower structure 25 and the second driver may be located on a second side that is substantially different from the first side of the lower structure 25. Here, the first side and the second side may be substantially opposite to each other.

The wire structures shown in FIG. 4 to FIG. 7 may be employed to the electroluminescent device of FIG. 41. According to a non-limiting example embodiment, the notch 1010 may be located on a third side 25*c*, which is a long side of the lower structure 25, and a data wire extending along a direction in which the long side of the lower structure 25 extends may extend while circumventing the notch 1010. A surface of at least one of at least a part of the first wire 41*a*, at least a part of the second wire 41*b*, and at least a part of the connection member 43 shown in FIG. 4 to FIG. 7 may be included in the outer inorganic surface portion 1020 shown in FIG. 41. In another implementation, a surface of at least one of at least a part of the first wire 41*a*, at least a part of the second wire 41*b*, and at least a part of the connection member 43 shown in FIG. 4 to FIG. 7 may be located under the outer inorganic surface portion 1020 shown in FIG. 41.

The touch panels shown in FIG. 12 to FIG. 20 may be employed to the electroluminescent device of FIG. 41. According to a non-limiting example embodiment, the first sensing electrode 51*a*-1 and the dummy electrode 53*a* of FIG. 12, the first sensing electrode 51*a*-4 or the second sensing electrode 52*a*-4 of FIG. 15, the sensing electrode 54*a*-1 of FIG. 16, and the upper dummy electrode 63*a*, the lower dummy electrode 83*a*, the vertical sensing area 70*a*, the lower horizontal sensing electrode 82*a*, and the upper horizontal sensing electrode 62*a* of FIG. 19 may not overlap the outer inorganic surface portion 1020 of FIG. 41. According to a non-limiting example embodiment, the first connection member 51*d* and second connection member 52*d* of FIG. 13 may overlap the outer non-emission area 1000 of FIG. 41.

Figure 43:
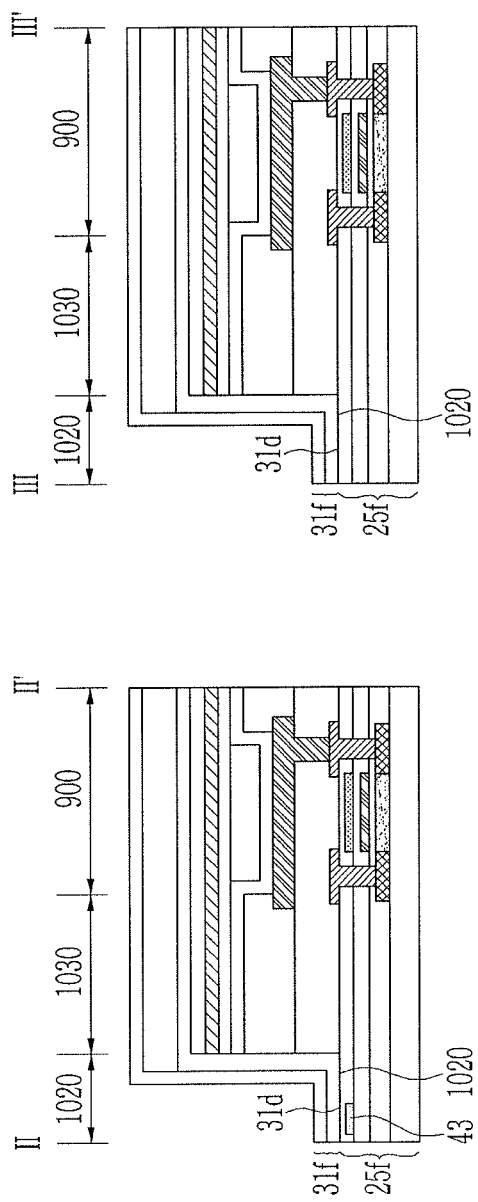
FIG. 43 illustrates cross-sectional view taken along the lines II-II' and III-III' in FIG. 41, according to a non-limiting example embodiment.

FIG. 43 is cross-sectional view taken along the lines II-II' and III-III' in FIG. 41, according to a non-limiting example embodiment.

Referring to FIG. 43, the connection member 43 may be located under the outer inorganic surface portion 1020. Thus, when a plurality of connection members 43 are used, an area that the plurality of connection members 43 occupy may be located under the outer inorganic surface portion 1020 to enhance the degrees of freedom on design of the emission area 900 while minimizing signal interference due to the plurality of connection members 43, which may occur in the emission area 900. In another implementation, the connection member 43 may be included in the outer inorganic surface portion 1020.

Referring to the cross-section taken along the line II-II' in FIG. 43 and the cross-section taken along the line III-III' in FIG. 43, the side face 25*f* of the lower structure 25 is located on a plane on which the side face 31*f* of the encapsulation structure 31 is located. This means that, when a portion near the line II-II' in FIG. 43 and a portion near the line III-III' in FIG. 43 are formed, the side face 25*f* of the lower structure 25 and the side face 31*f* of the encapsulation structure 31 may be etched through substantially the same process by using laser etching or an etching solution.

Figure 44:
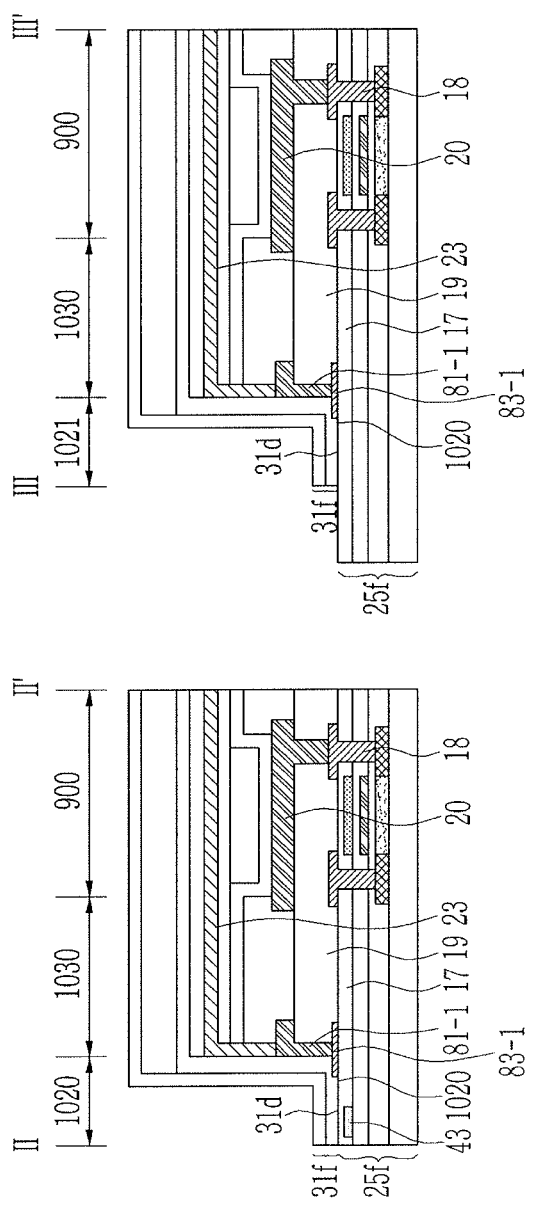
FIG. 44 illustrates a cross-sectional view taken along the lines II-II' and III-III' in FIG. 41, according to a non-limiting example embodiment.

FIG. 44 is a cross-sectional view taken along the lines II-II' and III-III' in FIG. 41, according to a non-limiting example embodiment.

Referring to FIG. 44, in the cross-section taken along the line II-II' in FIG. 44, the side face 25*f* of the lower structure 25 and the side face 31*f* of the encapsulation structure 31 are located on substantially the same plane. However, in the cross-section taken along the line III-III' in FIG. 44, the side face 31*f* of the encapsulation structure 31 may be located further inside than the side face 25*f* of the lower structure 25, for example, because an opened outer inorganic surface portion 1021 that is not covered by the encapsulation structure 31 may be provided. This means that, when a portion near the line II-II' in FIG. 44 is formed, the side face 25*f* of the lower structure 25 and the side face 31*f* of the encapsulation structure 31 may be etched through substantially the same process by using laser etching or an etching solution but other portions may not be simultaneously etched through substantially the same process.

An outer lower connection wire 83-1 that substantially surrounds the emission area 900 may be located on an interlayer insulation layer 17. The outer lower connection wire 83-1 may be formed together with a source/drain electrode 18 through substantially the same process. An outer upper connection wire 81-1 may be located on a planarization layer 19, and may make a contact with an upper electrode 23 and the outer lower connection wire 83-1. The outer upper connection wire 81-1 may be formed by substantially the same process of forming the lower electrode 20. The outer lower connection wire 83-1 may have a shape that substantially surrounds the emission area 900. When the upper electrode 23 is a cathode, electrons may be sequentially transmitted to the upper electrode 23 through the outer lower connection wire 83-1 and the outer upper connection wire 81-1. The outer lower connection wire 83-1 may be electrically connected to a power source that is located outside the electroluminescent device.

According to a non-limiting example embodiment, in the cross-section taken along the line III-III' in FIG. 44, the outer upper connection wire 81-1 may be omitted and the upper electrode 23 may make a contact with the outer lower connection wire 83-1. According to another non-limiting example embodiment, in the cross-section taken along the line III-III' in FIG. 44, the outer lower connection wire 83-1 may be omitted. According to another non-limiting example embodiment, in the cross-section taken along the line III-III' in FIG. 44, the outer lower connection wire 83-1 and the outer upper connection wire 81-1 may be omitted.

The electroluminescent device shown in FIG. 41 may include the driving current supply structure shown in FIG. 32, FIG. 33, FIG. 34, and FIG. 35.

Figure 45:
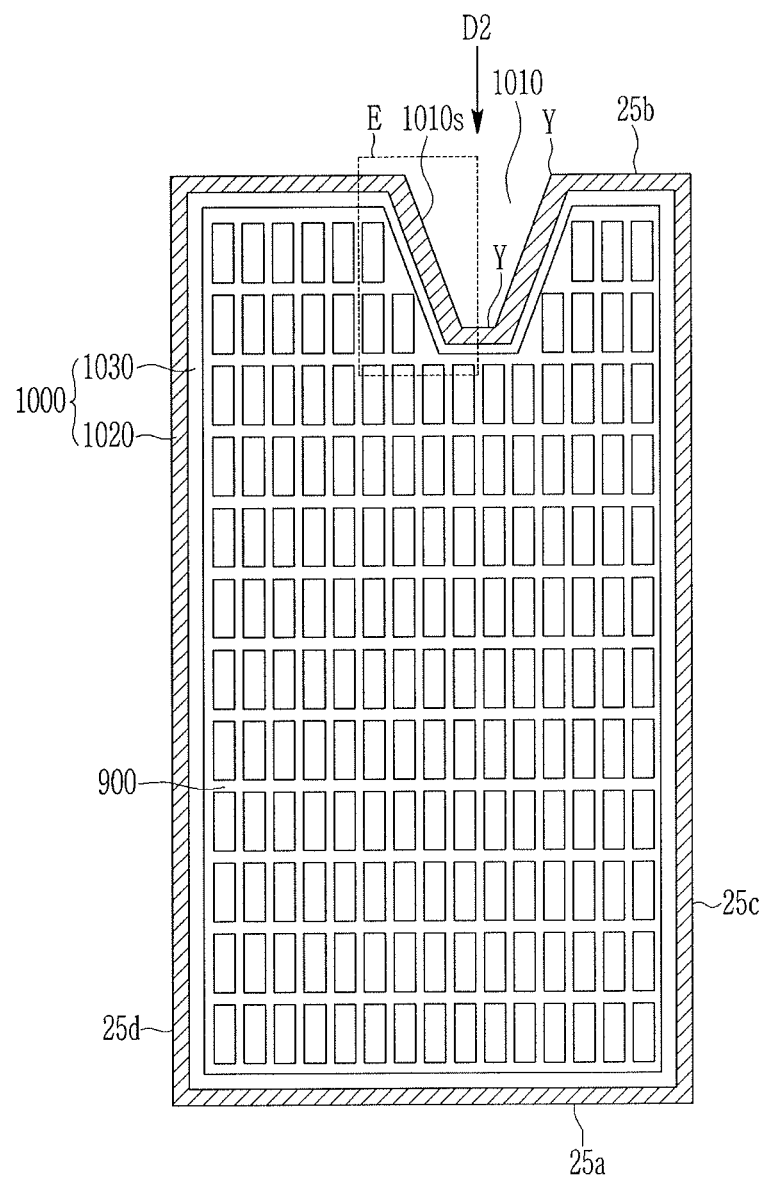
FIG. 45 illustrates a top plan view of an electroluminescent device according to a non-limiting example embodiment.

FIG. 45 is a top plan view of an electroluminescent device according to a non-limiting example embodiment.

Referring to FIG. 45, a notch 1010 that is recessed inward in a second direction D2 may have sloped side faces 1010*s*. The notch 1010 may have the sloped side faces 1010*s*. Thus, an angular portion Y of the notch 1010 may be realized as an obtuse angle rather than a right angle or an acute angle so that a process failure that may occur while the angular portion Y is formed or a progressive failure that may occur due to the angular portion Y may be reduced. The sloped side faces 1010s may be, for example, straight-lined or may be at least partially curved.

The touch panels shown in FIG. 12 to FIG. 20 may be employed to the electroluminescent device shown in FIG. 45. According to a non-limiting example embodiment, the first sensing electrode 51a-1 of FIG. 12, the first sensing electrode 51a-4 or the second sensing electrode 52a-4 of FIG. 15, the sensing electrode 54a-1 of FIG. 16, and the upper dummy electrode 63a, the lower dummy electrode 83a, the vertical sensing area 70a, the lower horizontal sensing electrode 82a, and the upper horizontal sensing electrode 62a of FIG. 19 may not overlap the outer inorganic surface portion 1020 of FIG. 45. According to a non-limiting example embodiment, the first connection member 51d and the second connection member 52d of FIG. 13 may overlap the outer non-emission area 1000 of FIG. 45.

Figure 46:
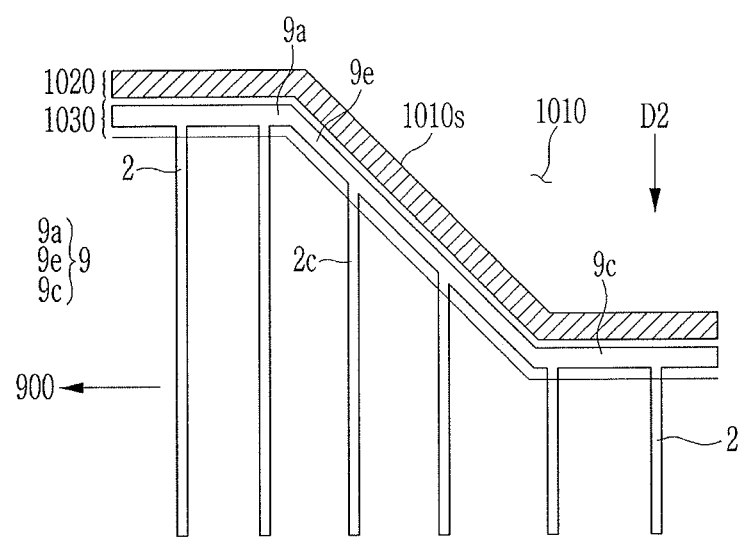
FIG. 46 illustrates the driving current supply structure included in the area E of FIG. 45 according to a non-limiting example embodiment.

FIG. 46 shows the driving current supply structure included in the area E of FIG. 45 according to a non-limiting example embodiment.

Referring to FIG. 46, a sloped portion 9e may be located between a first portion 9a and a third portion 9c of a second outer bus wire 9. The sloped portion 9e may have a shape of a sloped bar with respect to the first portion 9a and the third portion 9c. The sloped portion 9e may be, for example, straight-lined or may be partially curved. A first wire 2c may be connected to the sloped portion 9e, and first wires 2 may be connected to the first portion 9a and the third portion 9c. The second outer bus wire 9 and the first wire 2c may be integrally formed as one-piece. The first wires 2c may extend in the second direction D2 while overlapping the emission area 900.

According to a non-limiting example embodiment, when an outer edge of an emission zone is not located inside an edge of a pixel circuit zone, the second outer bus wire 9 may at least partially overlap at least one of the emission zone and the lower electrode (refer to reference numeral 20 in FIG. 2) while being located outside the edge of the pixel circuit area so that the area of the emission area 900 may be widened while disposing the second outer bus wire 9 as relatively close to the pixel circuit area as possible.

Figure 47:
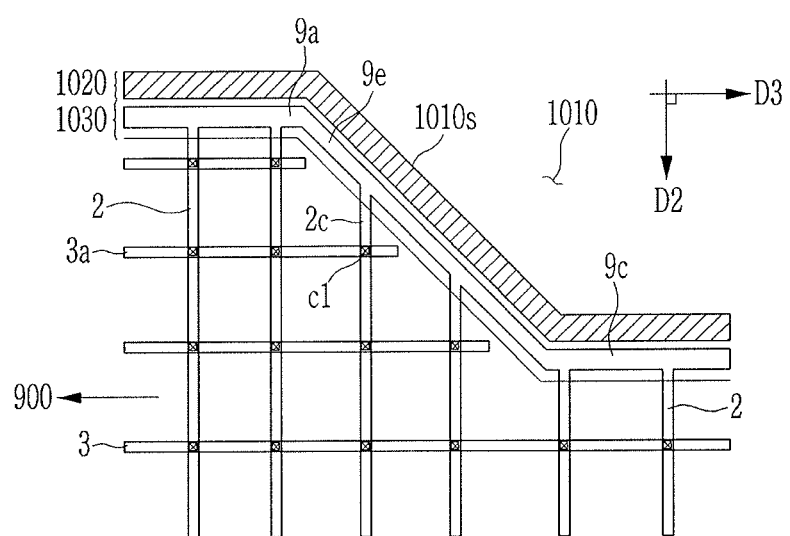
FIG. 47 illustrates the driving current supply structure included in the area E of FIG. 45 according to a non-limiting example embodiment.

FIG. 47 shows the driving current supply structure included in the area E of FIG. 45 according to a non-limiting example embodiment.

Referring to FIG. 47, the driving current supply structure may include a second wire 3a that extends in a third direction D3 that is substantially perpendicular to the second direction D2. The second wire 3a may not extend to the outer buffer area 1030. Thus, the second wire 3a may not be connected to the sloped portion 9e. The second wire 3a may be located on a layer that is substantially different from a layer on which the first wires 2 and 2c are disposed, and may be connected to the first wires 2 and 2c through the contacts c1. The first wires 2 and 2c and the second wire 3a may overlap the emission area 900. In addition, the second wire 3a may be used as an electrode included in a capacitor of a pixel circuit. For example, the second wire 3a may be commonly used as an electrode of a capacitor included in a first pixel circuit and an electrode of a capacitor included in a second pixel circuit that is adjacent to the first pixel circuit. The second wire 3a may be used as an electrode included in a capacitor of a pixel circuit. Thus, an additional process for forming the electrode included in the capacitor of the pixel circuit may be avoided, thereby increasing integration of the pixel circuit.

The second wire 3a may not be connected to the sloped portion 9e. Thus, a portion for connection with the second wire 3a may not be formed in the sloped portion 9e. Accordingly, the width of the sloped portion 9e may be relatively narrowed so that the degrees of freedom of wiring design and the degrees of freedom of peripheral circuit design may be enhanced in the outer inorganic surface portion 1020 and the outer buffer area 1030.

In addition, the second wire 3a may not extend to the outer buffer area 1030. Thus, a signal interference problem between the second wire 3a and a peripheral circuit structure that may be formed in the outer buffer area 1030 in the outer buffer area 1030 may be reduced. Examples of the peripheral circuit may include a lighting circuit, an anti-static circuit, and the like.

Figure 48:
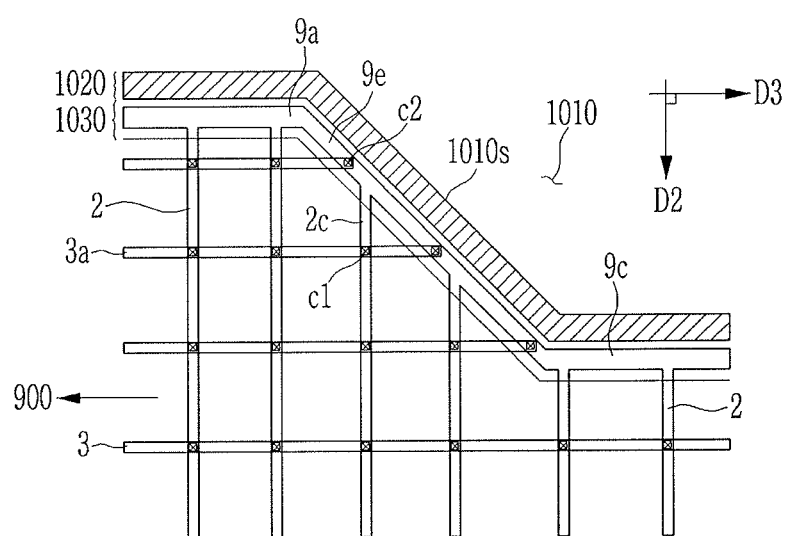
FIG. 48 illustrates the driving current supply structure included in the area E of FIG. 45 according to a non-limiting example embodiment.

FIG. 48 shows the driving current supply structure included in the area E of FIG. 45 according to a non-limiting example embodiment.

Referring to FIG. 48, compared to the second wire 3a shown in FIG. 47, the second wire 3a may extends to the outer buffer area 1030 and may be connected to the sloped portion 9e through contact c2. Thus, the second wire 3a may be promptly provided with a driving current directly from the sloped portion 9e. The first wires 2 and 2c and the second wire 3a may overlap the emission area 900. In addition, the second wire 3a may be used as an electrode included in a capacitor of a pixel circuit. For example, the second wire 3a may be commonly used as an electrode of a capacitor included in a first pixel circuit and an electrode of a capacitor included in a second pixel circuit that is adjacent to the first pixel circuit. When the second wire 3a is used as an electrode included in a capacitor of a pixel circuit, an additional process for forming the electrode included in the capacitor of the pixel circuit may be avoided, thereby increasing integration of the pixel circuit.

Figure 49:
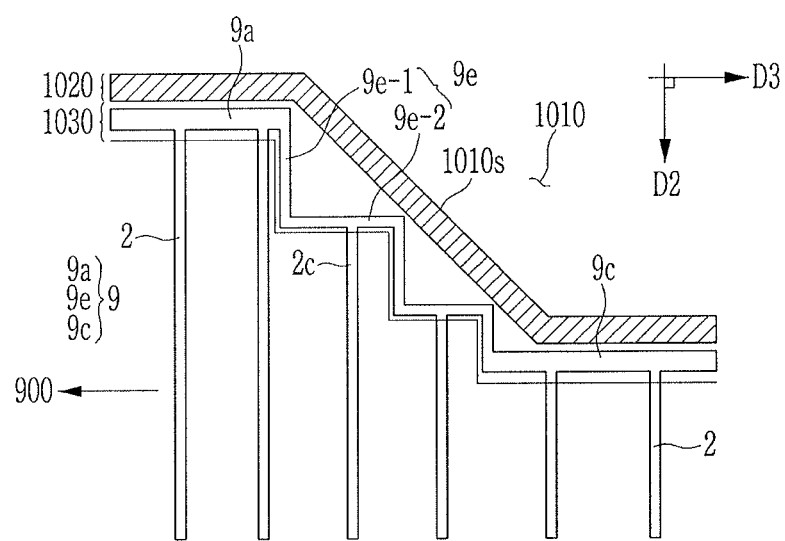
FIG. 49 illustrates the driving current supply structure included in the area E of FIG. 45 according to a non-limiting example embodiment.

FIG. 49 shows the driving current supply structure included in the area E of FIG. 45 according to a non-limiting example embodiment.

Referring to FIG. 49, the sloped portion 9e may include a first part 9e-1 that extends in the second direction D2 and a second part 9e-2 that extends in the third direction D3. The first part 9e-1 and the second part 9e-2 may be alternately connected to each other. Thus, the sloped portion 9e may have a substantially stepped shape. The sloped portion 9e having the substantially stepped shape may be closely attached to an edge of a pixel circuit area having a shape of a matrix having a plurality of pixel circuit zones, each having a quadrangular edge so that a spatial margin for wire design may be provided.

According to a non-limiting example embodiment, the first parts 9e-1 may have substantially the same length so as to more closely attach the sloped portion 9e having the substantially stepped shape to the edge of the pixel circuit area. In another implementation, at least two of the first parts 9e-1 may have substantially different lengths so as to more closely attach the sloped portion 9e having the substantially stepped shape to the edge of the pixel circuit area.

The second part 9e-2 may be connected to the first wire 2c that extends in the second direction D2. The first wire 2c may be integrally formed as one-piece with the second outer bus wire 9. In FIG. 49, a single first wire 2c is connected to all the second parts 9e-2, but the present non-limiting example embodiment is not limited thereto. According to a non-limiting example embodiment, n current wires may be connected to one of the second parts 9e-2, m current wires may be connected to another second part 9e-2, and "n" and "m" may be natural numbers that are substantially different from each other. For example, two first wires 2c may be connected to one second part 9e-2, and three first wires 2c may be connected to another second part 9e-2. In this case, a length of the second part 9e-2 to which the three first wires 2c are connected may be substantially longer than a length of the second part 9e-2 to which the two first wires 2c are connected.

A number of first wires 2c connected to each of the second parts 9e-2 may be set to be substantially different from one another. Thus, a shape of the sloped portion 9e may be formed corresponding to the sloped side faces 1010s not only in a case that the sloped side faces 1010s are straight-lined but also in a case that the sloped side faces 1010s are at least partially curved. In addition, at least two second parts 9e-2 may have substantially different lengths. Thus, the sloped portion 9e having the substantially stepped shape may be more closely attached to the edge of the pixel circuit area.

Figure 50:
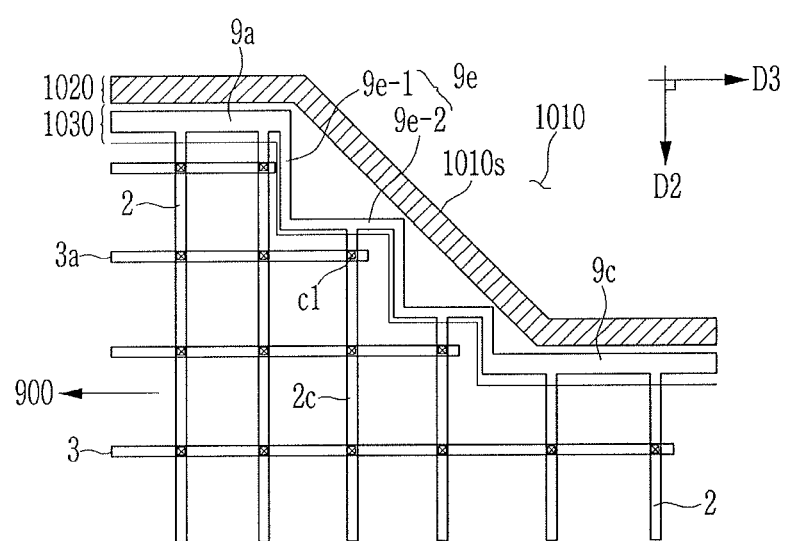
FIG. 50 illustrates the driving current supply structure included in the area E of FIG. 45, according to a non-limiting example embodiment.

FIG. 50 shows the driving current supply structure included in the area E of FIG. 45, according to a non-limiting example embodiment.

Referring to FIG. 50, the driving current supply structure may include a second wire 3a that extends in a third direction D3 that is substantially perpendicular to the second direction D2 and is located on a layer that is substantially different from a layer on which the first wire 2c is formed. The second wire 3a may not extend to the outer buffer area 1030. Thus, the second wire 3a may not be connected to the second part 9e-2. The first wires 2 and 2c may be connected to the second wire 3a through the contacts c1. The first wires 2 and 2c and the second wire 3a may overlap the emission area 900. In addition, the second wire 3a may be used as an electrode included in a capacitor of a pixel circuit. For example, the second wire 3a may be commonly used as an electrode of a capacitor included in a first pixel circuit and an electrode of a capacitor included in a second pixel circuit that is adjacent to the first pixel circuit. The second wire 3a may be used as an electrode included in a capacitor of a pixel circuit. Thus, an additional process for forming the electrode included in the capacitor of the pixel circuit may be avoided, thereby increasing integration of the pixel circuit.

Figure 51:
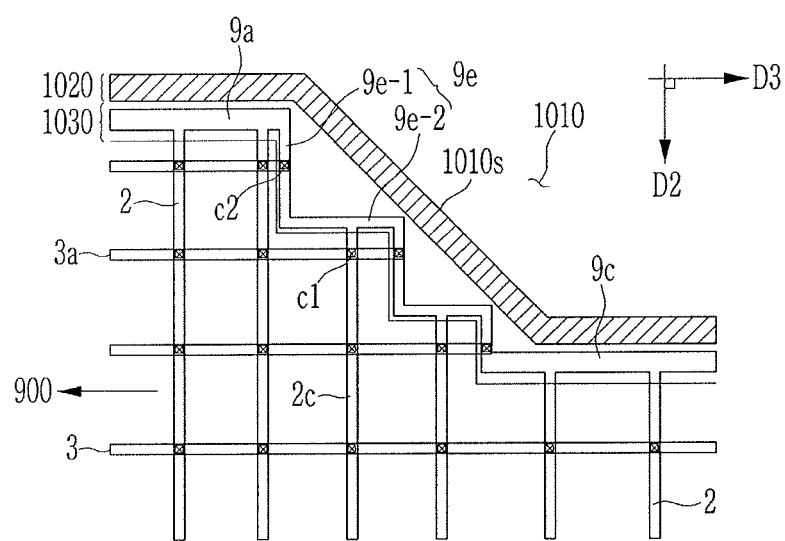
FIG. 51 illustrates the driving current supply structure included in the area E of FIG. 45 according to a non-limiting example embodiment.

FIG. 51 shows the driving current supply structure included in the area E of FIG. 45 according to a non-limiting example embodiment.

Referring to FIG. 51, compared to the second wire 3a shown in FIG. 50, the second wire 3a may extend to the outer buffer area 1030 and may be connected to the first parts 9e-1 through the contacts c2. The first wires 2 and 2c may overlap the emission area 900. In addition, the second wire 3a may be used as an electrode included in a capacitor of a pixel circuit. For example, the second wire 3a may be commonly used as an electrode of a capacitor included in a first pixel circuit and an electrode of a capacitor included in a second pixel circuit. The second wire 3a may be used as an electrode included in a capacitor of a pixel circuit. Thus, an additional process for forming the electrode included in the capacitor of the pixel circuit may be avoided, thereby increasing integration of the pixel circuit.

According to a non-limiting example embodiment, at least two of the second parts 9e-2 may have substantially different lengths. In this case, the number of second wires 3a connected to each second part 9e-2 may be substantially different from each other.

The driving current supply structures shown in FIG. 46 to FIG. 51 may be employed to the electroluminescent device shown in FIG. 30, FIG. 31, FIG. 36, or FIG. 38.

Figure 52:
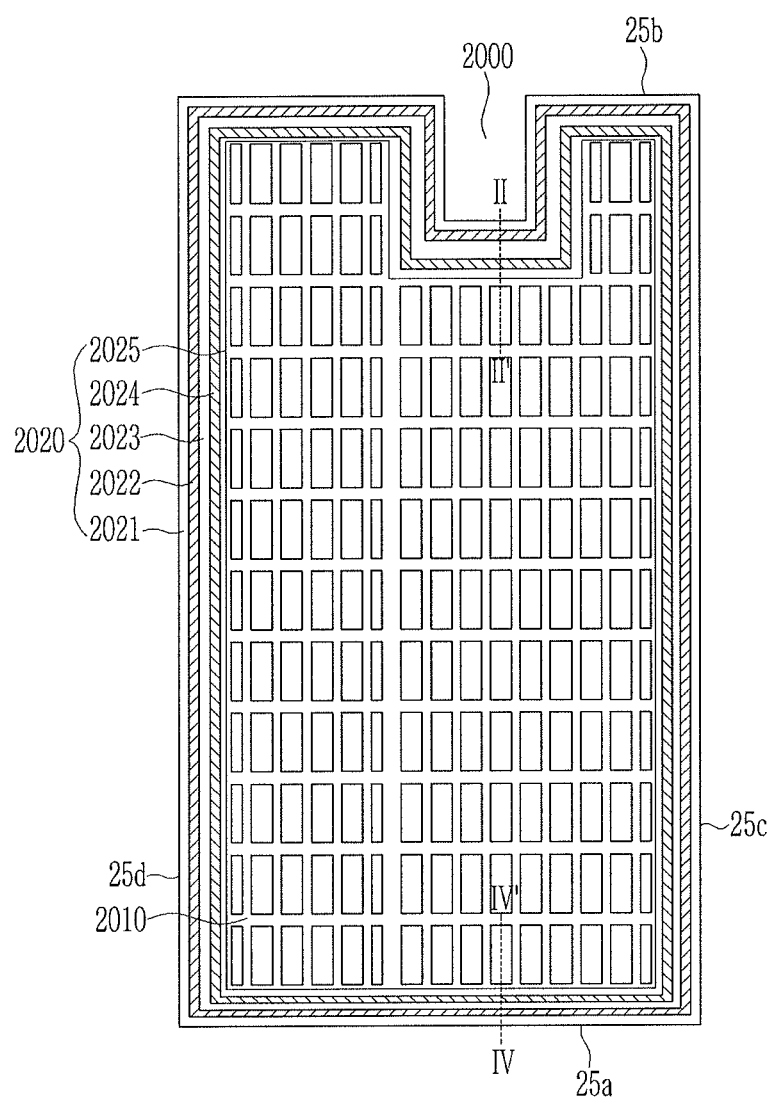
FIG. 52 illustrates a top plan view of an electroluminescent device according to a non-limiting example embodiment.
Figure 53:
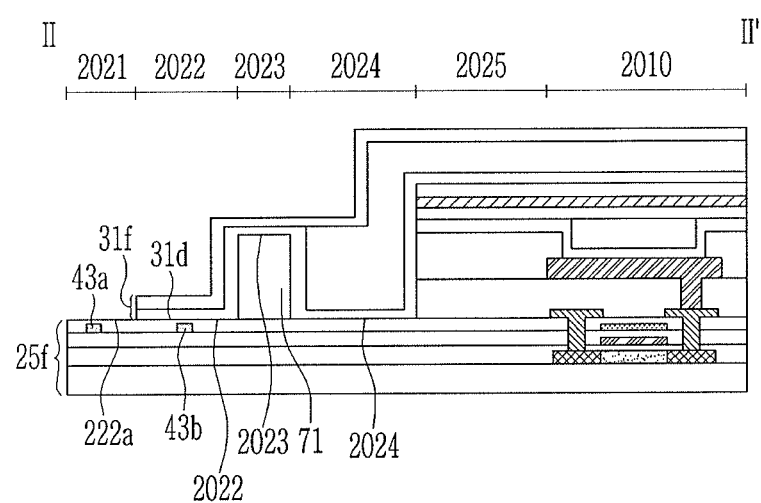
FIG. 53 illustrates a cross-sectional view taken along the line II-II' in FIG. 52, according to a non-limiting example embodiment.

FIG. 52 is a top plan view of an electroluminescent device according to a non-limiting example embodiment. FIG. 53 is a cross-sectional view taken along the line II-II' in FIG. 52, according to a non-limiting example embodiment.

Referring to FIG. 52 and FIG. 53, a lower structure 25 may include an emission area 2010 and an outer non-emission area 2020. The outer non-emission area 2020 may include an opened outer inorganic surface portion 2021, a first outer inorganic surface portion 2022, an outer organic surface portion 2023, a second outer inorganic surface portion 2024, and an outer buffer area 2025. A notch 2000 may be used as a window and may be recessed inward at one side of the lower structure 25. One side of the emission area 2010 may be formed along the notch 2000 or may substantially conform to the notch 2000.

The opened outer inorganic surface portion 2021 having a shape that surrounds the emission area 2010 may be located in the outermost region of the outer non-emission area 2020, the first outer inorganic surface portion 2022 that is connected to the opened outer inorganic surface portion 2021 and surrounds the emission area 2010 may be located further inside than the opened outer inorganic surface portion 2021, the outer organic surface portion 2023 that is connected to the first outer inorganic surface portion 2022 and partially or completely surrounds the emission area 2010 may be located further inside than the first outer inorganic surface portion 2022, the second outer inorganic surface portion 2024 that is connected to the outer organic surface portion 2023 and surrounds the emission area 2010 may be located further inside than the outer organic surface portion 2023, and the outer buffer area 2025 that is connected to the second outer inorganic surface portion 2024 and surrounds the emission area 2010 may be located further inside than the second outer inorganic surface portion 2024.

The opened outer inorganic surface portion 2021 may not be covered by an encapsulation structure 31. The first outer inorganic surface portion 2022 and the second outer inorganic surface portion 2024 may make a direct contact with the encapsulation structure 31.

The lower structure 25 may include an outer organic dam 71, and a surface of the outer organic dam 71 may correspond to the outer organic surface portion 2023 of the lower structure 25. In FIG. 52, the first outer inorganic surface portion 2022 and the second outer inorganic surface portion 2024 may not be connected to each other, but this is not restrictive. The first outer inorganic surface portion 2022 and the second outer inorganic surface portion 2024 may be connected to each other in some section.

A side face 25f of the lower structure 25 and a side face 31f of the encapsulation structure 31 may not be located on substantially the same plane and the side face 31f of the encapsulation structure 31 may be located further inside than the side face 25f of the lower structure 25.

Here, the emission area 2010 may be relatively narrowed due to a distance between the side face 25f of the lower structure 25 and the side face 31f of the encapsulation structure 31 and, thus, it is advantageous that at least a part of a connection member 43a may be located under the opened outer inorganic surface portion 2021, at least a part of a connection member 43b may be included in the first outer inorganic surface portion 2022, or at least a part of a connection member 43b may be located under the first outer inorganic surface portion 2022.

The lower structure 25 may include a first side 25a, a second side 25b that is located substantially opposite to the first side 25a, a third side 25c that is located between the first side 25a and the second side 25b, and a fourth side 25d that is located substantially opposite to the third side 25c. A driving current may be supplied to the first side 25a of the lower structure 25 to drive the electroluminescent unit. The notch 2000 may be formed at the second side 25b of the lower structure 25. In FIG. 52, the notch 2000 is substantially closer to the third side 25c of the lower structure 25 than to the fourth side 25d of the lower structure 25, but this is not restrictive. The notch 200 may be located at substantially the same distance from the fourth side 25d of the lower structure 25 and the third side 25c of the lower structure 25.

According to a non-limiting example embodiment, the outer non-emission area 2020 may have substantially different widths at the first side 25a and the second side 25b of the lower structure 25, but the width of the outer non-emission area 2020 may be substantially the same at the third side 25c and the fourth side 25d. According to a non-limiting example embodiment, the width of the outer non-emission area 2020 at the first side 25a of the lower structure 25 may be substantially greater than that of the outer non-emission area 2020 at the second side 25b of the lower structure 25. This may help ensure a spatial margin in design of wiring for supplying a driving current for driving the electroluminescent unit to the first side 25a by supplying the driving current to the first side 25a of the lower structure 25.

According to a non-limiting example embodiment, a width of the outer buffer area 2025 at the first side 25a may be substantially different from a width of the outer buffer area 2025 at the second side 25b of the lower structure 25, while the width of the outer buffer area 2025 may be substantially the same at the third side 25c and the fourth side 25d of the lower structure 25. According to a non-limiting example embodiment, the width of the outer buffer area 2025 at the second side 25b of the lower structure 25 may be substantially smaller than that of the outer buffer area 2025 at the third side 25c or the fourth side 25d of the lower structure 25. When a peripheral circuit such as a scan driver, an emission driver, and the like is integrated in the outer buffer area 2025 at the third side 25c and the fourth side 25d of the lower structure 25, the width of the outer buffer area 2025 may be more increased at the third side 25c or the fourth side 25d than at the second side 25b of the lower structure 25. According to a non-limiting example embodiment, the width of the outer buffer area 2025 at the first side 25a of the lower structure 25 may be substantially greater than the width of the outer buffer area 2025 at the second side 25b of the lower structure 25. This may help ensure a spatial margin in design of wiring for supplying a driving current for driving the electroluminescent unit to the first side 25a by supplying the driving current to the first side 25a of the lower structure 25.

According to a non-limiting example embodiment, the width of the second outer inorganic surface portion 2024 at the first side 25a of the lower structure 25 and the width of the second outer inorganic surface portion 2024 at the second side 25b of the lower structure 25 may be substantially different from each other, while the width of the outer inorganic surface portion 2024 may be substantially the same at the third side 25c and the fourth side 25d of the lower structure. According to a non-limiting example embodiment, the width of the second outer inorganic surface portion 2024 at the first side 25a of the lower structure 25 may be substantially greater than the width of the second outer inorganic surface portion 2024 at the second side 25b of the lower structure. This may help ensure a spatial margin in design of wiring for supplying a driving current for driving the electroluminescent unit to the first side 25a by supplying the driving current to the first side 25a of the lower structure 25.

According to a non-limiting example embodiment, the width of the outer organic surface portion 2023 at the first side 25a of the lower structure 25 and the width of the outer organic surface portion 2023 at the second side 25b of the lower structure 25 may be substantially different from each other, while the width of the outer organic surface portion 2023 may be substantially the same at the third side 25c and the fourth side 25d of the lower structure. According to a non-limiting example embodiment, the width of the outer organic surface portion 2023 at the first side 25a of the lower structure 25 may be substantially greater than the width of the outer organic surface portion 2023 at the second side 25b of the lower structure. This may help ensure a spatial margin in design of wiring for supplying a driving current for driving the electroluminescent unit to the first side 25a by supplying the driving current to the first side 25a of the lower structure 25. According to a non-limiting example embodiment, the outer organic surface portion 2023 may have a first width at the second side 25b, the third side 25c, and the fourth side 25d of the lower structure 25, may have a second width at the first side 25a of the lower structure 25, which is substantially different from the first width. For example, the second width may be substantially greater than the first width. According to a non-limiting example embodiment, the outer organic surface portion 2023 may have substantially the same width at the first side 25a, the second side 25b, the third side 25c, and the fourth side 25d of the lower structure 25.

According to a non-limiting example embodiment, the width of the first outer inorganic surface portion 2022 at the first side 25a of the lower structure and the width of the first outer inorganic surface portion 2022 at the second side 25b may be substantially different from each other, but the first outer inorganic surface portion 2022 may have substantially the same width at the third side 25c and the fourth side 25d of the lower structure 25. According to a non-limiting example embodiment, the width of the first outer inorganic surface portion 2022 at the first side 25a of the lower structure 25 may be substantially greater than the width of the first outer inorganic surface portion 2022 at the second side 25b of the lower structure 25. This may help ensure a spatial margin in design of wiring for supplying a driving current for driving the electroluminescent unit to the first side 25a by supplying the driving current to the first side 25a of the lower structure 25.

According to a non-limiting example embodiment, the width of the opened outer inorganic surface portion 2021 at the first side 25a of the lower structure 25 and the width of the opened outer inorganic surface portion 2021 at the second side 25b of the lower structure 25 may be substantially different from each other, while the width of the opened outer inorganic surface portion 2021 may be substantially the same at the third side 25c and the fourth side 25d of the lower structure. According to a non-limiting example embodiment, the width of the opened outer inorganic surface portion 2021 at the first side 25a of the lower structure 25 may be substantially greater than the width of the opened outer inorganic surface portion 2021 at the second side 25b of the lower structure 25. This may help ensure a spatial margin in design of wiring for supplying a driving current for driving the electroluminescent unit to the first side 25a by supplying the driving current to the first side 25a of the lower structure 25. According to a non-limiting example embodiment, the opened outer inorganic surface portion 2021 may have a first width at the second side 25b, the third side 25c, and the fourth side 25d of the lower structure 25, and the opened outer inorganic surface portion 2021 may have a second width that is substantially different from the first width at the first side 25a of the lower structure 25. For example, the second width may be substantially greater than the first width. According to a non-limiting example embodiment, the opened outer inorganic surface portion 2021 may have substantially the same width at the first side 25a, the second side 25b, the third side 25c, and the fourth side 25d of the lower structure 25.

The touch panels shown in FIG. 12 to FIG. 20 may be employed to the electroluminescent device shown in FIG. 52. According to a non-limiting example embodiment, the first sensing electrode 51a-1 and the dummy electrode 53a of FIG. 12, the first sensing electrode 51a-4 or the second sensing electrode 52a-4 of FIG. 15, the sensing electrode 54a-1 of FIG. 16, and the upper dummy electrode 63a, the lower dummy electrode 83a, the vertical sensing area 70a, the lower horizontal sensing electrode 82a, and the upper horizontal sensing electrode 62a of FIG. 19 may not overlap the outer inorganic surface portion 1020 of FIG. 52. According to a non-limiting example embodiment, the first connection member 51d and the second connection member 52d of FIG. 13 may overlap the outer non-emission area 2020 of FIG. 52.

The electroluminescent device shown in FIG. 52 may include the driving current supply structure shown in FIG. 32, FIG. 33, FIG. 34, FIG. 35, FIG. 46, FIG. 47, FIG. 48, FIG. 49, FIG. 50, or FIG. 51.

Figure 54:
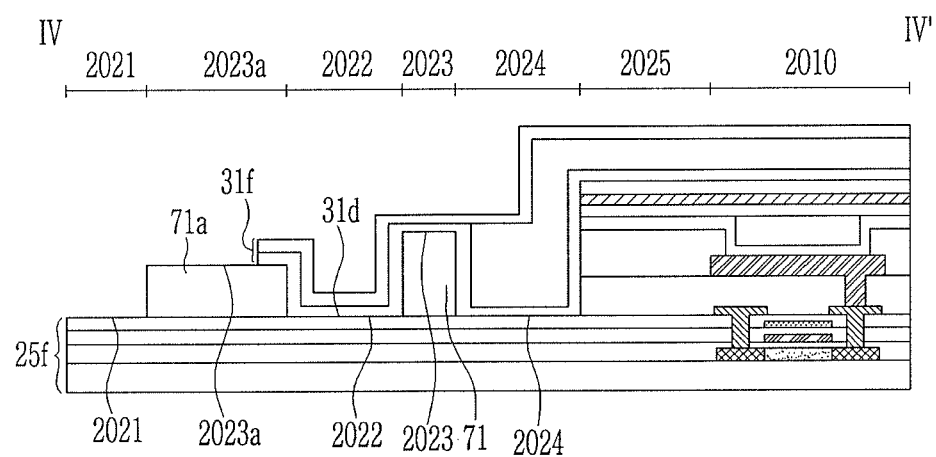
FIG. 54 illustrates a cross-sectional view taken along the line IV-VI' in FIG. 52, according to a non-limiting example embodiment.

FIG. 54 is a cross-sectional view taken along the line IV-IV' in FIG. 52, according to a non-limiting example embodiment.

Referring to FIG. 54, an outer organic structure 71a is located between the opened outer inorganic surface portion 2021 and the first outer inorganic surface portion 2022 at the first side 25a of the lower structure 25. The outer organic structure 71a may have an opened outer organic surface portion 2023a. The opened outer organic surface portion 2023a may be opened with respect to the encapsulation structure 31. In detail, the opened outer organic surface portion 2023a may have at least a portion that is not covered by the inorganic lower surface 31d of the encapsulation structure 31. The opened outer organic surface portion 2023a may not be wholly covered by the inorganic lower surface 31d of the encapsulation structure 31, but may be wholly covered by another member after the encapsulation structure 31 is formed.

The outer organic structure 71a may protect a conductive structure such as a wire that is not covered by the inorganic lower surface 31d. In addition, the outer organic structure 71 may increase a width of the outer non-emission area 2020 at the first side 25a of the lower structure 25.

By way of summation and review, a general electronic device may have a camera in an area outside of an image display area of the electronic device so that a space for the electronic device to display an image tends to be reduced. Consideration has been given to a structure in which a camera is installed in a display.

As described above, non-limiting example embodiments relate to an electroluminescent device having a window such as a light transmitting region, a hole, or a notch.

Non-limiting example embodiments may provide an electroluminescent device that may prevent permeation of moisture and oxygen into a display even through a camera is provided inside the display or at one side of the display. Non-limiting example embodiments may provide an electroluminescent device in which a current is evenly transmitted even to a peripheral area where a camera is disposed. Non-limiting example embodiments may provide an electroluminescent device in which brightness is uniform even in a peripheral area where a camera is disposed. Non-limiting example embodiments may provide an electroluminescent device in which a touch is well sensed even at a peripheral area where a camera is disposed.

DESCRIPTION OF SYMBOLS 100, 300, 500, 700, 900, 2010: emission area
200: non-emission area
200a, 400, 600, 800, 1000, 2020: outer non-emission area
200b: inner non-emission area
201, 340, 600a, 600b, 630, 800a, 800b, 1030, 2025: outer buffer area
202: inner buffer area
220, 221, 420, 620, 820, 1020, 1021, 2021, 2022, 2024: outer inorganic surface portion
2023, 2023a: outer organic surface portion
222, 222a, 222b, 222c, 222d: inner inorganic surface portion
210, 410, 610, 610a, 610b, 810: light transmitting region
10: optical member
11: buffer layer
12: active layer
12c: channel region
12d: drain region
12s: source region
13: first gate insulation layer
14: first gate electrode
15: second gate insulation layer
16: second gate electrode
17: interlayer insulation layer
18: source/drain electrode
19: planarization layer
20: lower electrode
21: pixel defining layer
22: intermediate layer
22a: hole transporting layer
22b: emission layer
22c: electron transporting layer
23: upper electrode
24: passivation layer
25: lower structure
31: encapsulation structure
31a: first inorganic layer
31b: organic layer
31c: second inorganic layer
31d: inorganic lower surface
25f, 31f, 1010s: side face
39: polarization film
42a, 42b: driver
50: insulation layer
4, 4a, 4b, 4c: protrusions and recesses
5, 5a, 5b, 5c: passing portion
6: organic surface island
7: inorganic surface island
43, 43a, 43b, 43b-1, 43b-2, 43d, 43e, 43f: connection member
51c, 52c, 64a, 64b, 84a, 1010, 2000: notch
70, 70a, 70b, 70c, 70d, 70e: vertical sense area
71: outer organic dam
71a: outer organic structure
72: inner organic dam
77: inner bus wire 820*a*: extension portion
51, 52, 54, 60, 60*a*, 60*b*, 80, 80*a*: touch electrode
51*a*, 52*a*, 54*a*: sensing electrode
51*b* 52*b*: bridge electrode
51*d*, 52*d*: first connection member
54*b*: touch wire
53, 53*a*, 53*b*, 63, 63*a*, 63*b*, 83, 83*a*, 83*b*: dummy electrode
61, 81: vertical sensing electrode
62, 62*a*, 62*b*, 82, 82*a*, 82*b*: horizontal sensing electrode
1, 1*a*, 1*b*, 1*c*: terminal wire
8, 9, 9*a*, 9*b*, 9*c*, 9*c*-1, 9*d*, 9*e*: outer bus wire
81-1, 82-1: upper connection wire
83-1, 84-1: lower connection wire Non-limiting example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular non-limiting example embodiment may be used singly or in combination with features, characteristics, and/or elements described in connection with other non-limiting example embodiments unless otherwise specifically indicated. Accordingly, it will be understood by those of skill in the art that various changes in form and details may be made without departing from the spirit and scope of the present invention as set forth in the following claims.

What is claimed is:

1. An electroluminescent device, comprising:
a lower structure including a non-transparent emission area; and
an encapsulation structure located on the lower structure,
wherein the lower structure includes a notch that is formed at one side of the lower structure and recessed inward in a first direction in a plan view such that one side of the non-transparent emission area conforms to the notch and the notch has a first side face sloped in a plan view,
the lower structure includes a current wire and an outer bus wire that includes a first portion corresponding to the first side face, the first portion being sloped in a plan view,
the current wire is connected to the first portion, the current wire extending in the first direction from the first portion toward the non-transparent emission area, the current wire being integrally formed as one-piece with the outer bus wire, and
the current wire overlaps the non-transparent emission area.

2. The electroluminescent device of claim 1, wherein the first portion includes first parts extending in a second direction different from the first direction and second parts extending in the first direction,
the first parts and the second parts are alternately connected to each other such that the first portion has a stepped shape,
the current wire is connected to the first part of the first portion,
the lower structure includes an outer non-emission area surrounding the non-transparent emission area in a plan view,
the outer non-emission area includes an outer inorganic top surface portion surrounding the non-transparent emission area in a plan view, and
the encapsulation structure includes an inorganic lower surface making a contact with an entire of the outer inorganic top surface portion.

3. The electroluminescent device of claim 2, wherein the first portion includes at least two of the first parts having different lengths to be connected to different numbers of the current wires and/or includes at least two of the second parts having different lengths.

4. The electroluminescent device of claim 2, wherein the outer non-emission area includes an opened outer inorganic top surface portion,
the outer inorganic top surface portion is connected to the opened outer inorganic top surface portion, the outer inorganic top surface portion including at least a part located between the opened outer inorganic top surface portion and the non-transparent emission area, and
the encapsulation structure does not make a contact with the opened outer inorganic top surface portion.

5. The electroluminescent device of claim 2, wherein the encapsulation structure is a flexible multilayer.

6. The electroluminescent device of claim 5, wherein the first portion includes at least two of the first parts having different lengths to be connected to different numbers of the current wires and/or includes at least two of the second parts having different lengths.

7. The electroluminescent device of claim 5, wherein the outer non-emission area includes an opened outer inorganic top surface portion,
the outer inorganic top surface portion is connected to the opened outer inorganic top surface portion and includes at least a part located between the opened outer inorganic top surface portion and the non-transparent emission area, and
the encapsulation structure does not make a contact with the opened outer inorganic top surface portion.

8. The electroluminescent device of claim 7, wherein the first portion includes at least two of the first parts having different lengths to be connected to different numbers of the current wires and/or includes at least two of the second parts having different lengths.

9. An electroluminescent device, comprising:
a lower structure including a non-transparent emission area; and
an encapsulation structure located on the lower structure,
wherein the lower structure includes a notch that is formed at one side of the lower structure and recessed inward in a plan view such that one side of the non-transparent emission area conforms to the notch,
the lower structure includes a first wire extending in a direction from the non-transparent emission area toward a first side of the notch and a second wire extending in a direction away from a second side of the notch, the second side of the notch facing the first side of the notch toward the non-transparent emission area,
the notch is located between the first and second wires,
the first and second wires are located on the same layer,
the first and second wires overlap the non-transparent emission area, and
the first and second wires have the same driving current state.

10. The electroluminescent device of claim 9, wherein the lower structure includes a connection member bypassing the notch in a plan view to be electrically connected between the first and second wires,
the connection member includes a third wire and a fourth wire, the third wire being located on a layer different from a layer on which the first and second wires are disposed, the fourth wire being located on the layer on which the first and second wires are disposed, and the third and fourth wires overlap the non-transparent emission area.

11. An electroluminescent device, comprising:

a lower structure including a non-transparent emission area; and an encapsulation structure located on the lower structure, wherein the lower structure includes a notch that is formed at one side of the lower structure and recessed inward in a plan view such that one side of the non-transparent emission area conforms to the notch, the lower structure includes an outer non-emission area surrounding the non-transparent emission area in a plan view, the lower structure includes a first wire extending in a direction from the non-transparent emission area toward a first side of the notch and a second wire extending in a direction away from a second side of the notch, the second side of the notch facing the first side of the notch toward the non-transparent emission area, the notch is located between the first and second wires, the first and second wires are located on the same layer, the outer non-emission area includes an opened outer inorganic top surface portion and an outer inorganic top surface portion, the outer inorganic top surface portion being connected to the opened outer inorganic top surface portion, the outer inorganic top surface portion having at least a part located between the opened outer inorganic top surface portion and the non-transparent emission area, the outer inorganic top surface portion surrounding the non-transparent emission area in a plan view, and the encapsulation structure includes an inorganic lower surface making a contact with an entire of the outer inorganic top surface portion while not making a contact with the opened outer inorganic top surface portion.

12. The electroluminescent device of claim 11, wherein the lower structure includes a connection member bypassing the notch in a plan view to be electrically connected between the first and second wires, and at least a part of the connection member is located in the outer non-emission area.

13. The electroluminescent device of claim 11, wherein the encapsulation structure is a flexible multilayer.

* * * * *